United States Patent [19]
Fujisawa et al.

[11] Patent Number: 5,760,471
[45] Date of Patent: Jun. 2, 1998

[54] SEMICONDUCTOR DEVICE HAVING AN INNER LEAD EXTENDING OVER A CENTRAL PORTION OF A SEMICONDUCTOR DEVICE SEALED IN A PLASTIC PACKAGE AND AN OUTER LEAD EXPOSED TO THE OUTSIDE OF A SIDE FACE OF THE PLASTIC PACKAGE

[75] Inventors: Tetsuya Fujisawa; Mitsutaka Sato; Junichi Kasai; Masataka Mizukoshi; Kousuke Otokita; Hiroshi Yoshimura; Katsuhiro Hayashida; Akira Takashima; Masahiko Ishiguri; Michio Sono, all of Kawasaki, Japan

[73] Assignee: Fujitsu Limited, Kawasaki, Japan

[21] Appl. No.: 794,763

[22] Filed: Feb. 3, 1997

Related U.S. Application Data

[63] Continuation of Ser. No. 525,347, Sep. 7, 1995, abandoned, which is a continuation-in-part of Ser. No. 401,682, Mar. 10, 1995, abandoned.

[30] Foreign Application Priority Data

| Apr. 20, 1994 | [JP] | Japan | 6-081933 |
| Jul. 20, 1994 | [JP] | Japan | 6-168449 |
| Jul. 6, 1995 | [JP] | Japan | 7-171000 |

[51] Int. Cl.⁶ .......................... H01L 23/48; H01L 23/50; H01L 23/12; H01L 23/02
[52] U.S. Cl. .......................... 257/692; 257/666; 257/686; 257/723; 257/696; 257/698; 257/693

[58] Field of Search .................. 257/666, 676, 257/685, 686, 691, 692, 693, 698, 699, 723, 730, 773, 777, 778, 673, 696

[56] References Cited

U.S. PATENT DOCUMENTS

| 5,138,438 | 8/1992 | Masayuki et al. | 257/723 |
| 5,198,888 | 3/1993 | Sugano et al. | 257/723 |
| 5,440,452 | 8/1995 | Kitahara | 257/676 |

FOREIGN PATENT DOCUMENTS

| 61-101067 | 5/1986 | Japan | 257/686 |
| 63-15451 | 1/1988 | Japan . | |
| 63-15453 | 1/1988 | Japan . | |
| 3-173167 | 7/1991 | Japan | 257/777 |
| 4-256351 | 9/1992 | Japan | 257/777 |
| 6-132453 | 5/1994 | Japan . | |

*Primary Examiner*—Tom Thomas
*Assistant Examiner*—Alexander Oscar Williams
*Attorney, Agent, or Firm*—Armstrong, Westerman, Hattori, McLeland & Naughton

[57] ABSTRACT

A semiconductor device including a semiconductor element, and leads connected with the semiconductor element. Each of the leads includes an outer lead part for being connected externally. The semiconductor device further includes a plastic package sealing the semiconductor element and the leads. In the semiconductor device, the outer lead part is exposed to the outside of a side face of the plastic package, and the plastic package is mounted on any base in a standing form by the side face contacting the base.

12 Claims, 37 Drawing Sheets

FIG. 4
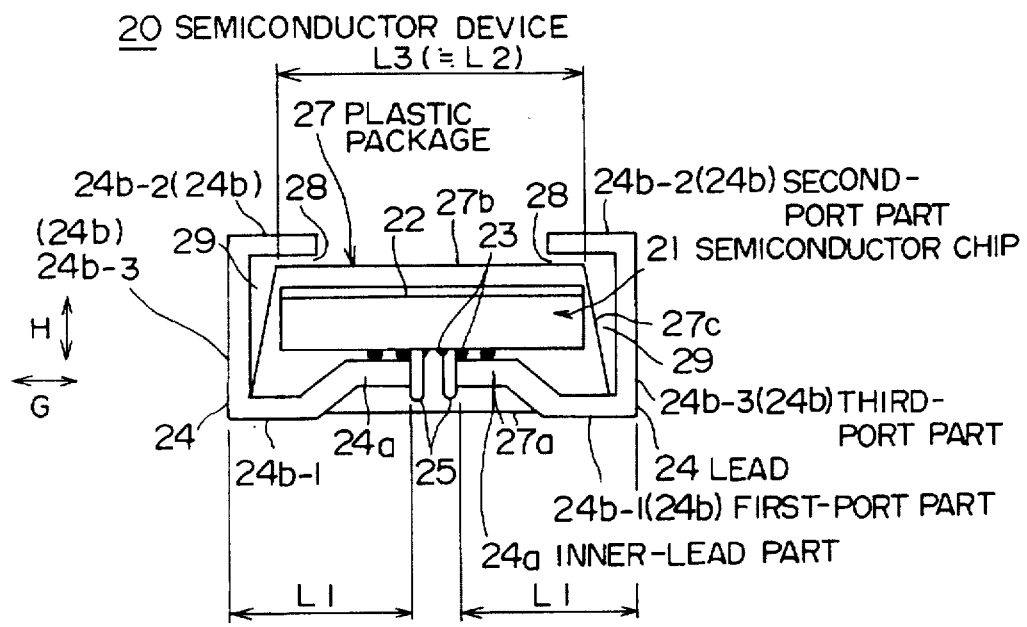
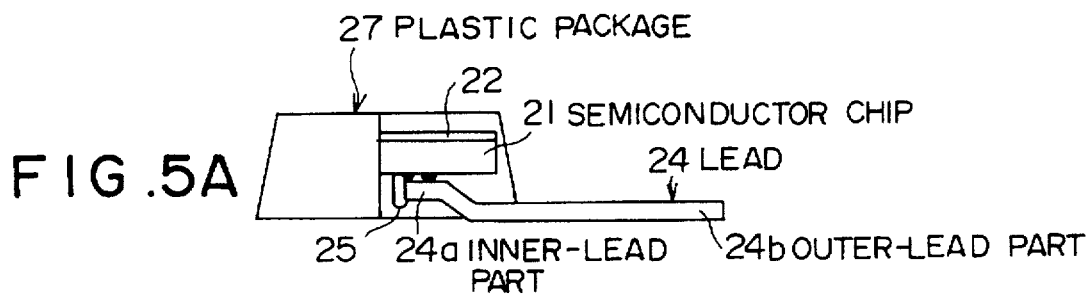
FIG. 5A
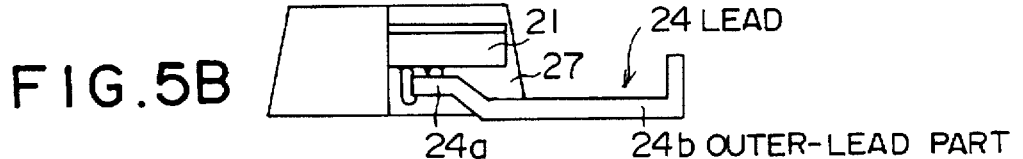
FIG. 5B
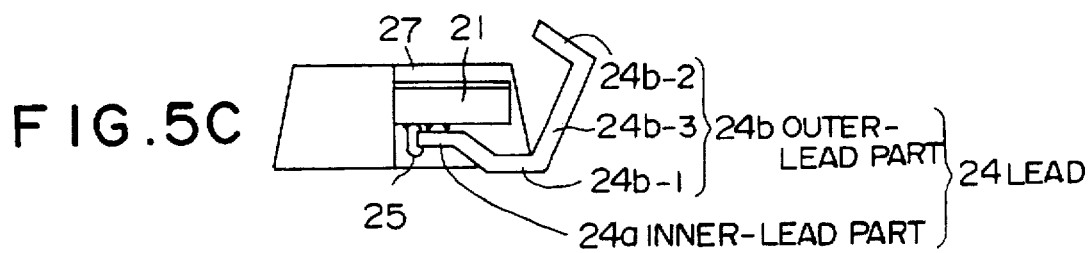
FIG. 5C

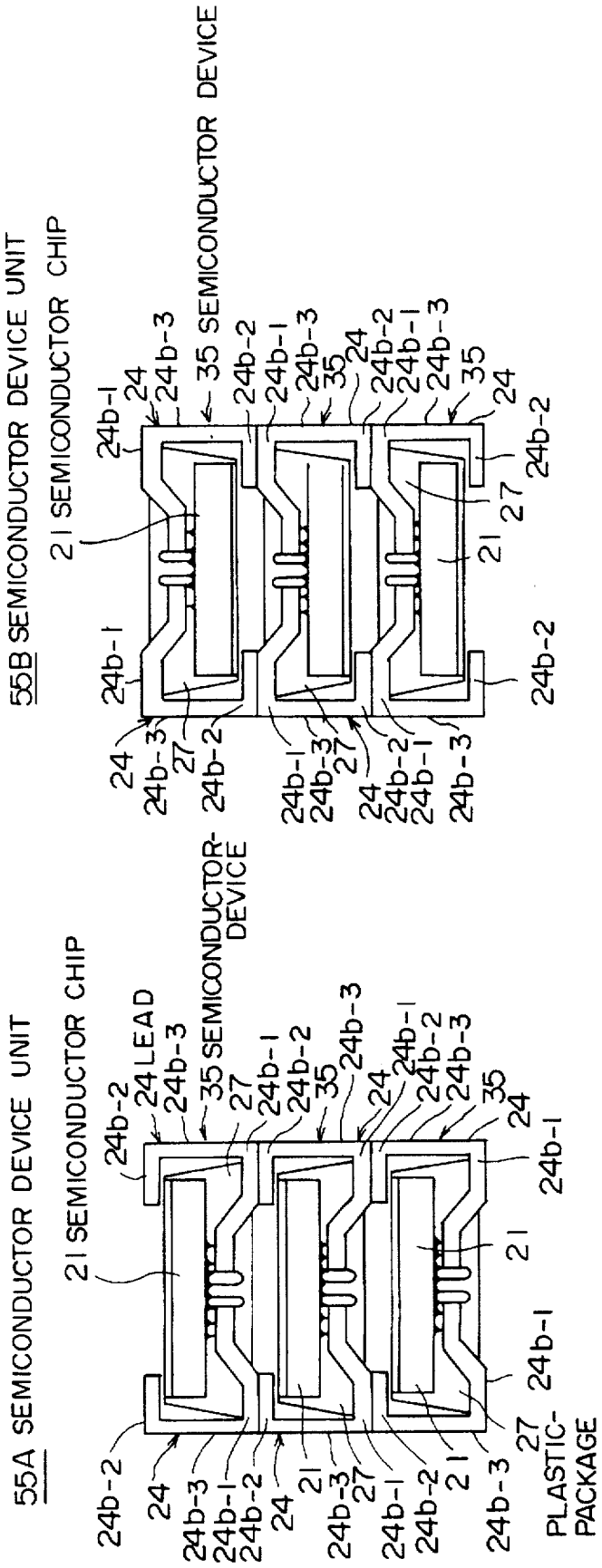

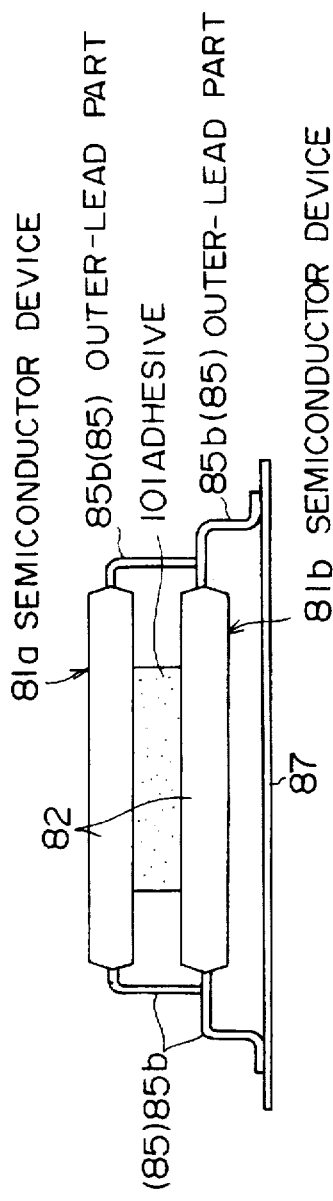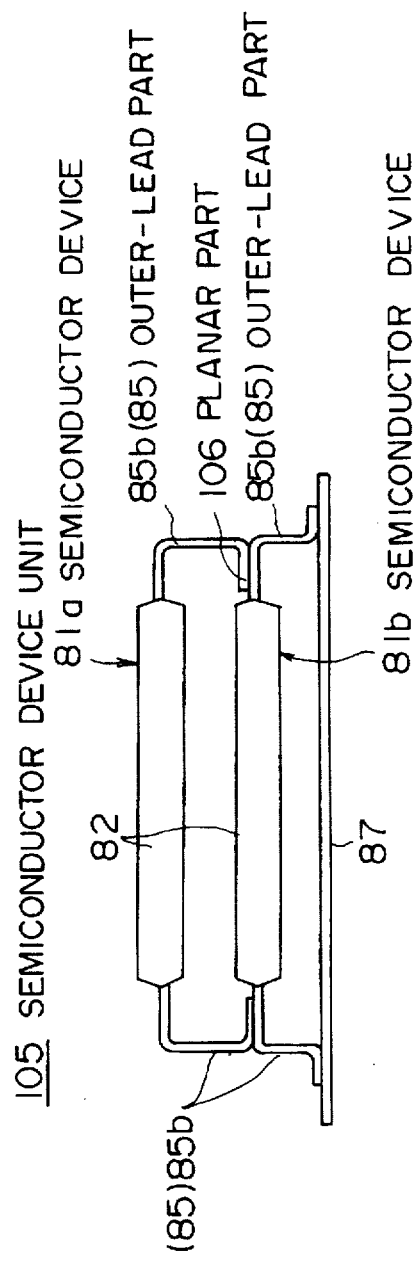
FIG. 18
FIG. 19

FIG. 20
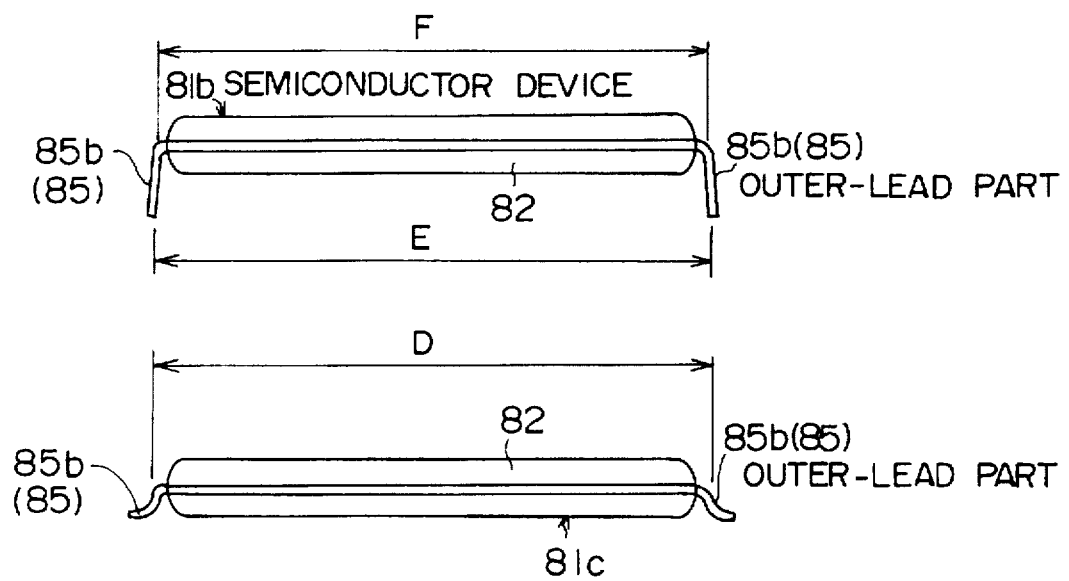
FIG. 21
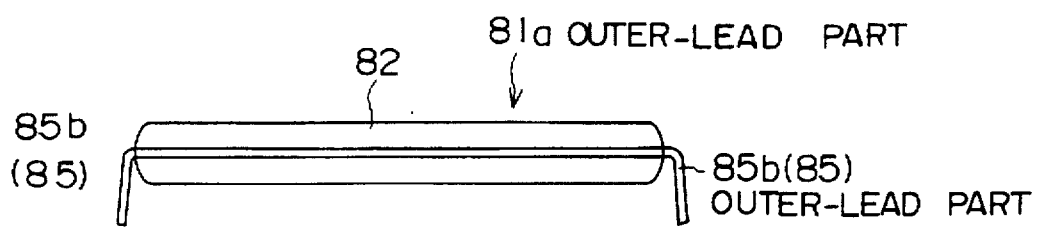
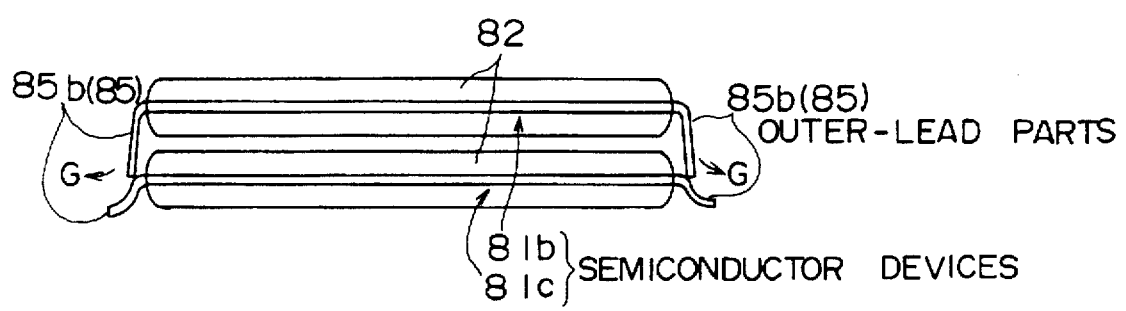

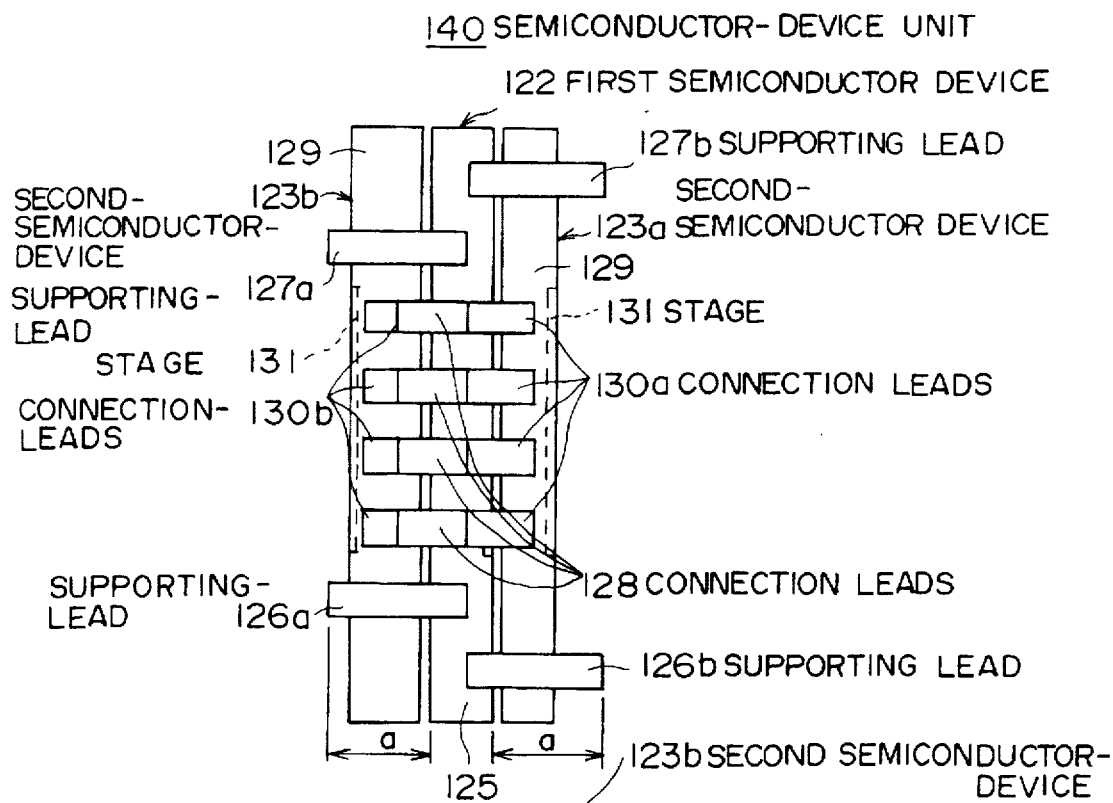
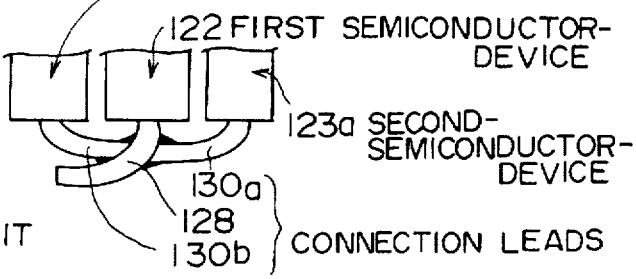
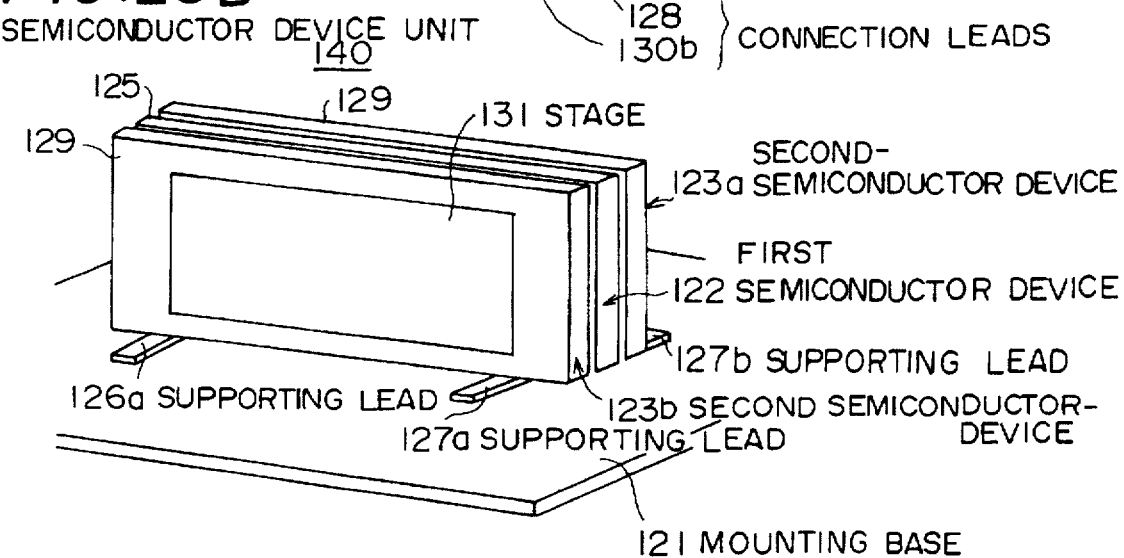

5,760,471

SEMICONDUCTOR DEVICE HAVING AN INNER LEAD EXTENDING OVER A CENTRAL PORTION OF A SEMICONDUCTOR DEVICE SEALED IN A PLASTIC PACKAGE AND AN OUTER LEAD EXPOSED TO THE OUTSIDE OF A SIDE FACE OF THE PLASTIC PACKAGE

CROSS-REFERENCE TO RELATED APPLICATION

This application is a continuation of application Ser. No. 08/525,347, filed Sep. 7, 1995, now abandoned, which is a Continuation-In-Part Application of a U.S. patent application Ser.No. 401,682 filed Mar. 10, 1995.

BACKGROUND OF THE INVENTION

1. Field of the Invention

The present invention generally relates to semiconductor devices and semiconductor device units, and more particularly, to semiconductor devices and semiconductor device units which perform a high-density mounting by multi-layering.

It has been required recently that electronic devices be miniaturized, capable of a high-speed operation, and have a high-level function, and it has been desired that a semiconductor device used in these electronic devices meet the same requirements.

In addition to such a desire that the semiconductor device meet these requirements, it is also desired that mounting efficiency in mounting the semiconductor device on a mounting base be improved.

To meet these requirements, a surface-mounted-type semiconductor device, in which leads are connected to a surface of the mounting base, is used. Further, it is desired to develop the semiconductor device in which higher-efficiency mounting can be performed.

2. Description of the Related Art

FIG. 1 shows a perspective view of a conventional semiconductor device 1, and FIG. 2 is a cross-sectional view along line 2—2 of the semiconductor device shown in FIG. 1. The semiconductor device 1 has been proposed by the inventors of the present invention , and is disclosed in Japanese Laid-Open Patent Application No.63-15453, and Japanese Laid-Open Patent Application No.63-15451.

The semiconductor device 1 comprises a semiconductor element (semiconductor chip) 2, a plastic package 3 sealing the semiconductor chip 2, leads 4 coupling the semiconductor chip 2 with external devices, and a stage 7 on which the semiconductor chip 2 is mounted, etc. Each lead 4 has an inner-lead part 4a as a one-end part which is connected to the semiconductor chip 2 through a wire 5, and has an outer port 6 as the other-end part which is to be connected to an external device. The lead 4 except for the outer port 6 is sealed inside the plastic package 3, and the outer port 6 is exposed on a bottom surface 3a of the plastic package 3.

In the semiconductor device 1, because a portion of the outer port 6 is located under the plastic package 3, a projection part of the outer port 6 (the outer port 6 is projected from a side wall of the plastic package 3) may be shortened. Therefore, mounting density of the semiconductor devices can be improved. Further, in such a configuration, there is no need for any bending process for the projection part of the lead, and thus a metal mold for the bending process is unnecessary. As a result, this configuration leads to a reduction of a fabrication cost of the semiconductor device.

However, this configuration of the semiconductor device also has the following problem. In the semiconductor device shown in FIG. 2, the inner-lead parts 4a of the leads 4 are located outside the semiconductor chip 2 to make it easy for the wire 5 to be connected to the inner lead parts 4a. Therefore, the package 3 requires a large area for covering the semiconductor chip 2 and the inner-lead parts 4a, thus preventing sufficient miniaturization of the semiconductor device 1. Ideally speaking, it is desired that the semiconductor device has a size as small as that of the semiconductor chip. In actuality, the plastic package 3 of the semiconductor device 1 has a size three times that of the semiconductor chip 2.

To solve this problem, the inventors of the present invention proposed another configuration of the semiconductor device, which is disclosed in Japanese Laid-Open Patent Application No.6-132453 entitled "SEMICONDUCTOR DEVICE AND ITS FABRICATION METHOD". FIGS. 3A and 3B show a configuration of the other semiconductor device.

In FIGS. 3A and 3B, a semiconductor device 10 includes a semiconductor chip 11 with electrode pads 13, a plastic package 17 sealing the semiconductor chip 11, a plurality of leads 14 coupling the semiconductor chip 11 with the external devices, and a stage 12 supporting the semiconductor device 11. Each lead 14 has an inner-lead part 14a as a one-end part which is electrically connected to the semiconductor chip 11 through a wire 15, and has an outer port 16 as the other-end part which is to be connected to the external devices. The leads 14 except for the outer ports 16 are sealed inside the plastic package 17, the outer ports 16 being exposed on a bottom surface 17a of the plastic package 3.

Further, this configuration is characterized in that a some or all of the plurality of the leads 14 are located in overlap areas (indicated by arrows "L1") under the semiconductor chip 11 inside the package 17. Therefore, the semiconductor device 10 may be miniaturized as compared to the semiconductor device 1 shown in FIGS. 1 and 2.

According to the above-mentioned semiconductor device 10, planar dimensions of the semiconductor device 10 may be reduced. Thus, high-density mounting may be achieved when the semiconductor device 10 is mounted as part of a single layer (two-dimensional-direction mounting) on a mounting base.

However, the above-mentioned semiconductor device 10 is mounted on the mounting base such that a widest face of six outside faces of the plastic package 17 contacts the mounting base. Therefore, for two-dimensional-direction mounting of a plurality of the semiconductor devices 10, a wider mounting space is required. Accordingly, in the semiconductor device 10, it is difficult to carry out the high-density mounting along two-dimensional directions.

On the other hand, recently, to perform a higher-density mounting, a method for layering and mounting a plurality of semiconductor devices along three-dimensional directions is frequently used. However, in the conventional semiconductor device 10 shown in FIGS. 3A and 3B, it is impossible to layer and mount the semiconductor devices 10 in a vertical direction. Therefore, in such a conventional semiconductor device, it is difficult to perform the higher-density mounting along three-dimensional directions.

SUMMARY OF THE INVENTION

It is an object of this invention to provide a semiconductor device and a semiconductor device unit which realize an increased high-density mounting, in which the disadvantages described above are eliminated.

A more specific object of the present invention is to improve an efficiency and design flexibility in mounting semiconductor devices along three-dimensional directions.

A further more specific object of the present invention is to miniaturize the semiconductor device and to improve reliability of the semiconductor device.

The object described above is achieved by a semiconductor device comprising: a semiconductor element; leads being connected with the semiconductor element, each of the leads including an outer lead part for being connected externally; and a plastic package sealing the semiconductor element and the leads; wherein the outer lead part is exposed to the outside of a side face of the plastic package, and the plastic package is mounted on any base in a standing form by the side face contacting the base.

According to the above semiconductor device, the outer lead part for being connected externally is exposed to the outside of the side face of the plastic package and the side face in which the outer lead part is formed is used for a mounting face. Therefore, the plastic package may be mounted on any base in the standing form. Accordingly, a space necessary for mounting the semiconductor device on the base may be reduced, and the increased high-density mounting is realized.

The object described above is also achieved by the semiconductor device mentioned above, wherein the outer lead part further comprises parts which are exposed to the outside of two opposite faces crossing the side face of the plastic package.

According to the above semiconductor device, the outer lead part is also exposed to the outside of the two opposite faces of the plastic package. Therefore, the outer lead part may be connected externally in three faces, namely the side face, and the two opposite faces crossing the side face of the plastic package. Accordingly, an electrical connection method may be flexibly selected. And, since neighboring semiconductor devices may be connected to each other by using the outer lead parts in the above opposite faces, a plurality of the semiconductor devices may be stacked.

The object described above is also achieved by the semiconductor device mentioned above, wherein the semiconductor element comprises a back face which is exposed to the outside of the plastic package.

According to the above semiconductor device, the back face of the semiconductor element is exposed to the outside of the plastic package. Therefore, a heat radiation efficiency of the semiconductor element may be improved, and the semiconductor device may be miniaturized.

The object described above is also achieved by the semiconductor device mentioned above, wherein the device further comprises a stage on which the semiconductor element is mounted.

According to the above semiconductor device, the semiconductor element is mounted on the stage. Therefore, when plastic molding is carried out, the semiconductor element may be surely supported.

The object described above is also achieved by the semiconductor device mentioned above, wherein the outer lead part further comprises a part which is exposed to the outside of an opposite side face of the side face of the plastic package.

According to the above semiconductor device, the outer lead part is also exposed to the outside of the opposite side face of the side face for contacting the base. Therefore, the outer lead part may be connected externally in two opposite side faces of the plastic package. Since the semiconductor devices may be connected to each other by using the outer lead parts in the above opposite side faces, a plurality of the semiconductor devices may be stacked in a vertical direction.

The object described above is also achieved by a semiconductor device unit comprising a plurality of the above-mentioned semiconductor devices.

According to the semiconductor device unit, the semiconductor devices are connected to each other by the outer lead parts being electrically connected to each other. Therefore, a plurality of the semiconductor devices may be stacked in the horizontal and vertical directions. Accordingly, a large number of semiconductor devices may be mounted on a small space, and, thus, the mounting density may be further improved.

Other objects and further features of the present invention will be apparent from the following detailed description when read in conjunction with the accompanying drawings.

BRIEF DESCRIPTION OF THE DRAWINGS

FIG. 4 shows a cross-sectional view of a first embodiment of a semiconductor device according to the present invention;

FIGS. 5A to 5C show an illustration for explaining a fabrication method of the first embodiment of the semiconductor device;

FIGS. 10A and 10B show cross-sectional views of second embodiments of semiconductor-device units according to the present invention;

FIG. 18 shows a cross-sectional view of a tenth embodiment of a semiconductor-device unit according to the present invention;

FIG. 19 shows a cross-sectional view of a eleventh embodiment of a semiconductor-device unit according to the present invention;

FIG. 20 shows an illustration for explaining a fabrication method of a twelfth embodiment of a semiconductor-device unit according to the present invention;

FIG. 21 shows an illustration for explaining the fabrication method of the twelfth embodiment of the semiconductor-device unit according to the present invention;

FIGS. 29A to 29C show, respectively, a bottom view, a perspective view, and an extended illustration of the connection leads of a fourteenth embodiment of a semiconductor-device unit according to the present invention;

FIG. 42A to FIG. 46 show manufacturing processes of the sixth embodiment of the semiconductor device according to the present invention shown in FIG. 41;

DESCRIPTION OF THE PREFERRED EMBODIMENTS

Figure 12:
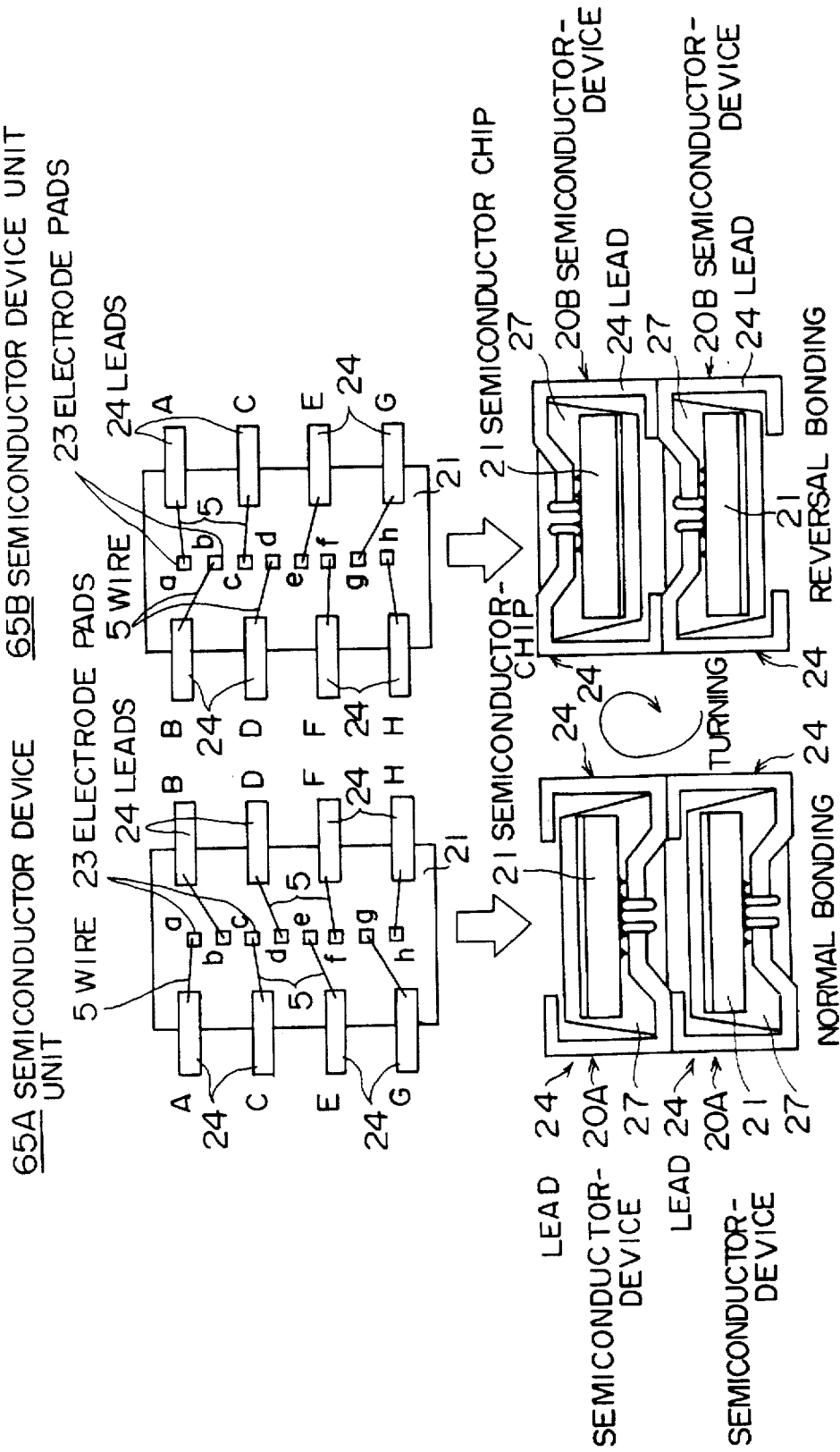
FIGS. 12A and 12B show cross-sectional views of fourth embodiments of semiconductor-device units according to the present invention.

First, a description will be given of a first embodiment of a semiconductor device according to the present invention, by referring to FIG. 4. FIG. 4 shows a cross-sectional view of the semiconductor device of the first embodiment according to the present invention. A semiconductor device 20 includes a semiconductor element (semiconductor chip) 21 which is fixed on a stage 22. The semiconductor chip 21 is, for example, a memory chip, and has a relatively large size. Electrode pads 23 are formed on a center region of the semiconductor chip 21 and in a direction of a longer side of the semiconductor chip 21 (as shown in FIG. 12)

Further, the semiconductor device 20 has a plurality of leads 24. Each inner-lead part 24a, which is formed at one-end of each lead 24, is connected to the corresponding electrode pad 23 on the semiconductor chip 21 through a respective wire 25. A residual portion of the lead 24 except for the inner-lead part 24a forms an outer-lead part 24b, which further forms a first-port part 24b-1, a second-port part 24b-2, and a third-port part 24b-3.

A plastic package 27 seals the semiconductor chip 21, the wires 25, and the inner-lead parts 24a of the leads 24 to support these components. This plastic package 27 has almost the same area as that of the semiconductor chip 21, which is an effective configuration for miniaturizing the semiconductor device 20.

An outer-lead part 24b is projected from a bottom face of the plastic package 27 outward through a side thereof. The outer-lead part 24b projected from the plastic package 27 is bent at two points thereof toward a side wall and a top face of the plastic package, in which the first-port part 24b-1, the second-port part 24b-2, and the third-port part 24b-3 are formed.

The first-port part 24b-1 is formed to be exposed on the bottom surface 27a of the plastic package 27, the second-port part 24b-2 is formed over the top surface 27b of the plastic package 27, and the third-port part 24b-3 is formed to extend in a vertical direction near side walls 27c of the plastic package 27. Thus, the outer-lead part 24b of each of the leads 24 is extended from the bottom surface 27a of the plastic package 27 to the top surface 27b thereof along an outline of the plastic package 27.

In the first-port part 24b-1, a portion thereof is buried in the bottom surface 27a of the plastic package 27. Further, between the second-port part 24b-2 and the top surface 27b of the plastic package 27, a small gap 28 is formed, and also between the third-port part 24b-3 and the side wall 27c of the plastic package 27, a small gap 29 is formed.

In this configuration of the semiconductor device 20, the inner-lead part 24a and the first-port part 24b-1 of the lead 24 almost overlap with the semiconductor chip 21 within the plastic package 27 in the vertical direction (direction indicated by arrow "H"). Namely, the inner-lead part 24a and the first-port part 24b-1 are formed almost under an area of the semiconductor chip 21. Further, the second-port part 24b-2, which is located on the top surface 27b of the plastic package 27, is also formed almost over the area of the semiconductor chip 21.

Assuming that a length of each lead 24 in a horizontal direction (direction indicated by arrow "G") is L1, an overlap length L2 between the lead 24 and the semiconductor chip 21 may be represented by 2×L1. Further, the plastic package 27 is formed to have almost the same area as that of the semiconductor chip 21,therefore, assuming that a length of the semiconductor chip 21 is L3 as shown in FIG. 4, a length of the semiconductor device 20 in the horizontal direction may be almost L3.

Figure 1:
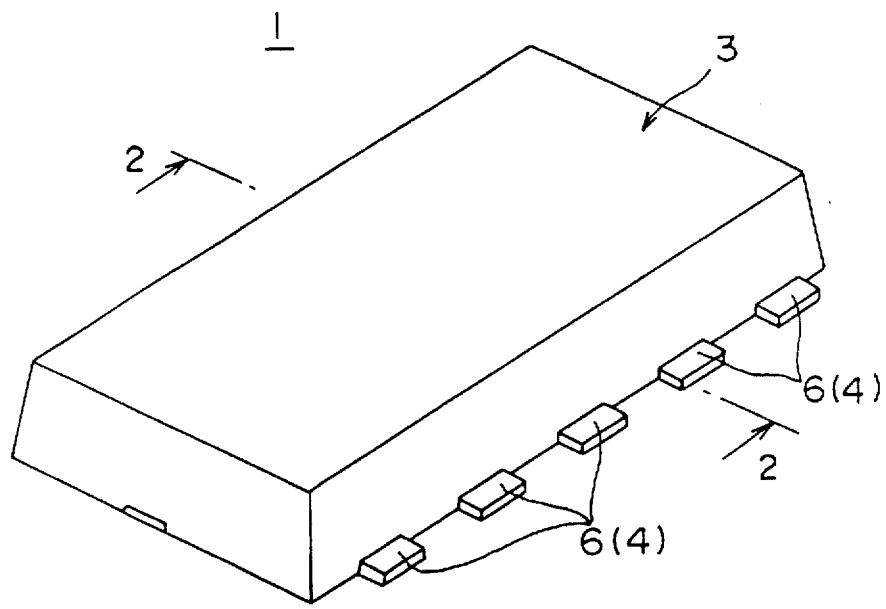
FIG. 1 shows a perspective view of a conventional semiconductor device.
Figure 2:
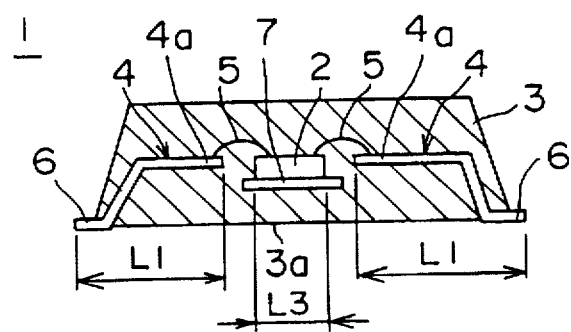
FIG. 2 is a cross-sectional view of the semiconductor device shown in FIG. 1 taken along line 2—2.
Figure 3A:
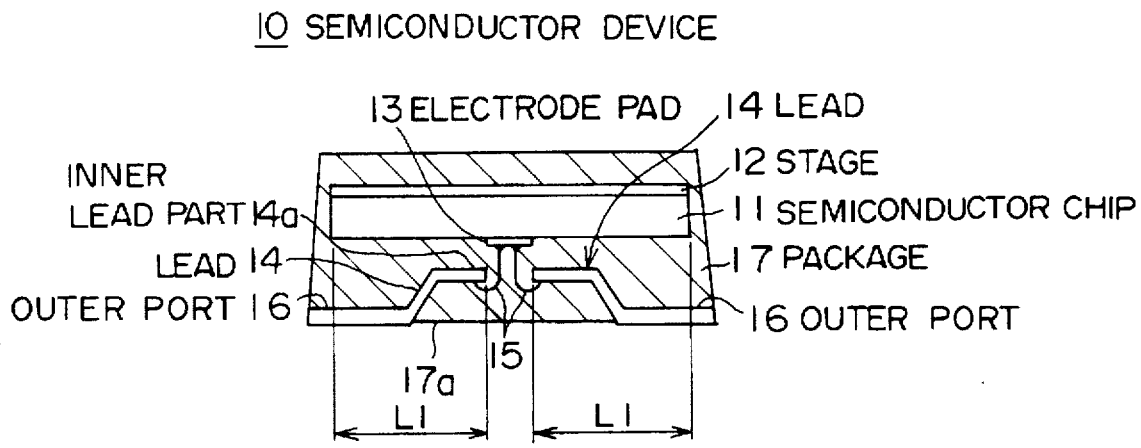
FIG. 3A shows a cross-sectional view of another conventional semiconductor device.
Figure 3B:
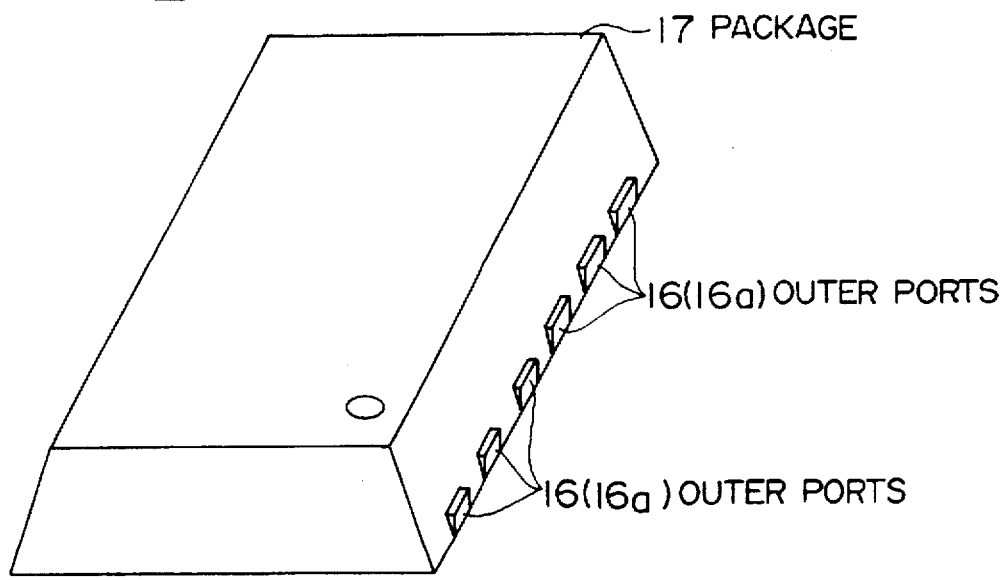
FIG. 3B shows a perspective view of the another conventional semiconductor device.

On the contrary, in the conventional semiconductor device 1 shown in FIGS. 1 and 2, a length L4 (not shown) of the package 3 in the horizontal direction may be almost represented by a sum of the length L3 of the semiconductor chip 2 and the length 2×L1 of the lead 4 (L4=L3+2×L1). Namely, the semiconductor device 20 according to the present invention may be miniaturized as compared with the semiconductor chip 1 shown in FIGS. 1 and 2 by the overlap length L2.

In this way, the semiconductor device 20 according to the present invention may be greatly miniaturized as compared with the conventional semiconductor device 1, therefore improving an efficiency with which the semiconductor device 20 is mounted on a circuit base. Further, such configuration enables a miniaturization and a higher-performance operation of an apparatus for mounting the semiconductor device 20.

In the semiconductor device 20 according to the present invention, the first-port part 24b-1 is formed on the bottom surface 27a of the plastic package 27, the second-port part 24b-2 is formed on the top surface 27b of the plastic package 27, and the third-port part 24b-3 is formed near the side walls 27c of the plastic package 27. Therefore, it is possible to layer a plurality of the semiconductor devices 20 in the vertical direction, and it is also possible to arrange the plurality of the semiconductor devices 20 in the horizontal direction in a small space. Thus, the semiconductor device 20 according to the present invention may be mounted with further improved efficiency, and even greater miniaturization and even higher-performance operation of the apparatus for mounting the semiconductor device 20 may be provided.

FIGS. 5A to 5C show a fabrication method of the semiconductor device 20. The fabrication method of the semiconductor device 20 excepting a forming method of the lead 24 is already disclosed in the Japanese Laid-Open Patent Application No.6-132453 mentioned before, thus only a description of the forming method of the lead 24 will be given.

FIG. 5A shows a condition of the semiconductor device 20 before forming the second- and the third-port parts 24b-2, 24b-3. In this condition, the outer-lead part 24b is extended straight from the side wall 27cof the plastic package 27 in the horizontal direction. In FIG. 5A, only the outer-lead part 24b in a right side of the plastic package 27 is illustrated, but a left side of the plastic package 27 has a configuration similar to that of the right side thereof.

In FIG. 5B, to form the port parts in the outer-lead part 24b, a top-end part of the outer-lead part 24b is bent in an upper direction by a given length (which is to be a length of the second-port part 24b-2). And as shown in FIG. 5C, a portion of the outer-lead part 24b exposed outside of the plastic package 27 is bent in a direction of the side wall of the plastic package 27, thus the lead 24 shown in FIG. 4 is formed.

In this way, a forming process of the port parts in the outer-lead part 24b can be easily performed by two bending process (for example, a press process). By performing the two bending process, a portion of the outer-lead part 24b is extended over the top surface 27b of the plastic package 27 along the side wall 27c thereof. In this outer-lead part 24b, the third-port part 24b-3 is almost at a right angle to the first-port part 24b-1 and to the second-port part 24b-2. To make it easy to perform the above bending process, and to ensure the right angles at bending points, it is effective to previously form thin parts at the bending points by means of a half etching, etc.

Figure 6:
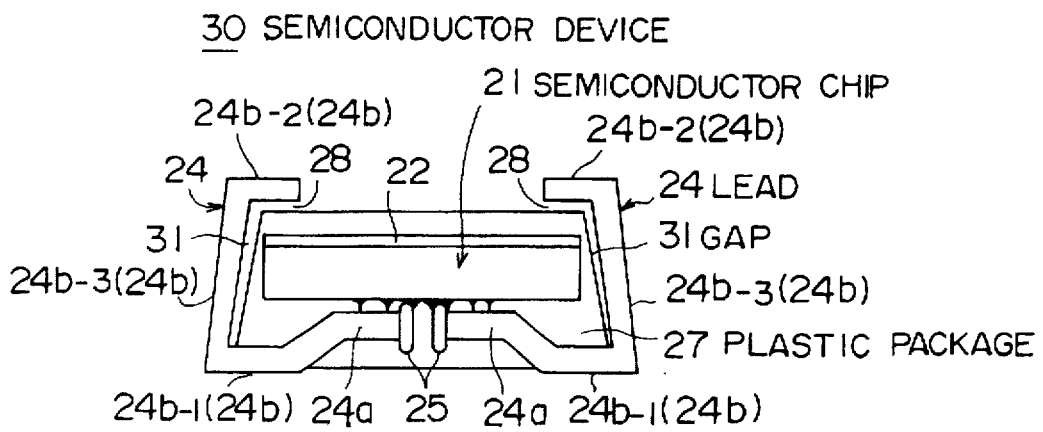
FIG. 6 shows a cross-sectional view of a second embodiment of a semiconductor device according to the present invention.

Next, a description will be given of a second embodiment of the semiconductor device according to the present invention, by referring to FIG. 6. FIG. 6 shows a cross-sectional view of the semiconductor device 30 of the second embodiment according to the present invention. Like elements to those of FIG. 4 are given the same reference numerals.

With respect to the semiconductor device 20 of the first embodiment shown in FIG. 4, the third-port part 24b-3 of the outer-lead part 24b is extended in the vertical direction, which is a just upper direction of a drawing of FIG. 6. The side wall 27c of the plastic package 27 is generally a taper surface having a slope. Therefore, in the semiconductor device 20, a gap 29 larger than a necessary size may be formed between the outer-lead part 24b and the side wall 27c.

On the other hand, in the semiconductor device 30 of the second embodiment, the third-port part 24b-3 of the outer-lead part 24b is further bent in the direction of the side wall 27c than the third-port part 24b-3 in the semiconductor device 20, thus the third-port part in the semiconductor device 30 is formed almost along the side wall 27c of the plastic package 27. Therefore, a size of a gap 31 may be reduced compared to the gap 29 in the semiconductor device 20, so that the semiconductor device 30 may be miniaturized by an amount equal to a difference between the volume of the gap 31 and that of the gap 29 compared to the semiconductor device 20.

Figure 7:
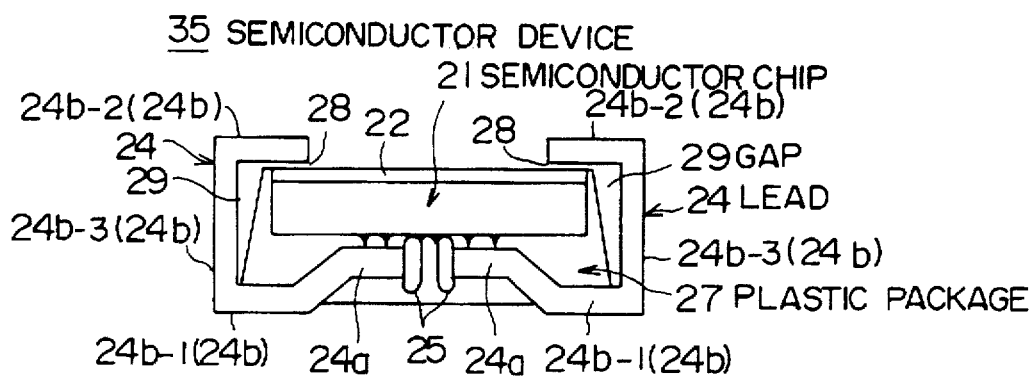
FIG. 7 shows a cross-sectional view of a third embodiment of a semiconductor device according to the present invention.

Next, a description will be given of a third embodiment of the semiconductor device according to the present invention, by referring to FIG. 7. FIG. 7 shows a cross-sectional view of a semiconductor device 35 of the third embodiment according to the present invention. Like elements in FIG. 7 to those of FIG. 4 are given the same reference numerals.

In the semiconductor device 20 of the first embodiment shown in FIG. 4, the semiconductor chip 21 and the stage 22 are wholly sealed within the plastic package. On the other hand, in the semiconductor device 35, the stage 22 is exposed from inside the plastic package 27 as there is no plastic material (top surface 27b in FIG. 4) covering the stage 22.

Thus, because the above plastic material of the plastic package 27 is not formed on the stage 22, a height of the semiconductor device 35 may be reduced by a length from the stage 22 to the top surface 27b of the semiconductor device 20 compared to the semiconductor device 20. Further the semiconductor device 35 has another advantage in that a heat-radiation efficiency of the semiconductor chip 21 may be improved, because the stage 22, on which the semiconductor chip 21 is mounted, is exposed from inside the plastic package 27.

It should be noted that in the semiconductor device 30 shown in FIG. 6, if the stage 22 is exposed from inside the plastic package 27, the semiconductor device 30 may be also thinned in the same way as that mentioned above.

Figure 8:
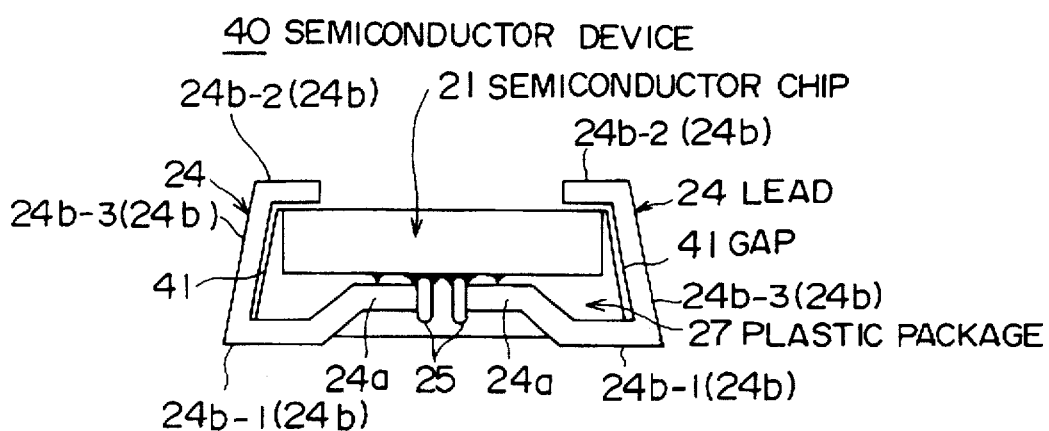
FIG. 8 shows a cross-sectional view of a fourth embodiment of a semiconductor device according to the present invention.

Next, a description will be given of a fourth embodiment of the semiconductor device according to the present invention, by referring to FIG. 8. FIG. 8 shows a cross-sectional view of a semiconductor device 40 of the fourth embodiment according to the present invention. Like elements in FIG. 8 to those of FIG. 4 are given the same reference numerals.

In the semiconductor device 40 shown in FIG. 8, in the same way as mentioned in the second embodiment, the outer-lead part 24b is further bent toward the side wall 27c of the plastic package 27 than the outer-lead part 24b of the semiconductor device 20, thus the third-port part 24b-3 of the outer-lead part 24b is formed almost along the side wall 27c of the plastic package 27. Therefore, a size of the gap 41 may be reduced compared to the gap 29 in the semiconductor device 20, so that the semiconductor device 40 may be miniaturized by an amount equal to a difference between the volume of the gap 41 and that of the gap 29 compared to the semiconductor device 20.

Further, in the semiconductor device 40, the semiconductor chip 21 is directly exposed from inside the plastic package 27 as there is no plastic material (top surface 27b in FIG. 4) and no stage 22 formed on the semiconductor chip 21. In this configuration, the heat-radiation efficiency of the semiconductor chip 21 may be further improved and the thickness of the semiconductor device 40 may be further thinned, compared respectively to the heat-radiation efficiency and thickness of the semiconductor device 35 of the third embodiment. It is noted that if only a portion of the semiconductor chip 21 is exposed from inside the plastic package 27, an improvement of the heat-radiation efficiency may be obtained. To expose the portion of the semiconductor chip 21 from inside the plastic package 27, the plastic package 27 is molded while masking an area which is to be exposed. In this way, an exposing process is easily performed.

Figure 9A:
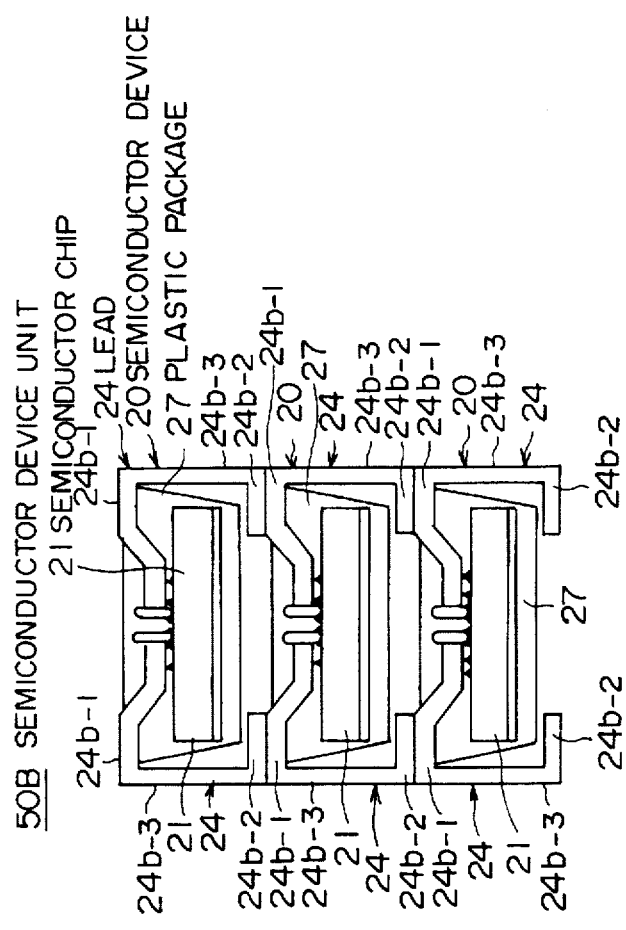
FIGS. 9A and 9B show cross-sectional views of first embodiments of semiconductor-device units according to the present invention.
Figure 9B:
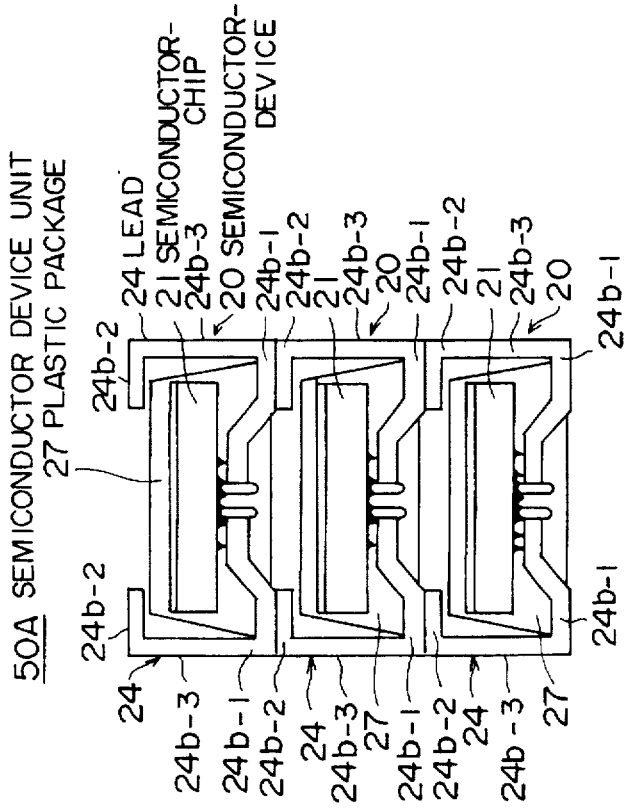

Next, a description will be given of first embodiments of semiconductor-device units according to the present invention, by referring to FIGS. 9A and 9B. FIGS. 9A and 9B respectively show cross-sectional views of the first embodiments of semiconductor-device units 50A and 50B according to the present invention. Like elements in FIGS. 9A and 9B to those of FIG. 4 are given the same reference numerals.

In the semiconductor-device unit 50A shown in FIG. 9A, a plurality of the semiconductor devices 20 shown in FIG. 4 are piled in a vertical direction. On the other hand, in the semiconductor-device unit 50B shown in FIG. 9B, a plurality of the semiconductor devices 20 turned upside down are piled in the vertical direction.

When the semiconductor devices 20 are, for example, storage devices, in practice, one device of those semiconductor devices 20 may be selected for use by a chip-selection signal. This selection of a semiconductor device makes it possible to increase a storage capacity.

In the semiconductor-device unit 50A, the first-port part 24b-1 of the semiconductor device 20 at an upper side is connected to the second-port part 24b-2 of the semiconductor device 20 at a lower side. In the semiconductor-device unit 50B, the second-port part 24b-2 of the semiconductor device 20 at the upper side is connected to the first-port part 24b-1 of the semiconductor device 20 at the lower side. These connections may be performed by means of, for example, a soldering, or a laser welding.

In this way, each of the semiconductor-device units 50A, 50B enables piling of miniaturized semiconductor devices 20, therefore an efficiency with which the semiconductor devices 20 are mounted is improved.

When the connection between an upper and a lower semiconductor device 20 is performed by a heating process such as soldering, the second-port part 24b-2 and the third-port part 24b-3 may be bent by thermal-expansion. However, in the semiconductor device 20, there is the gap 28 between the second-port part 24b-2 and the top surface 27b of the plastic package 27, and there is the gap 29 between the third-port part 24b-3 and the side wall 27c of the plastic package 27. Therefore, these gaps 28, 29 are available for space for deviation generated due to the second-port part 24b-2 and the third-port part 24b-3 being bent.

Therefore, even if the thermal-expansion of each port part 24b-2, 24b-3 occurs when the heating process for the connections is carried out, the gaps mentioned above absorb the thermal-expansion by each port part 24b-2, 24b-3 being bent.

Further, because the semiconductor devices 20 are piled one upon the other if an amount of stress is applied on the second-port part 24b-2 and the third-port part 24b-3, these gaps absorb the stress by the port parts 24b-2, 24b-3 being bent.

Therefore, no stress and no thermal-expansion mentioned above are directly applied on the plastic package 27, thus preventing cracks from occurring in the plastic package 27. As a result, reliability of the semiconductor device 20 and the semiconductor-device units 50A, 50B is improved.

As shown in the embodiments of FIGS. 9A and 9B, the first-port part 24b-1 and the second-port part 24b-2 can be symmetrically formed along upper and lower sides of the plastic package 27, therefore the reversed semiconductor devices 20 can also be piled one upon the other as shown in the semiconductor-device unit 50B, which operates like the semiconductor-device unit 50A. Thus such a configuration makes it possible to improve design flexibility in mounting these devices on the mounting base.

Next, a description will be given of second embodiments of the semiconductor-device units according to the present invention, by referring to FIGS. 10A and 10B. FIGS. 10A and 10B respectively show cross-sectional views of second embodiments of the semiconductor-device units 55A and 55B according to the present invention. Like element in FIGS. 10A and 10B to those of FIG. 4 are given the same reference numerals.

In the semiconductor-device unit 55A shown in FIG. 10A, a plurality of the semiconductor devices 35 shown in FIG. 7 are piled in a vertical direction. On the other hand, in the semiconductor-device unit 55B shown in FIG. 10B, a plurality of reversed semiconductor devices 35 are piled in the vertical direction, each of these semiconductor devices 35 being turned upside down.

In the semiconductor-device unit 55A, the first-port part 24b-1 of the semiconductor device 35 at an upper side is connected to the second-port part 24b-2 of the semiconductor device 35 at a lower side. In the semiconductor-device unit 55B, the second-port part 24b-2 of the semiconductor device 35 at the upper side is connected to the first-port part 24b-1 of the semiconductor device 35 at the lower side.

Therefore, such configurations make it possible to improve the efficiency with which the semiconductor devices 35 are mounted, and further to improve the heat radiation of the semiconductor chip 21.

Further, the semiconductor device 35 has the gap 28 between the second-port part 24b-2 and the top surface 27b of the plastic package 27, and has the gap 29 between the third-port part 24b-3 and the side wall 27c of the plastic package 27, as shown in FIG. 7, like the semiconductor device 20. When thermal-expansion and the stress are generated on the semiconductor-device units 55A, 55B, these gaps absorb the thermal-expansion and the stress by each port part 24b-2, 24b-3 being bent. Therefore, no stress and no thermal-expansion are directly applied on the plastic package 27. Thus, the semiconductor-device units 55A, 55B also may prevent cracks in the plastic package 27, like the semiconductor-device units 50A, 50B. As a result, reliability of the semiconductor device 35 and the semiconductor-device units 55A, 55B may be improved.

Further, since in the semiconductor device 35 in the semiconductor-device units 55A, 55B, symmetrical port parts 24b-1, 24b-2 like those of the semiconductor device 20 can be formed, the reversed semiconductor devices 25 can also be piled one upon the other as shown in the semiconductor-device unit 55B, which operates like the semiconductor-device unit 55A. Thus such a configuration also makes it possible to improve design flexibility in mounting these devices on the mounting base.

Figure 11:
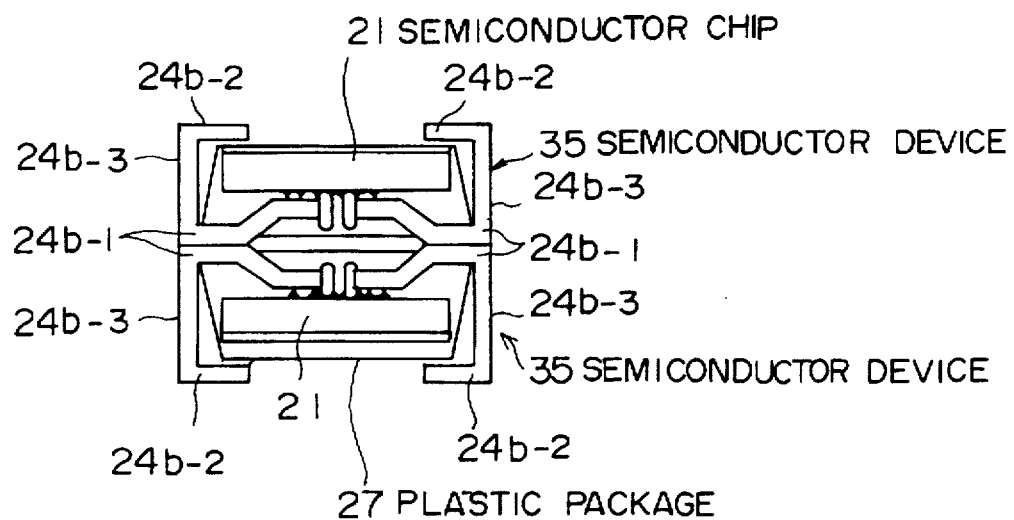
FIG. 11 shows a cross-sectional view of a third embodiment of a semiconductor-device unit according to the present invention.

Next, a description will be given of a third embodiment of the semiconductor-device unit according to the present invention, by referring to FIG. 11. FIG. 11 shows a cross-sectional view of the third embodiment of a semiconductor-device unit 60 according to the present invention. Like elements in FIG. 11 to those of FIG. 4 are given the same reference numerals.

In the semiconductor-device unit 60 shown in FIG. 11, the semiconductor device 35 shown in FIG. 7 and reversed ones are piled one upon the other in a vertical direction. In the example shown in FIG. 11, the lower-side semiconductor device 35 is turned upside down. Therefore, the first-port part 24b-1 of the upper-side semiconductor device 35 is connected with the first-port part 24b-1 of the lower-side semiconductor device 35.

In this way, it is possible to pile up the plurality of the semiconductor devices 35 including reversed ones where each semiconductor device 35 is turned upside down. Therefore, such a configuration makes it possible to further improve the design flexibility in piling these devices 35 on the mounting base.

Next, a description will be given of fourth embodiments of the semiconductor-device units according to the present invention, by referring to FIGS. 12A and 12B. FIGS. 12A and 12B respectively show cross-sectional views in vertical and horizontal directions of the fourth embodiments of semiconductor-device units 65A and 65B according to the present invention. Like elements FIGS. 12A and 12B to those of FIG. 4 are given the same reference numerals.

In the semiconductor-device units 65A and 65B, semiconductor devices 20A and 20B corresponding to the semiconductor device 20 shown in FIG. 4 are respectively used. In the upper-side drawings of FIGS. 12A, 12B, there is shown a relation of bonding arrangement of the wires 5 between the inner-lead parts 24a and the electrode pads 23. As shown in these drawings, the bonding arrangement in the semiconductor device 20A and the bonding arrangement in the semiconductor device 20B are symmetrically constructed. Therefore, because of the symmetrical bonding arrangement of the wires 5 in the semiconductor devices 20A, 20B, an arrangement of lead functions in the leads 24, where the lead function means a signal passing through each lead, is also symmetrical in the semiconductor devices 20A and 20B. Therefore, when the semiconductor device 20B is turned upside down, the reversed device 20B has the same arrangement of lead functions as that of the semiconductor device 20A.

In this way, if the bonding arrangement of the wires 5 is suitably selected, the reversed semiconductor device can be used as a normal semiconductor device. Therefore, the reversed semiconductor-device unit 65A in which semiconductor devices 20A are piled can be used as a semiconductor-device unit having the same lead functions as those of the semiconductor-device unit 65B in which the reversed semiconductor devices 20B are piled. Such a configuration is especially applicable to a storage device (memory device) serving as the semiconductor device, in which it is easy to connect the leads having the same lead functions to each other. Thus, such a configuration makes it easy to design lead connections for piling the semiconductor devices.

Figure 13:
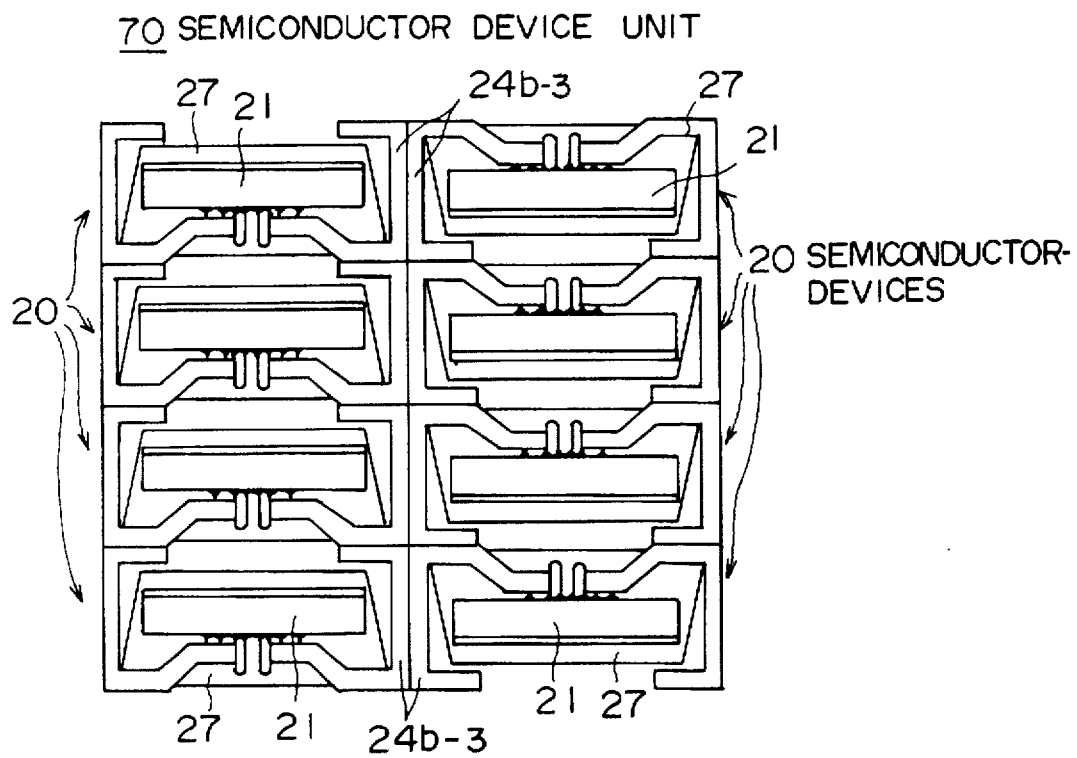
FIG. 13 shows a cross-sectional view of a fifth embodiment of a semiconductor-device unit according to the present invention.

Next, a description will be given of a fifth embodiment of the semiconductor-device unit according to the present invention, by referring to FIG. 13. FIG. 13 shows a cross-sectional view of the third embodiment of a semiconductor-device unit 70 according to the present invention. Like elements in FIG. 13 to those of FIG. 4 are given the same reference numerals.

In the semiconductor-device unit 70 shown in FIG. 13, the plurality of the semiconductor devices 20 shown in FIG. 4 and reversed ones are respectively piled up in parallel with no spaces between them.

As described above, since that the semiconductor devices 20 can be arranged in the horizontal direction as well as in the vertical direction, a mounting efficiency of the semiconductor-device unit 70 can be further improved as compared to those of the semiconductor-device units 50A, 50B, 55A, 55B.

Figure 14:
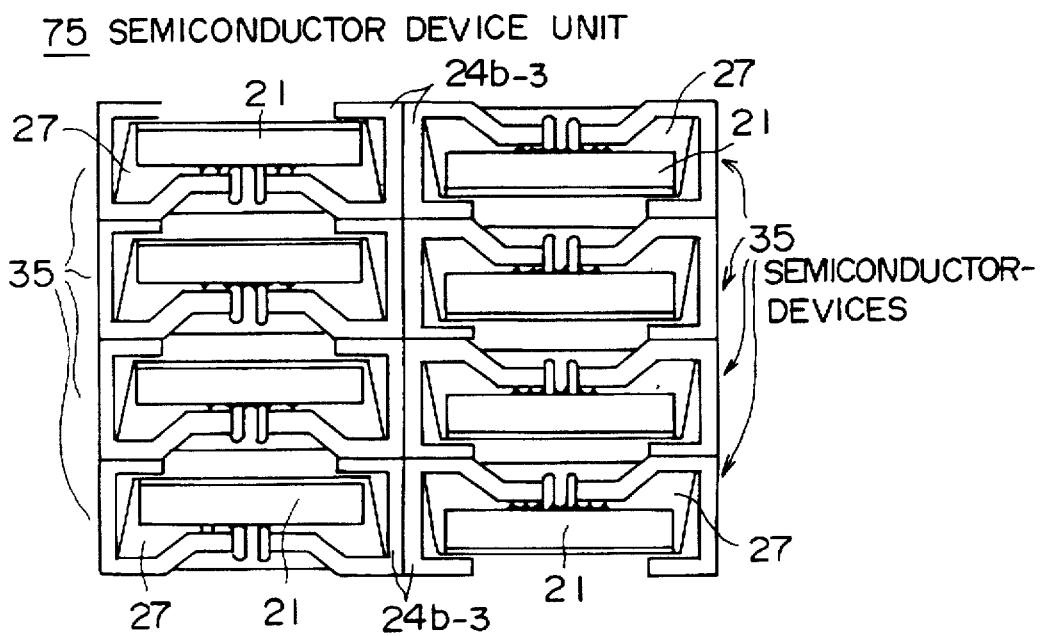
FIG. 14 shows a cross-sectional view of a sixth embodiment of a semiconductor-device unit according to the present invention.

Next, a description will be given of a sixth embodiment of the semiconductor-device unit according to the present invention, by referring to FIG. 14. FIG. 14 shows a cross-sectional view of the sixth embodiment of the semiconductor-device unit 75 according to the present invention. Like elements in FIG. 14 to those of FIG. 4 are given the same reference numerals.

In the semiconductor-device unit 75 shown in FIG. 14, the plurality of the semiconductor devices 35 shown in FIG. 7 and reversed ones are respectively piled up in parallel with no space between them, like in the fifth embodiment shown in FIG. 13.

As described above, since the semiconductor devices 35 can be arranged in the horizontal direction as well as in the vertical direction like the semiconductor-device unit 70, a mounting efficiency of the semiconductor-device unit 75 can be further improved as compared to those of the semiconductor-device units 50A, 50B, 55A, 55B. Furthermore, a height of the semiconductor-device unit 75 can be reduced compared to that of the semiconductor-device unit 70 shown in FIG. 13, because semiconductor devices 35 are thinner than the semiconductor devices 20.

Figure 15:
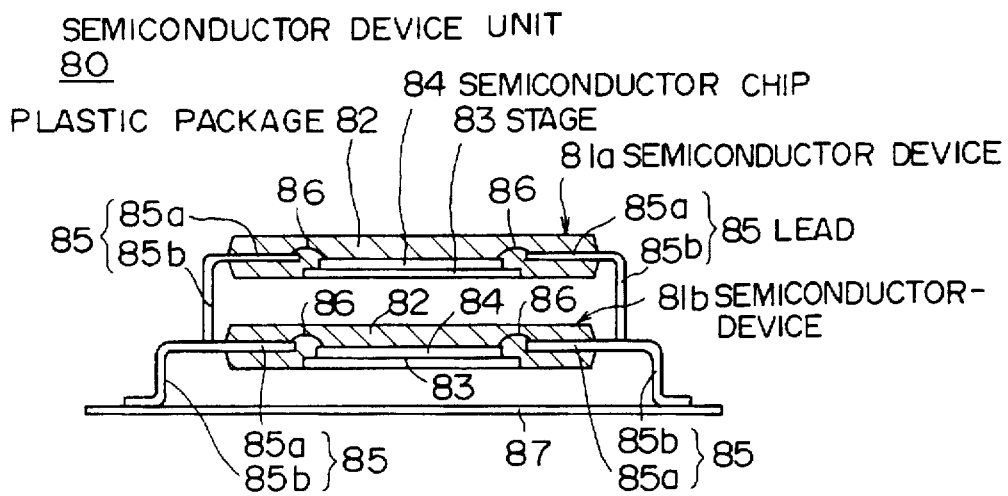
FIG. 15 shows a cross-sectional view of a seventh embodiment of a semiconductor-device unit according to the present invention.

Next, a description will be given of a seventh embodiment of the semiconductor-device unit according to the present invention, by referring to FIG. 15. FIG. 15 shows a cross-sectional view of the seventh embodiment of s semiconductor-device unit 80 according to the present invention. Like elements in FIG. 15 to those of FIG. 4 are given the same reference numerals.

In the semiconductor-device unit 80 shown in FIG. 15, semiconductor devices 81a, 81b, which are ultra thin small L-lead package (UTSOP) type devices, are piled one upon the other on a mounting base 87. In each of the UTSOP-type semiconductor devices 81a, 81b, a semiconductor chip 84 mounted on a stage 83 is sealed within a plastic package 82, the stage 83 being exposed from the plastic package 82. Since the stages 83 are exposed from inside the plastic packages 82, such a configuration makes it possible to reduce the thickness of the semiconductor devices 81a, 81b, and to improve a heat radiation of the semiconductor chip 84.

In the semiconductor devices 81a, 81b, leads 85, which are connected with the semiconductor chip 84 by wires 86, consist of inner-lead parts 85a and outer-lead parts 85b, the inner-lead parts 85a being sealed within the plastic packages 82, and the outer-lead parts 85b being extended in a direction away from the plastic packages 82, respectively. Especially, in the semiconductor device 81b, the outer-lead part 85b is formed in the shape of a gull-wing. Further, a top-end part of the outer-lead part 85b of the semiconductor device 81a is extended in a downward direction.

When the semiconductor device 81a is piled on the semiconductor device 81b, a top end of the outer-lead part 85b of the semiconductor device 81a is coupled to a shoulder part of the outer-lead part 85b of the semiconductor device 81b. In this way, a positioning of the semiconductor device 81a at an upper side and the semiconductor device 81b at a lower side can be easily performed. This coupling between the outer-lead parts 85b may be performed by means of, for example, soldering or laser welding.

Further, in such a configuration, the semiconductor device 81a and the semiconductor device 81b can be precisely positioned, thus leading to the semiconductor devices 81a and 81b being reliably electrically connected to each other.

Though FIG. 15 shows only one example in which two semiconductor devices are piled up, it is possible to pile up three or more semiconductor devices. In this case, each of the semiconductor devices to be piled up except a bottom one can be formed with the same form (shape), thus making it possible to improve a fabrication efficiency of the semiconductor device.

Figure 16:
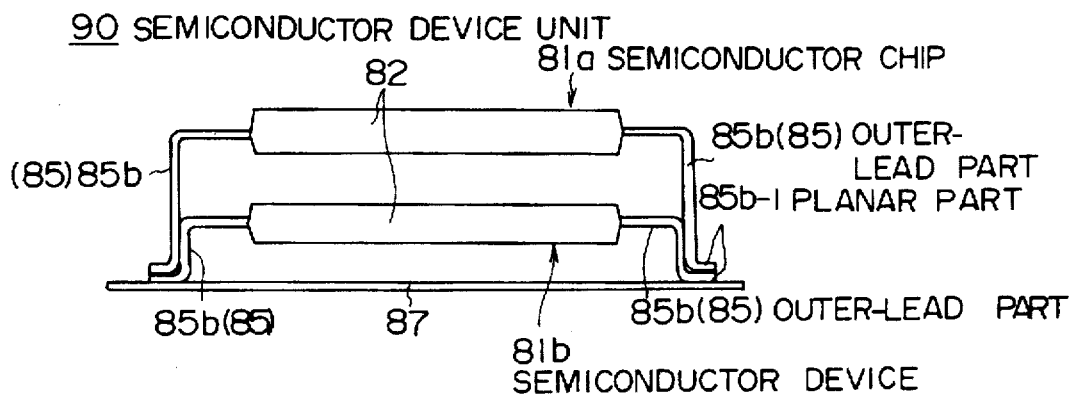
FIG. 16 shows a cross-sectional view of a eighth embodiment of a semiconductor-device unit according to the present invention.

Next, a description will be given of an eighth embodiment of the semiconductor-device unit according to the present invention, by referring to FIG. 16. FIG. 16 shows a cross-sectional view of the eighth embodiment of a semiconductor-device unit 90 according to the present invention. Like elements in FIG. 16 to those of FIG. 15 are given the same reference numerals. In the semiconductor-device unit 90 shown in FIG. 16, the UTSOP-type semiconductor devices 81a, 81b are piled up on the mounting base 87.

In the semiconductor devices 81a, 81b of the semiconductor-device unit 90, the lead 85 includes the outer-lead part 85b which is extended in a direction away and down from the plastic package 82. Each of the outer-lead parts 85b is formed in the shape of a gull-wing, in a top-end part of which a planar part 85b-1 is formed, the top-end part being extended in a downward direction. As for the length of the outer-lead part 85b extending in the downward direction, such a length of the outer-lead part 85b of the semiconductor device 81a at the upper side is longer than that of the semiconductor device 81b at the lower side. Therefore, by coupling each planar part 85b-1 at one point as shown in FIG. 16, the semiconductor devices 81a, 81b are easily piled up.

As mentioned above, by coupling each planar part 85b-1 at one point, positions of the semiconductor devices 81a, 81b are determined. Therefore, the semiconductor device 81a and the semiconductor device 81b can be precisely positioned, thus leading to the semiconductor devices 81a and 81b in the semiconductor-device unit 90 being reliable and electrically connected to each other.

Figure 17:
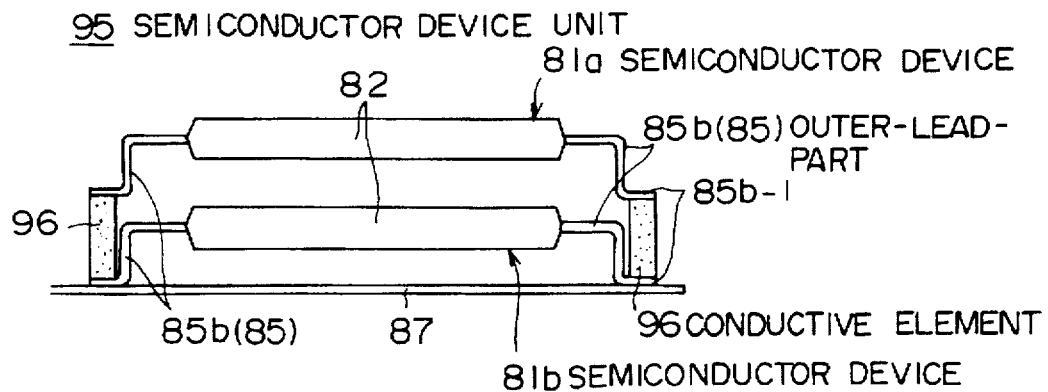
FIG. 17 shows a cross-sectional view of a ninth embodiment of a semiconductor-device unit according to the present invention.

Next, a description will be given of a ninth embodiment of the semiconductor-device unit according to the present invention, by referring to FIG. 17. FIG. 17 shows a cross-sectional view of the ninth embodiment of the semiconductor-device unit 95 according to the present invention. Like elements to those of FIG. 15 carry the same reference numerals. Also in the semiconductor-device unit 95 shown in FIG. 17, the UTSOP-type semiconductor devices 81a, 81b are piled one upon the other on the mounting base 87.

In the semiconductor devices 81a, 81b of the semiconductor-device unit 95, each outer-lead part 85b is extended in the outer and lower directions of the plastic package 82. Each of the outer-lead parts 85b is formed in the shape of the gull-wing, in a top-end part of which the planar part 85b-1 is formed. And by coupling each planar part 85b-1 through a conductive element 96 as shown in FIG. 17, the semiconductor devices 81a, 81b are piled up. The conductive element 96 may be a metal rod such copper (Cu), etc. And another material, which has good conduction and can support the semiconductor device 81a, also is available for the conductive element 96.

Further, in the semiconductor-device unit 95, the lead 85 of the semiconductor device 81a and the lead 85 of the semiconductor device 81b can be formed in the same form (shape). Therefore, the semiconductor devices 81a, 81b can be constructed in the same form (shape), thereby making it possible to simplify a fabrication process of the semiconductor device, and to reduce a fabrication cost.

Next, a description will be given of a tenth embodiment of the semiconductor-device unit according to the present invention, by referring to FIG. 18. FIG. 18 shows a cross-sectional view of the tenth embodiment of the semiconductor-device unit 100 according to the present invention. Like elements to those of FIG. 15 carry the same reference numerals. Also in the semiconductor-device unit 100 shown in FIG. 18, the UTSOP-type semiconductor devices 81a, 81b are piled up on the mounting base 87.

In the semiconductor-device unit 100, when the semiconductor devices 81a, 81b are piled one upon the other, the outer-lead part 85b of the semiconductor device 81a at the upper side is electrically connected to the outer-lead part 85b of the semiconductor device 81b at the lower side. For this electrical connection, any connecting method described above with reference to FIGS. 15 to 17 is available. Further, in the semiconductor-device unit 100, the plastic package 82 of the semiconductor device 81a is piled and fixed on the plastic package 82 of the semiconductor device 81b by inserting adhesive 101 between both the plastic packages 82. When the adhesive 101 is set, the adhesive may surely support the upper-side semiconductor device 81a against the lower-side semiconductor device 81b.

According to the semiconductor-device unit 100 described above, by a simple configuration disposing the adhesive 101 on the plastic package 82, the positioning and fixing of the semiconductor devices 81a, 81b are precisely performed.

Next, a description will be given of an eleventh embodiment of the semiconductor-device unit according to the present invention, by referring to FIG. 19. FIG. 19 shows a cross-sectional view of the eleventh embodiment of the semiconductor-device unit 105 according to the present invention. Like elements to those of FIG. 15 carry the same reference numerals. Also in the semiconductor-device unit 105 shown in FIG. 19, the UTSOP-type semiconductor devices 81a, 81b are piled up on the mounting base 87.

The semiconductor-device unit 105 shown in FIG. 19 is one example of modifications of the semiconductor-device unit 80. In the semiconductor-device unit 105, the top-end part of the outer-lead part 85b of the upper-side semiconductor device 81a is first downwardly extended, and then an end portion is bent inside, whereby a planar part 106 is formed as shown in FIG. 19.

When the semiconductor device 81a is piled on the semiconductor device 81b, the planar part 106 of the outer-lead part 85b in the semiconductor device 81a is coupled to a shoulder part of the outer-lead part 85b in the semiconductor device 81b. Since the planar part 106 may have a certain length, a contact area between the outer-lead part 85b of the semiconductor device 81a and the outer-lead part 85b of the semiconductor device 81b may be larger than that of the configuration shown in FIG. 18. This advantage enables a reliable electrical contact between the semiconductor devices 81a, 81b and a reliable support of the semiconductor device 81a.

Figure 22:
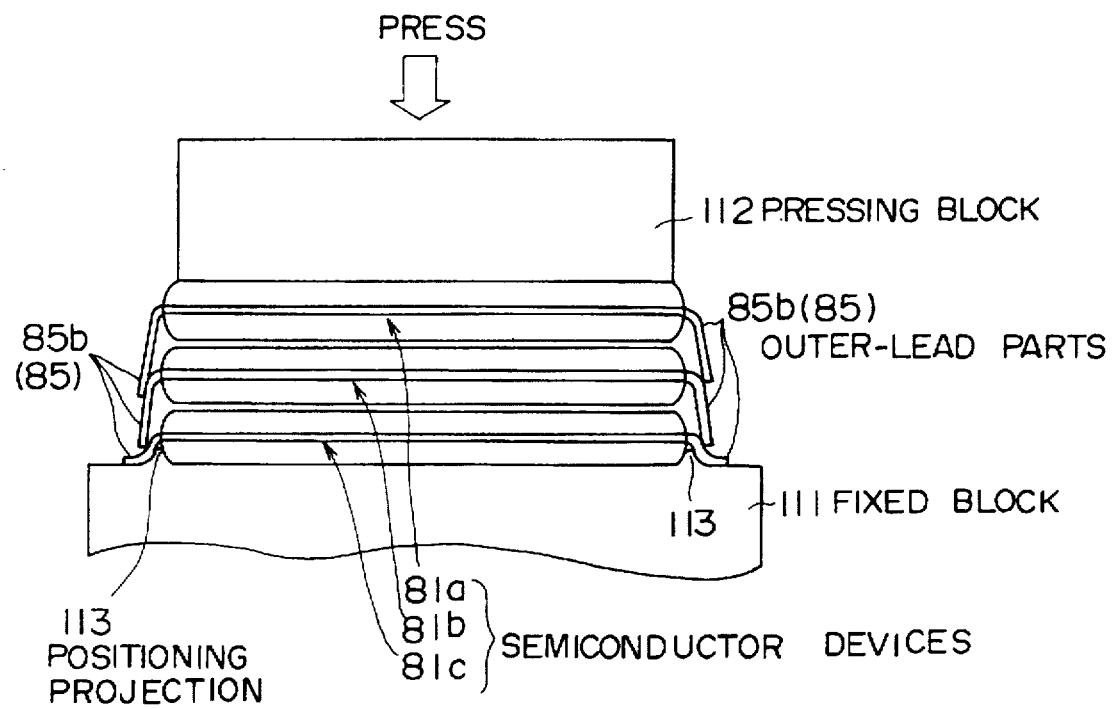
FIG. 22 shows an illustration for explaining the fabrication method of the twelfth embodiment of the semiconductor-device unit according to the present invention.
Figure 23:
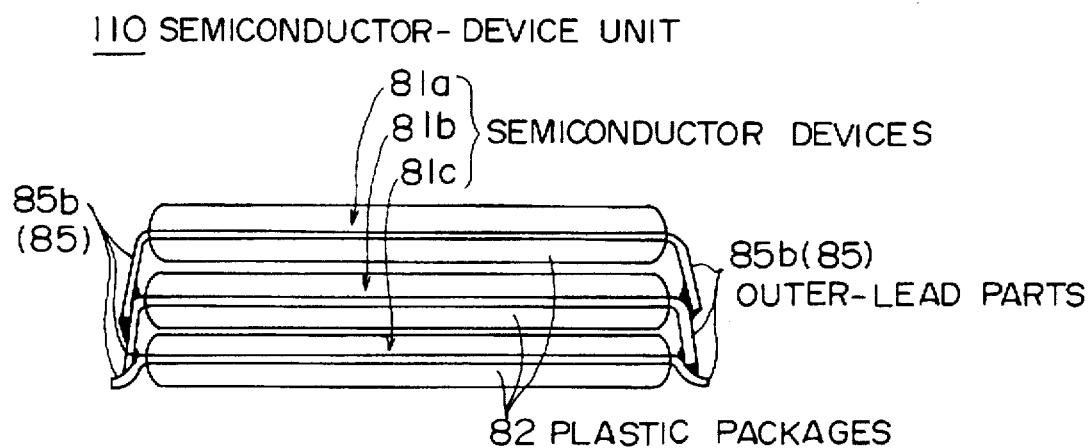
FIG. 23 shows a cross-sectional view of the twelfth embodiment of the semiconductor-device unit according to the present invention.

Next, a description will be given of a twelfth embodiment of the semiconductor-device unit according to the present invention and its fabrication method, by referring to FIGS. 20 to 23. FIGS. 20 to 22 show procedures for explaining the fabrication method of the twelfth embodiment of the semiconductor-device unit 110. FIG. 23 shows a cross-sectional view of the twelfth embodiment of the semiconductor-device unit 110 according to the present invention. Like elements to those of FIG. 15 carry the same reference numerals.

In the semiconductor-device unit 110 shown in FIG. 23, three UTSOP-type semiconductor devices 81a, 81b and 81c are piled up. The outer-lead part 85b of the lowest-side semiconductor device 81c is formed in the shape of the gull-wing. And the outer-lead parts 85b of the middle- and highest-side semiconductor devices 81b, 81a are extended downward. The semiconductor devices 81a, 81b have the same configuration.

As shown in FIG. 20, a length D between shoulders of the outer-lead part 85b of the semiconductor device 81c is designed to be slightly longer than a length E between top ends of the outer-lead part 85b of the semiconductor device 81b (D>E). And the length E is designed to be slightly longer than a length F between shoulders of the outer-lead part 85b of the semiconductor device 81b (E>F). As mentioned above, the semiconductor devices 81a, 81b have the same configuration, therefore, the length E of the semiconductor device 81a is also slightly longer than the length F of the semiconductor device 81b.

Next, the fabrication method of the semiconductor-device unit 110 will be described. First, in FIG. 21, the semiconductor device 81b is piled on the semiconductor device 81c. Because the length D is slightly longer than the length E, the top end of the outer-lead part 85b of the semiconductor device 81b is coupled to the shoulder part of the outer-lead part 85b of the semiconductor device 81c. An this time, the top end of the outer-lead part 85b of the semiconductor device 81b is, by its elasticity, slightly bent outward along an outline of the shoulder part of the outer-lead part 85b of the semiconductor device 81c, as shown in an arrow G. Thus, by its elasticity, the semiconductor device 81b is temporarily fixed to the semiconductor device 81c.

Second, the semiconductor device 81a is piled on the semiconductor device 81b which is temporarily fixed on the semiconductor device 81c. Also in this case, because the length E of the semiconductor device 81a is slightly longer than the length F of the semiconductor device 81b, the top end of the outer-lead part 85b of the semiconductor device 81a is coupled to the shoulder part of the outer-lead part 85b of the semiconductor device 81b. Therefore, also at this time, the top end of the outer-lead part 85b of the semiconductor device 81a is, by its elasticity, slightly bent outward along an outline of the shoulder part of the outer-lead part 85b of the semiconductor device 81b. Thus, by its elasticity, the semiconductor device 81a is temporarily fixed to the semiconductor device 81b. Through the first and the second processes described above, the semiconductor devices 81a, 81b and 81c are piled up in series, and are temporarily fixed to each other.

Third, as shown in FIG. 22, the semiconductor devices 81a, 81b and 81c are disposed on a fixed block 111, and are pressed from an upper side by a pressing block 112. On the fixed block 111, positioning projections 113 are formed. Therefore, by the positioning projections 113 being coupled with the outer-lead part 85b of the lowest-side semiconductor device 81c, also the piled semiconductor devices 81a, 81b are positioned.

And finally, as shown in FIG. 23, cream-type solder is applied to each coupling region of the outer-lead parts 85b of the semiconductor devices, and the semiconductor devices 81a, 81b and 81c with the cream-type solder are heated to set the cream-type solder. With this soldering of the outer-lead parts 85b, the semiconductor unit 110 shown in FIG. 23 is produced.

In this fabrication process of the semiconductor device 110, before the soldering, a plurality of the semiconductor devices 81a, 81b and 81c are temporarily fixed to each other. Therefore, a pressing process in the third process and a soldering process in the fourth process can be easily performed. Further, because the soldering is carried out at the coupling region of each outer-lead part 85b, the cream-type solder may be easily permitted into the coupling region. This enables a reliable electrical contact between the outer-lead parts 85b.

Next, a description will be given of a thirteenth embodiment of the semiconductor-device unit 120 according to the present invention and its fabrication method, by referring to FIGS. 24A, 24B, 25, 26, 28A, 28B and 28C. The semiconductor-device unit 120 comprises two semiconductor devices 122, 123, which stand in parallel by themselves on a mounting base 121. And these semiconductor devices 122, 123 may be operative as storage devices (memory devices).

Figure 24A:
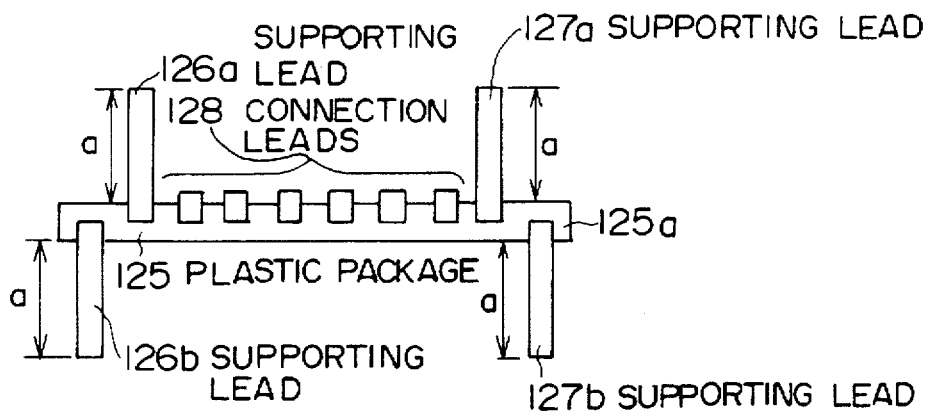
FIG. 24A shows a bottom view of a first semiconductor device constructing a thirteenth embodiment of a semiconductor-device unit according to the present invention.
Figure 24B:
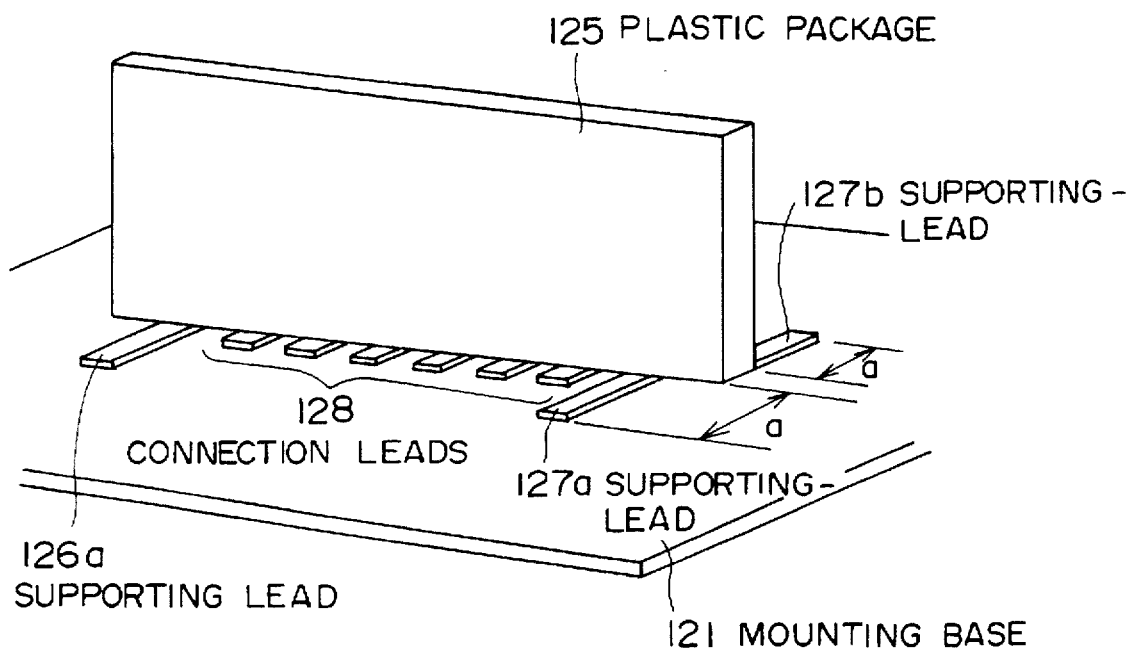
FIG. 24B shows a perspective view of the first semiconductor device constructing the thirteenth embodiment of the semiconductor-device unit according to the present invention.

A configuration of the semiconductor device 122 will be discussed by referring to FIGS. 24A and 24B. FIG. 24a shows a bottom-side view of a first semiconductor device 122, and FIG. 24B shows a perspective view thereof. This first semiconductor device 122 has the same configuration as that of the semiconductor device disclosed in the Japanese Patent Application No.4-52434 (U.S. Continuation application Ser. No. 881,899).

The first semiconductor device 122 stands by itself on the mounting base 121, and comprises a plastic package 125, supporting leads 126a, 126b, 127a and 127b, and connection leads 128, etc.

Within the plastic package 125, a semiconductor chip mounted on a stage (not shown) is sealed. And on a bottom face 125a of the plastic package 125, the supporting leads 126a, 126b, 127a and 127b and the connection leads 128 are formed to be placed upon the mounting base 121.

These supporting leads 126a, 126b, 127a and 127b are formed for supporting the plastic package 125 on the mounting base 121. For example, a portion of the stage mentioned above may be these supporting leads. The supporting leads 126a and 126b are extended in opposite directions of the plastic package 125, and also the supporting leads 127a and 127b are extended in the same way. Such a configuration of the supporting leads makes it easy for the plastic package 125 to stand by itself on the mounting base 121.

In this way, since the first semiconductor device 122 can stand on the mounting base 121 by itself, a surface mounting of the first semiconductor device 122 may be easily carried out, and also a reflow soldering may be easily performed.

In this semiconductor device 122, each of the supporting leads 126a, 126b, 127a and 127b needs to be extended outward of the plastic package 125 by a given length, to efficiently support the plastic package 125. In the example shown in FIG. 24A, each of the supporting leads 126a, 126b, 127a and 127b is extended outward from a side wall of the plastic package 125 by a length a (denoted with arrows in FIG. 24A).

The connection leads 128 are electrically connected with connection electrodes (not shown) formed on the mounting base 121. Inner-lead parts (not shown) of the connection leads 128 are sealed within the plastic package 125, and top-end parts of the inner-lead parts are electrically connected with the semiconductor chip.

Outer-lead parts of the connection leads 128 are exposed outside the plastic package 125. The outer-lead parts extend from the bottom surface 125a of the plastic package 125, and after that, are bent as directing to the connection electrodes formed on the mounting base (refer to FIG. 28C).

Figure 25:
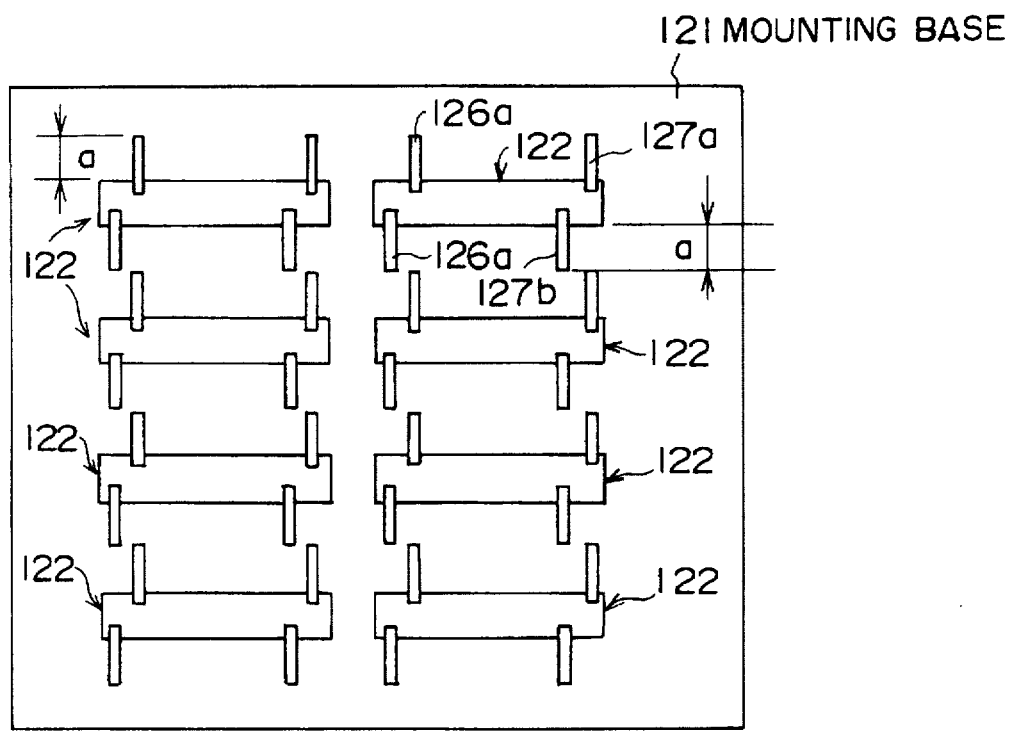
FIG. 25 shows an illustration for explaining a conventional method for mounting the first semiconductor device on a mounting base.

FIG. 25 shows a conventional mounting configuration using the first semiconductor devices 122 shown in FIG. 24A. In FIG. 25, the connection leads 128 are omitted for convenience.

As shown in FIG. 25, in the conventional mounting configuration, when a plurality of the first semiconductor devices 122 are mounted on the mounting base 121, the supporting leads 126a, 126b, 127a and 127b of each first semiconductor device 122 are arranged without interrupting with each other. Therefore, a given space formed by a length $(2 \times a)$ is needed for an interval space between the first semiconductor devices 122. However, this space formed by the length $(2 \times a)$ is used only for the supporting leads 126a, 126b, 127a and 127b, and this configuration makes the mounting efficiency of the semiconductor devices poor.

To solve this problem, a second semiconductor device 123 is used for the semiconductor-device unit 120. In the semiconductor-device unit 122, the second semiconductor device 123 is formed across the supporting leads 126a, 126b, 127a and 127b of the first semiconductor device 122.

Figure 26:
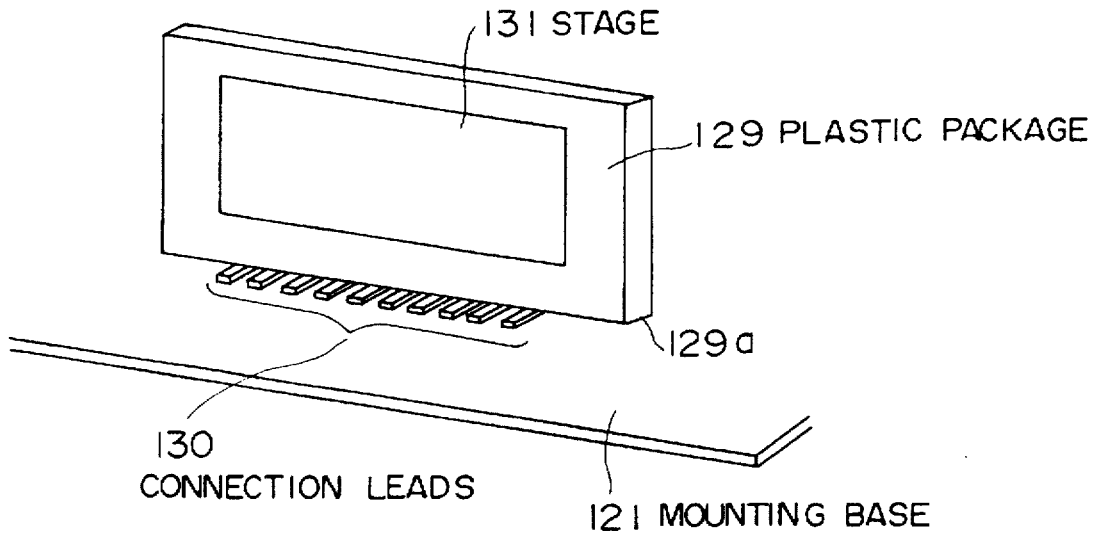
FIG. 26 shows a perspective view of a second semiconductor device constructing the thirteenth embodiment of the semiconductor-device unit according to the present invention.

FIG. 26 shows a perspective view of the second semiconductor device 123 for the semiconductor-device unit 120. The second semiconductor device 123 stands by itself on the mounting base 121 in the same way as the first semiconductor device 122. And the second semiconductor device 123 comprises a plastic package 129, and connection leads 130, etc. However, the second semiconductor device 123 does not include supporting leads, while these are installed in the first semiconductor device 122. This is a difference between the first semiconductor device 122 and the second semiconductor device 123.

In the second semiconductor device 123, within the plastic package 129, a semiconductor chip (not shown) mounted on a stage 131 is sealed. But, a portion of the stage 131 is exposed outside the plastic package 129. Thus, since a portion of the plastic package 129 does not cover the stage 131, the plastic package 129 is thinned. And further, the heat-radiation efficiency of the semiconductor chip which is mounted on a back of the stage 131 may be improved, so that a cooling efficiency of the semiconductor chip may be increased.

A configuration of the connection leads 130 in the second semiconductor device 123 is almost the same as that of the connection leads 128 in the first semiconductor device 122, and the connection leads 130 are electrically connected with connection electrodes formed on the mounting base 121. An outer-lead part (in FIG. 26, only the outer-lead part is shown) of each of the connection leads 130 is extended from a bottom surface 129a of the plastic package 129, and is bent to direct its surface toward a respective one of connection electrodes formed on the mounting base 121.

A length of the outer-lead part of each of the connection leads 130 is adjusted so that the connection leads 130 could be suitably coupled with the connection leads 128 of the first semiconductor device 122 when the second semiconductor device 123 is installed close to the first semiconductor device 122.

Figure 28A:
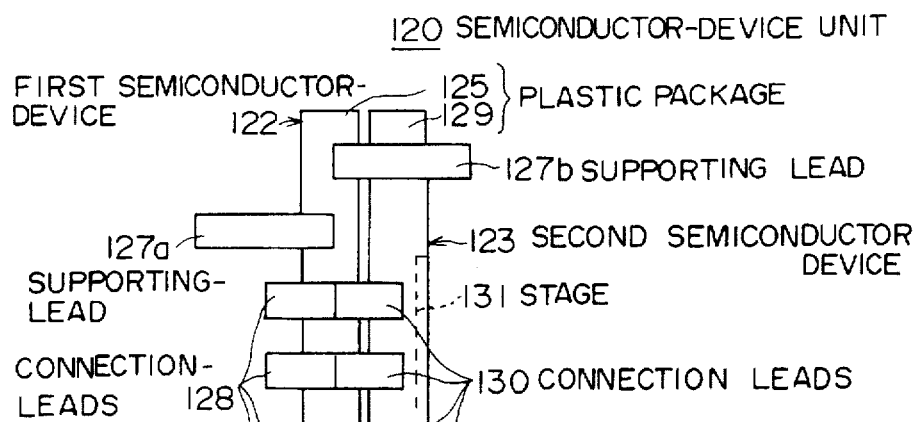
FIGS. 28A to 28C show, respectively, a bottom view, a perspective view, and an extended illustration of the connection leads of the thirteenth embodiment of the semiconductor-device unit according to the present invention.
Figure 28C:
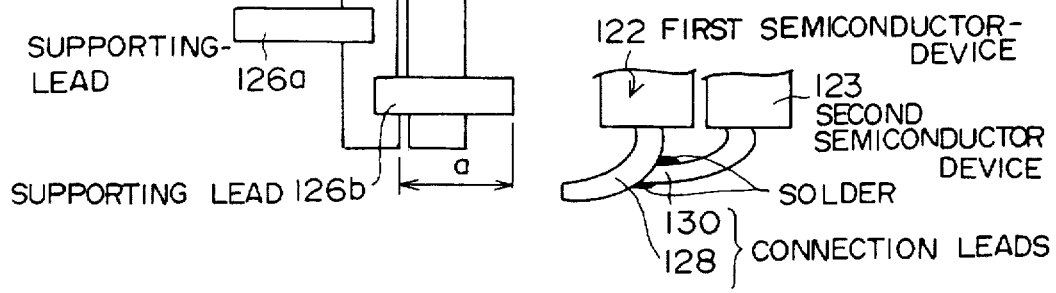
Figure 28B:
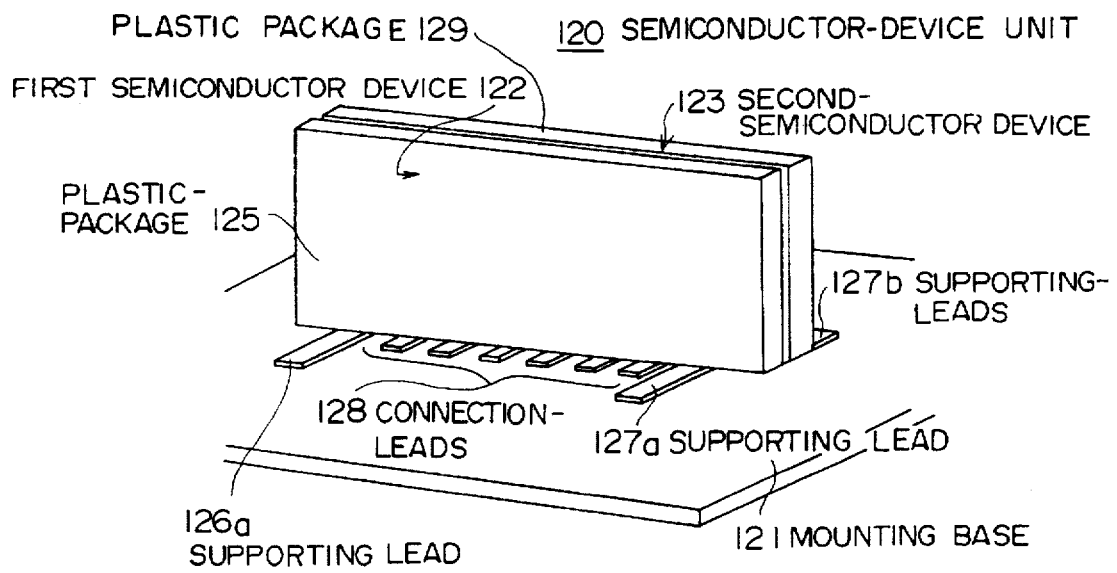

FIGS. 28A to 28C show configurations of the thirteenth embodiment of the semiconductor-device unit 120 according to the present invention. FIG. 28A shows a bottom view of the semiconductor-device unit 120. FIG. 28B shows a perspective view thereof, and FIG. 28C shows an extended illustration of the connection leads 128, 130.

As shown in FIGS. 28A and 28B, in the semiconductor-device unit 120, the second semiconductor device 123 is arranged across the supporting leads 126a and 127b of the first semiconductor device 122. In this arrangement, the first semiconductor device 122 can be formed in parallel close to the second semiconductor device 123. Therefore, the second semiconductor device can be arranged in the space where only the supporting leads 126a, 126b, 127a and 127b of the first semiconductor device 122 are formed in the conventional unit shown in FIG. 25. Thus, the above configuration improves the mounting efficiency of the semiconductor device.

Further, when the second semiconductor device 123 stands in parallel close to the first semiconductor device 122, the exposed stage 131 on the plastic package 129 in the second semiconductor device 123 is directed toward an outer side of the semiconductor-device unit 120 to improve its heat-radiation efficiency.

FIG. 28C shows a fixing structure of the second semiconductor device 123. As mentioned before, the second semiconductor device 123 has no supporting leads unlike the first semiconductor device 122. Therefore, the second semiconductor device 123 is fixed by soldering the connection lead 130, which is extended from the bottom face 129a of the plastic package 129, to the connection lead 128 of the first semiconductor device 122.

In this way, by coupling the connection lead 130 of the second semiconductor device 123 to the connection lead 128 of the first semiconductor device 122 with the soldering, electrical and mechanical connections between the first semiconductor device 122 and the second semiconductor device 123 may be simultaneously performed. Therefore, the connection leads 128, 130 function to provide both an electrical connection and a mechanical connection when connecting the first semiconductor device 122 with the second semiconductor device 123. Thus, these leads may simplify a configuration of the semiconductor-device unit compared to a configuration that has a separate component for each function of the electrical connection and the mechanical connection.

And when each semiconductor device 122, 123 is used for the memory device, a memory capacity of the semiconductor-device unit 120 is determined by summing the memory capacity of the first semiconductor device 122 with that of the second semiconductor device 123, wherein connection leads 128 are connected to respective connection leads 130.

Next, a description will be given of a fourteenth embodiment of the semiconductor-device unit 140 according to the present invention, by referring to FIGS. 29A, 29B and 29C. Like elements to those of FIGS. 28A to 28C carry the same reference numerals.

In the semiconductor-device unit 120, the second semiconductor device 123 is installed at one side of the first semiconductor device 122, while, the semiconductor-device unit 140 comprises the first semiconductor device 122, and two second semiconductor devices 123 (hereinafter denoted as 123a and 123b), which sandwich the first semiconductor device 122. And these semiconductor devices 122, 123a and 123b may be operative as the storage devices (memory devices).

The second semiconductor device 123a has the same configuration as that of the second semiconductor device 123 assembled in the semiconductor-device unit 120 according to the thirteenth embodiment. The second semiconductor device 123b has almost the same configuration as that of the second semiconductor device 123a, except for an extending direction of connection leads 130b and direction of an exposed face of the stage 131 in the plastic package 129 being reverse that of the second semiconductor device 123a.

In the semiconductor-device unit 140, the second semiconductor device 123b is arranged across the supporting leads 126a, 127a of the first semiconductor device 122. And as shown in FIG. 29C, the connection leads 130a, 130b of the second semiconductor devices 123a, 123b are connected with the connection leads 128 of the first semiconductor device 122 by soldering.

According to the semiconductor-device unit 140, the second semiconductor devices 123a, 123b are arranged along both sides of the first semiconductor device 122, therefore, the mounting efficiency in the unit 140 may be further improved compared to the semiconductor-device unit 120 shown in FIG. 28B.

Next, a description will be given of a fifteenth embodiment of the semiconductor-device units 150, 155 according to the present invention, by referring to FIGS. 30 and 31. Like elements to those of FIGS. 28A to 28C carry the same reference numerals.

Figure 27:
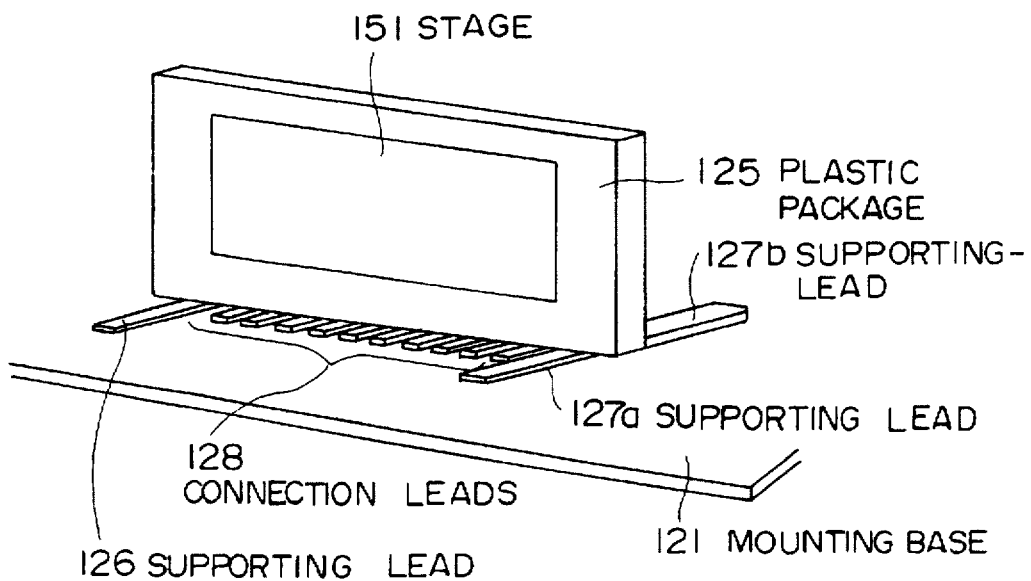
FIG. 27 shows a perspective view of a third semiconductor device constructing a fifteenth embodiment of a semiconductor-device unit according to the present invention.

The semiconductor-device unit 150 comprises a third semiconductor device 124, shown in FIG. 27, which has almost the same configuration as that of the first semiconductor device 122, except for a stage 151 being exposed outside the plastic package 125. The semiconductor chip (not shown) is formed on a back of the stage 151 and is sealed within the plastic package 125. In this way, by the stage 151 being exposed outside the plastic package 125, a cooling efficiency of the third semiconductor device 124 may be improved, so that a cooling efficiency of an overall semiconductor-device unit 150 may be also improved.

Figure 30:
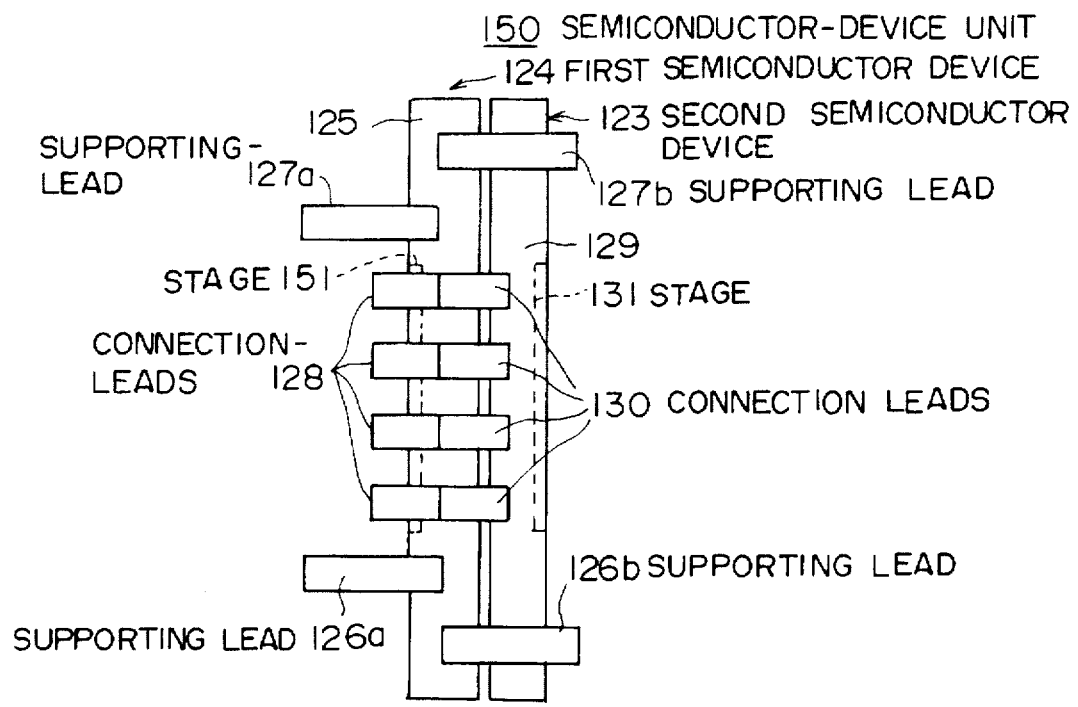
FIG. 30 shows a bottom view of a fifteenth embodiment of a semiconductor-device unit according to the present invention.
Figure 31:
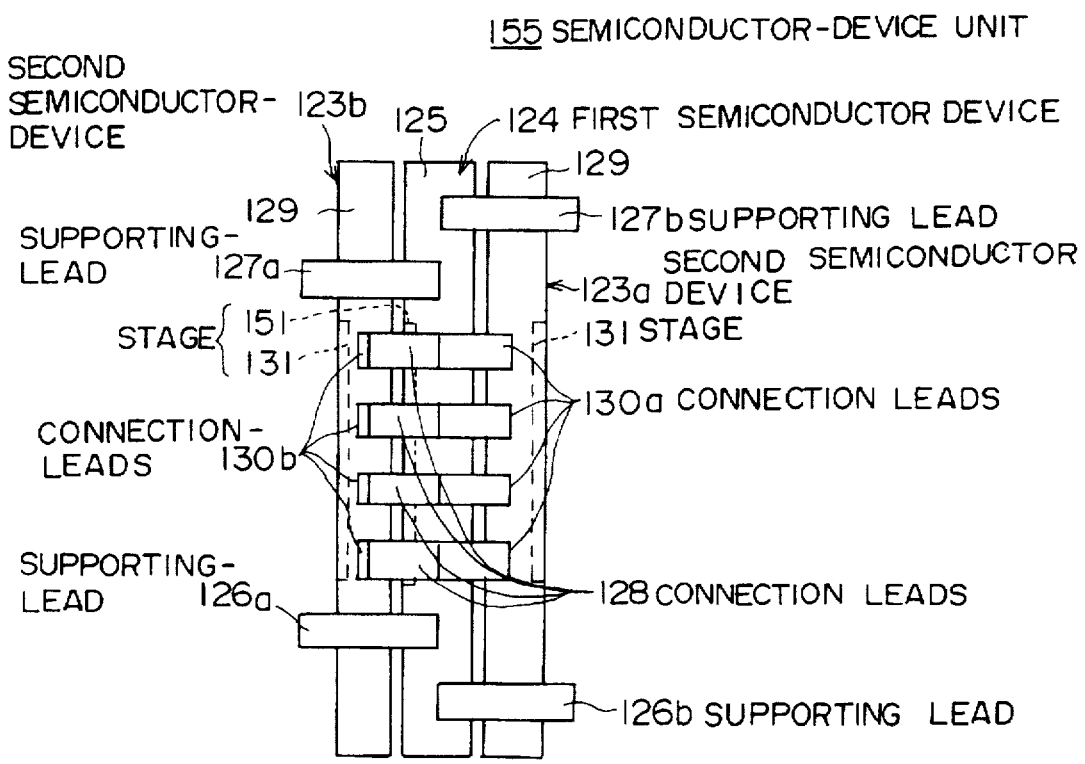
FIG. 31 shows a bottom view of another fifteenth embodiment of the semiconductor-device unit according to the present invention.

In the semiconductor device 150 shown in FIG. 30, the second semiconductor device 123 is arranged along one side of the third semiconductor device 124. On the other hand, in the semiconductor device 155 shown in FIG. 31, a pair of the second semiconductor devices 123a, 123b are arranged along both sides of the third semiconductor device 124 so as to sandwich the device 124. Therefore, these semiconductor-device units 150, 155 may further improve the mounting efficiency and the cooling efficiency compared to the semiconductor-device unit 120 shown in FIG. 28B.

Figure 32:
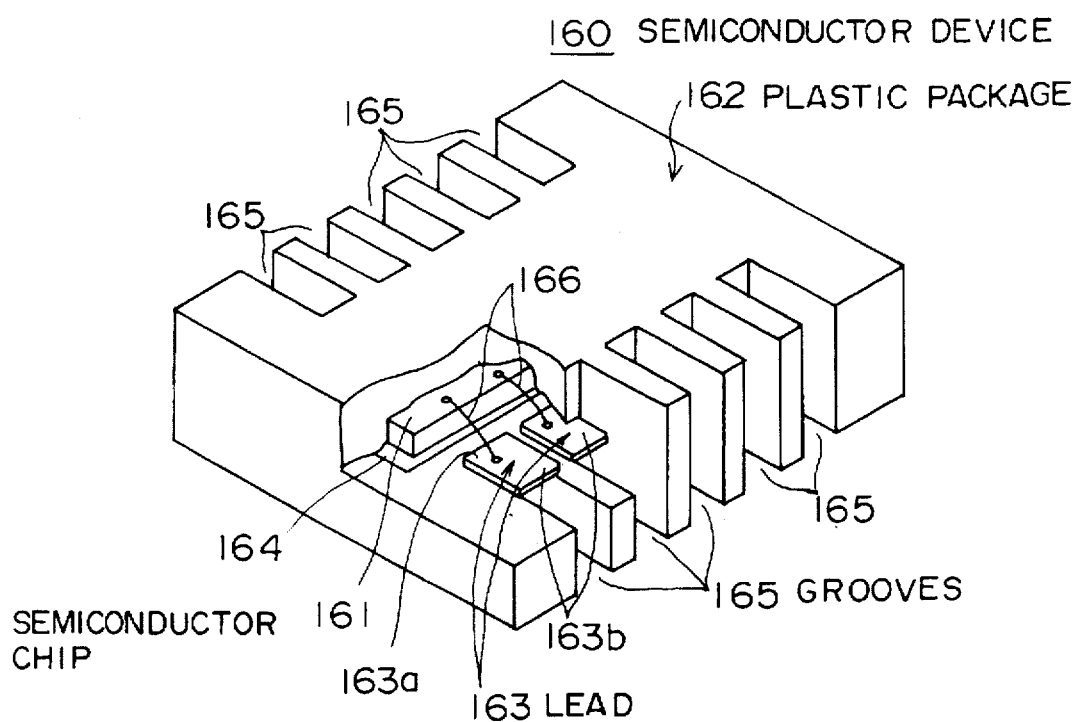
FIG. 32 shows a perspective view of a fifth embodiment of a semiconductor device according to the present invention.

Next, a description will be given of a fifth embodiment of the semiconductor device 160 according to the present invention, by referring to FIG. 32. FIG. 32 shows a perspective view of the fifth embodiment of the semiconductor device 160 according to the present invention. The semiconductor device 160 mainly comprises a semiconductor chip 161, a plastic package 162, leads 163, etc. The semiconductor chip 161 is mounted on a stage 164, and both the semiconductor chip 161 and the stage 164 are sealed with in the plastic package 162.

As shown in FIG. 32, along both sides of the plastic package 162, grooves 165 are formed, a number of the grooves corresponding to a number of the leads 163. Each groove 165 penetrates from a bottom of the plastic package 162 to a top thereof in the vertical direction, but a portion of each of the leads 163 is exposed on each respective groove 165.

This lead 163 does not extend outward from the plastic package 162 unlike the lead 24 of the semiconductor device 20 shown in FIG. 4 and the lead 85 of the semiconductor devices 81a, 81b shown in FIG. 15. An inner part of the lead 163, namely an inner-lead part 163a, is sealed within the plastic package 162, and is electrically connected with the semiconductor chip 161 with a wire 166. An outer part of the lead 163, namely an outer-lead part 163b, is not sealed within the plastic package 162, and is exposed on the groove 165 formed in the side of the plastic package 162. The outer-lead part 163b is included within exterior dimensions of the plastic package 162, but can be electrically connected with an external element.

As mentioned above, the outer-lead part 163b of the lead 163 is located inside the groove 165 formed in the plastic package 162 and is not exposed from the exterior dimensions of the plastic package 162. Therefore, all of the leads 163 are supported by the plastic package 162. Thus, even if an external stress is applied to the semiconductor device 160, this construction may surely prevent the lead 163 from being bent or being destroyed.

Further, since there is no portion of the lead 163 which is extended from faces of the plastic package 162, the semiconductor device 160 may be miniaturized by that portion of the lead 163, so that the mounting efficiency of the semiconductor device 160 may be improved.

For a material of the lead 163 and the stage 164, metal (Fe) alloy such as 42 alloy or copper (Cu) is available, and for a material of the wire 166, gold (Au), aluminum (Al), or copper (Cu) is available. And for electrically connecting the leads 163 to the semiconductor chip 161, bumps or TABs, etc., are also usable in addition to the wire 166 in the above embodiment.

Figure 33:
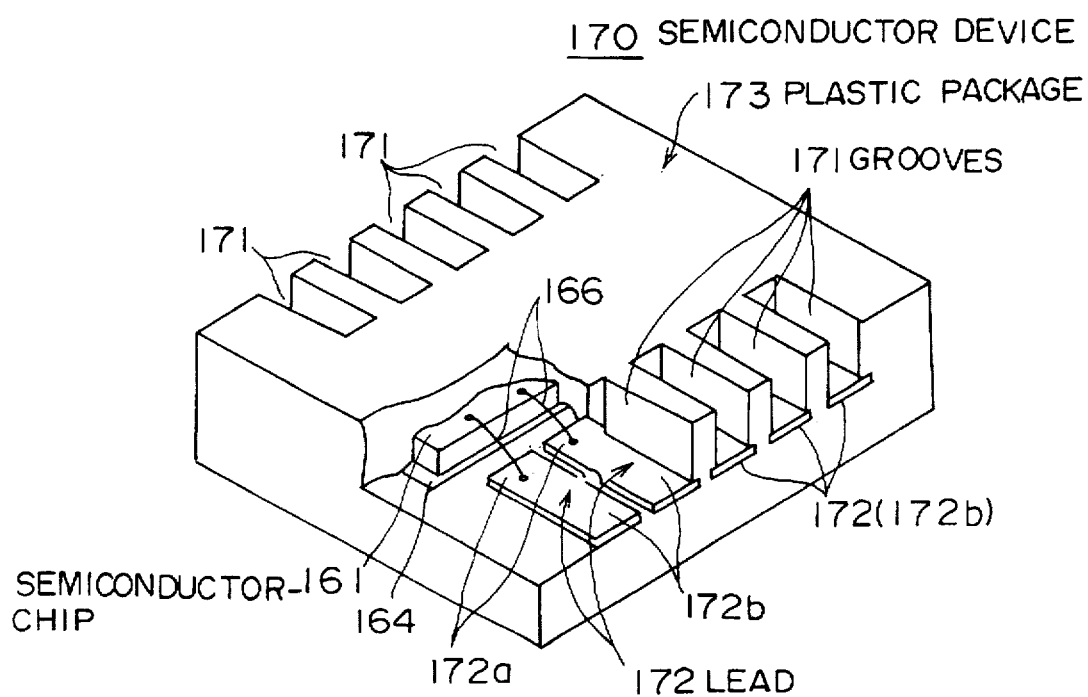
FIG. 33 shows a modification of the fifth embodiment of the semiconductor device according to the present invention.

FIG. 33 shows a perspective view of another example of the fifth embodiment of the semiconductor device 170 which is a modified one of the semiconductor device 160. Like elements to those of the semiconductor device 160 shown in FIG. 32 carry the same reference numerals.

The semiconductor device 170 mainly comprises the semiconductor chip 161, a plastic package 173, leads 172, etc. The semiconductor chip 161 is mounted on a stage 164, both being sealed within the plastic package 173 like the semiconductor device 160.

As shown in FIG. 33, along both sides of the plastic package 173, grooves 171 which respectively have bottom faces are formed. Thus each groove 171 does not penetrate from a bottom of the plastic package 173 to a top thereof in the vertical direction, and a lead 172 is arranged on the bottom face.

An inner part of the lead 172, namely an inner-lead part 172a, is sealed within the plastic package 173, and is electrically connected with the semiconductor chip 161 with the wire 166. An outer part of the lead 172, namely an outer-lead part 172b, is not sealed within the plastic package 173, and is exposed on the bottom face of the groove 171. Therefore, the outer-lead part 172b is electrically connectable with the external element. And the outer-lead part 172b extends to a side wall of the plastic package 173 so as to make an almost flat face with that side wall.

As mentioned above, also in the semiconductor device 170, the outer-lead part 172b of the lead 172 is located inside the groove 171 formed in the plastic package 173 and is not exposed from the exterior dimensions of the plastic package 173, therefore, all of the leads 172 are supported by the plastic package 173. Thus, even if an external stress is applied to the semiconductor device 170, this construction may surely prevent the lead 172 from being bent or being destroyed.

Further, since there is no portion of the lead 172 which is extended from faces of the plastic package 173, the semiconductor device 170 may be miniaturized by that portion of the lead 172, so that the mounting efficiency of the semiconductor device 170 may be improved.

Next, a description will be given of a sixteenth embodiment of a semiconductor-device unit 180 according to the present invention, by referring to FIG. 34. In the semiconductor-device unit 180, two semiconductor devices 160 and one semiconductor device 170 are piled up by using a lead element 190 shown in FIG. 35. The two semiconductor devices 160 are used for a top layer and a medium layer, and the semiconductor device 170 is used for a bottom layer.

Figure 35:
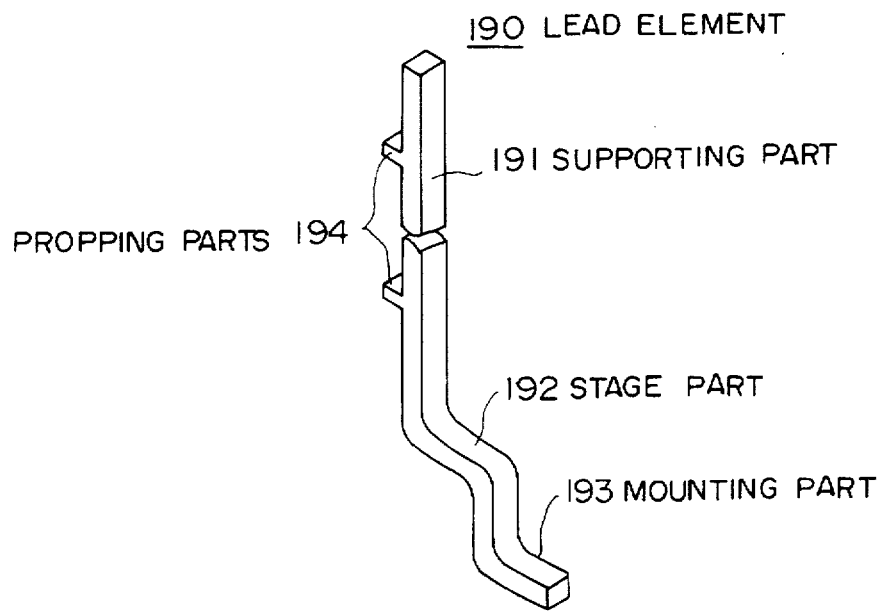
FIG. 35 shows a perspective view of a lead element used in the sixteenth embodiment of the semiconductor-device unit according to the present invention.

The lead element 190 is made from a conductive lead material such as 43 alloy. As shown in FIG. 35, the lead element 190 comprises a supporting part 191 which is straightly extended in the vertical direction, a stage part 192 which is formed by bending the lead element 190 at a right angle under the supporting part 191, and a mounting part 193 which is formed to have the gull-wing shape in a lower part of the stage part 192.

This lead element 190 is coupled with each groove 165 formed in the semiconductor device 160, and further is electrically connected with the lead 163 arranged inside the groove 165. At given points in the supporting part 191, there are formed propping parts 194, which prop the leads 163 (outer-lead parts 163b) of the semiconductor devices 160. And soldering is applied to a contact area where the outer-lead part 163b is disposed on the propping part 194 (the solder is shown as a dark mark in FIG. 34). Thus, the semiconductor device 160 is propped up by the lead element 190.

The stage part 192 of the lead element 190 is coupled with the grove 171 formed in the semiconductor device 170 to be electrically connected to the lead 172 arranged on the bottom face of the groove 171. And soldering is applied to a contact area between the stage part 192 and the lead 172 (the solder is shown as the dark mark). Thus, also the semiconductor device 170 is propped to the lead element 190.

And since the mounting part 193 of the lead element 190 is formed in the form of the gull-wing shape, the mounting part 193 is extended under the semiconductor device 170, and is soldered to a mounting base 185. In this way, by forming the mounting part 193 in the lower part of the lead element 190, the semiconductor-device unit 180 can be easily mounted on the mounting base 185.

In the semiconductor-device unit 180, when an interval between the propping parts 194 is set wider, each of spaces between the semiconductor devices 160, 170 also becomes larger Such a configuration may improves a heat-radiation of the semiconductor-device unit 180 compared to a configuration in which the semiconductor devices 160, 170 are piled in close contact face to face with each other.

Further, in the semiconductor-device unit 180, the supporting part 191 of the lead element 190 is included inside the grooves 165 of the two semiconductor devices 160, and no portion of the supporting part 191 is extended from a side wall of the semiconductor device 160. Therefore, a portion of the lead element 190, which is exposed from exterior dimensions of the plastic packages 162 and 173 of the semiconductor devices 160 and 170, may be reduced. Thus, the above makes it possible to support the lead element 190.

Figure 36:
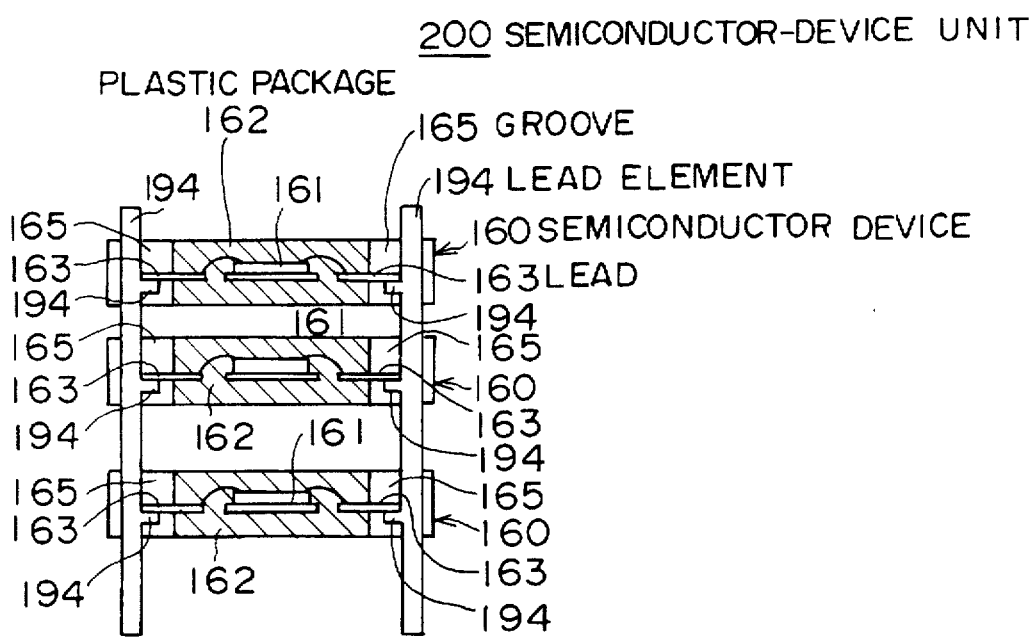
FIG. 36 shows a cross-sectional view of a seventeenth embodiment of a semiconductor-device unit according to the present invention.

Next, a description will be given of a seventeenth embodiment of the semiconductor-device unit according to the present invention. by referring to FIG. 36. FIG. 36 shows a cross-sectional view of the seventeenth embodiment of the semiconductor-device unit 200 according to the present invention. Like elements to those of FIG. 34 carry the same reference numerals.

Figure 34:
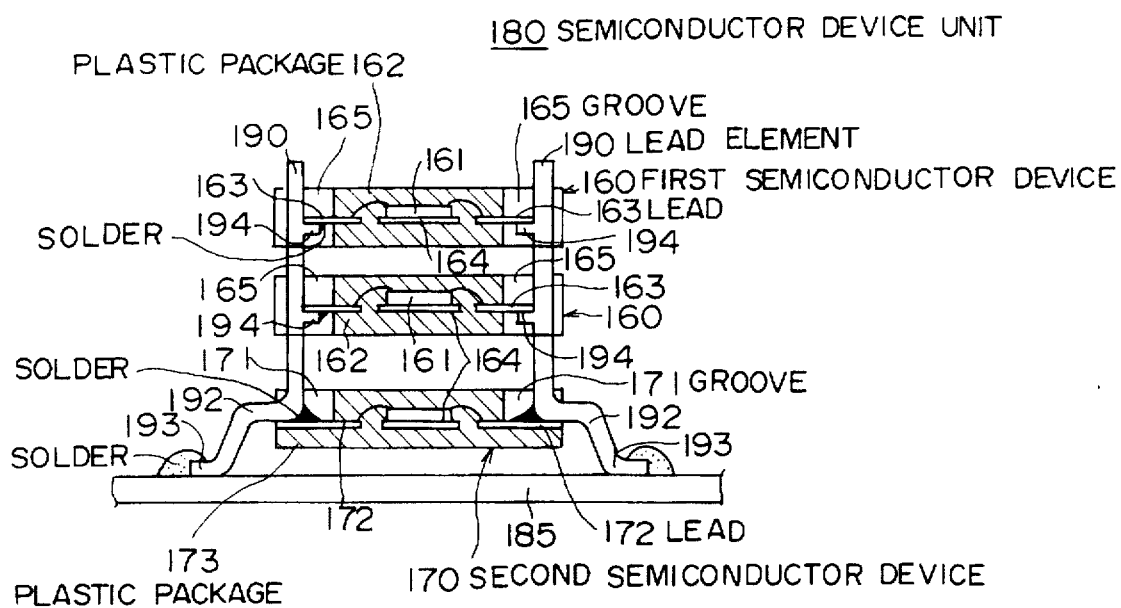
FIG. 34 shows a cross-sectional view of a sixteenth embodiment of a semiconductor-device unit according to the present invention.

In the semiconductor-device unit 200, only a plurality of the semiconductor devices 160 are piled, while in the semiconductor-device unit 180 shown in FIG. 34, the two semiconductor devices 160 are piled on the semiconductor device 170. And a lead element 195 shown in FIG. 37 is used instead of the lead element 190 for piling up these semiconductor devices 160.

As mentioned above, the lead element 195 props only the semiconductor devices 160. Therefore, the lead element 195 needs no stage part 192 like the lead element 190 used in the semiconductor-device unit 180. This is a reason why no semiconductor device 170 is used in the semiconductor-device unit 200.

Figure 37:
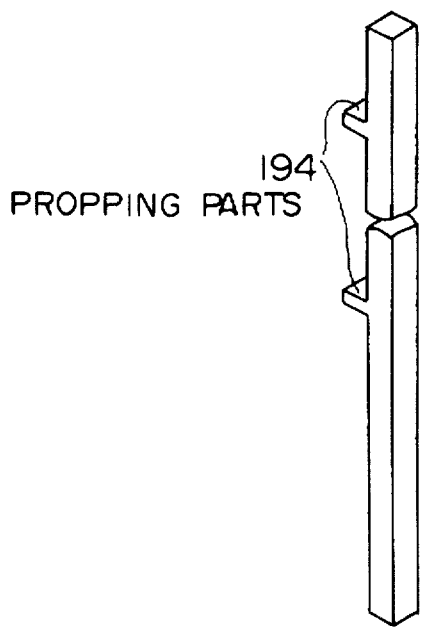
FIG. 37 shows a perspective view of a lead element used in the seventeenth embodiment of the semiconductor-device unit according to the present invention.

Therefore, for the lead element used in the semiconductor-device unit 200, the straight lead element 195 which has no stage part is available as shown in FIG. 37. When the straight lead element 195 is used for piling the semiconductor devices 160, all of the lead elements 195 may be included inside the grooves 165 of the semiconductor devices 160 without being extended from the outer side wall of the semiconductor devices 160. In other words, all of the lead elements 195 may be included inside the plastic package 162 in the horizontal direction.

Though a portion of the lead element 190, namely the stage part 192 and the mounting base, is extended from the exterior dimensions of the plastic package 173 in the semiconductor-device unit 180, the extended portion may be avoided by being included inside the plastic package 162 in the semiconductor-device unit 200. Therefore, the semiconductor-device unit 200 may be miniaturized compared to the semiconductor-device unit 180. And it should be noted that the semiconductor-device unit 200 may improve the heat-radiation efficiency and may surely support the lead element 195 from being bent or being destroyed, like the semiconductor-device unit 180 mentioned above.

In the meantime, in a configuration in which the semiconductor devices 160, 170 are piled up like the semiconductor-device units 180, 200, it is important to decide how to route between chip-selection ports for selecting the semiconductor chip 161.

Figure 38:
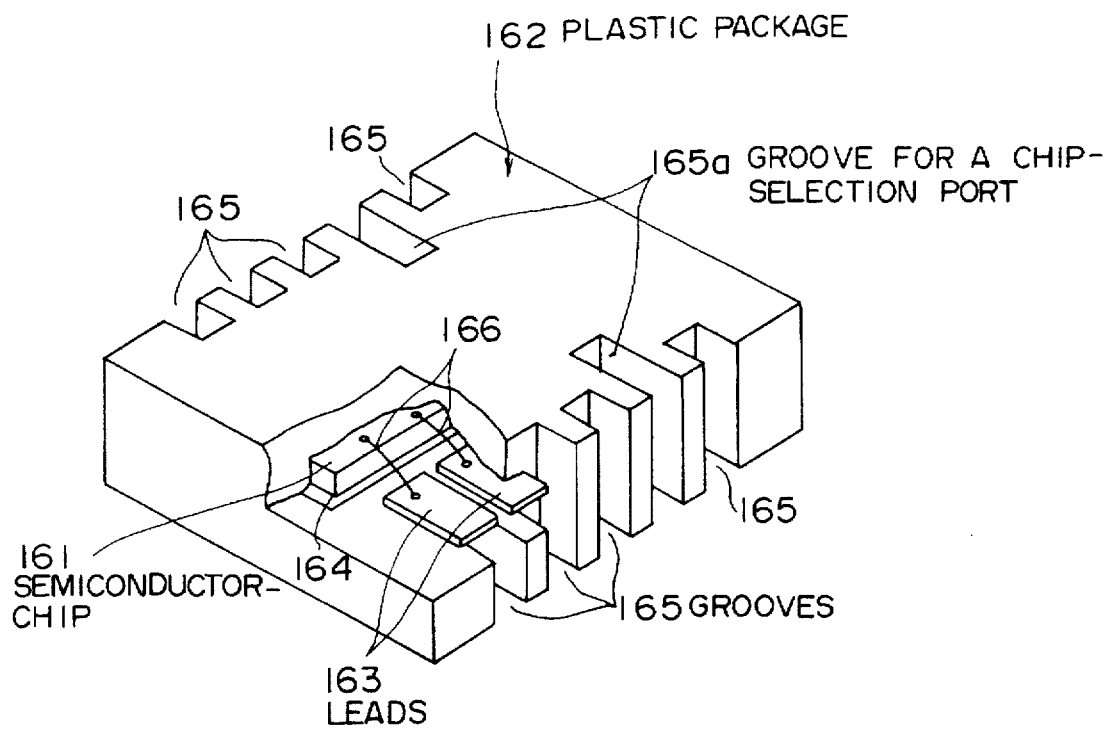
FIG. 38 shows a perspective view of a semiconductor device whose grooves have different depths according to the present invention.

FIG. 38 shows a perspective view of a semiconductor device suitable for routing a chip-selection line. The semiconductor device is a modified one of the semiconductor devices 160, 170. In this semiconductor device, a depth of each groove 165 or 171 is changed. In an example shown in FIG. 38, a groove for a chip-selection port 165a is formed deeper than other grooves 165.

Figure 39:
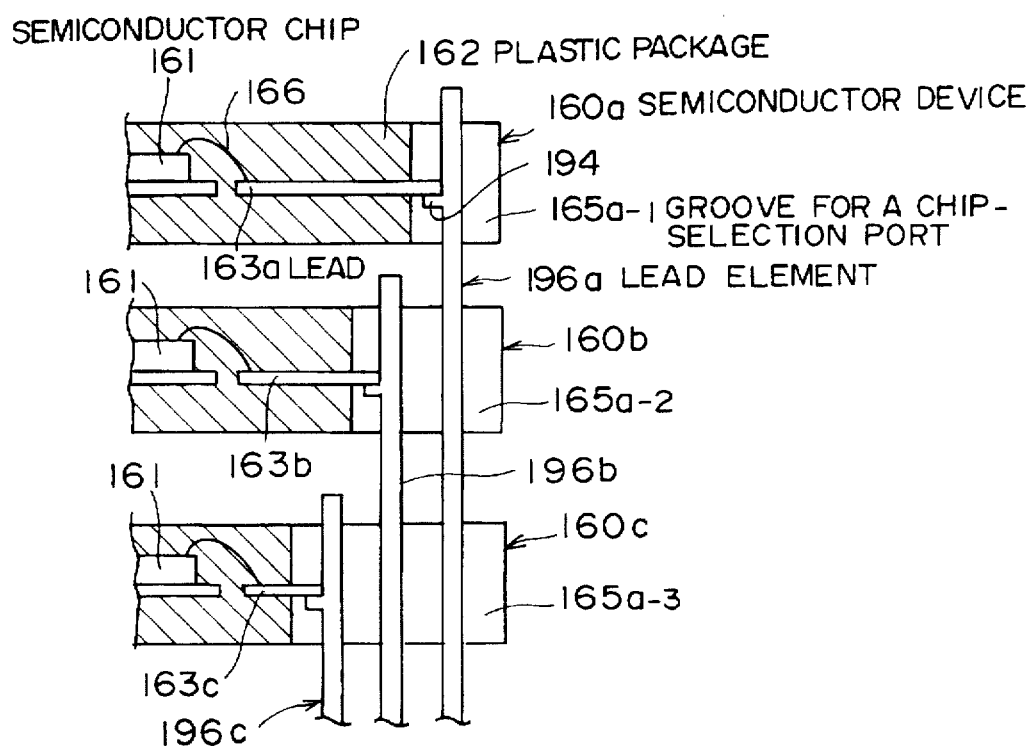
FIG. 39 shows a cross-sectional view of a semiconductor-device unit according to the present invention which has semiconductor devices piled thereon, the devices having grooves for chip-selection ports.

FIG. 39 shows a cross-sectional view of a semiconductor-device unit in which semiconductor devices having respective grooves for the chip-selection port 165a are piled up. In this figure, three semiconductor devices 160a, 160b, and 160c are piled.

As shown in FIG. 39, the depth of the groove for the chip-selection port 165a is different between the semiconductor devices 160a, 160b and 160c. A shallowest depth is in a groove for a chip-selection port 165a-1 in the highest-side semiconductor device 160a, and in a lower direction the depth of the groove becomes increasing deeper for chip-selection ports 165a-2, 165a-3, in that order. In this configuration, lead elements 196a, 196b and 196c are used for routing between the chip-selection ports. Each lead element 196a, 196b and 196c is suitably located such that their propping parts 194 can be respectively coupled to leads 163a, 163b, or 163c formed inside the grooves for the chip-selection ports 165a-1, 165a-2 and 165a-3. Such configuration makes it possible to supply a chip-selection signal individually to each of semiconductor devices 160a, 160b, and 160c.

Figure 40:
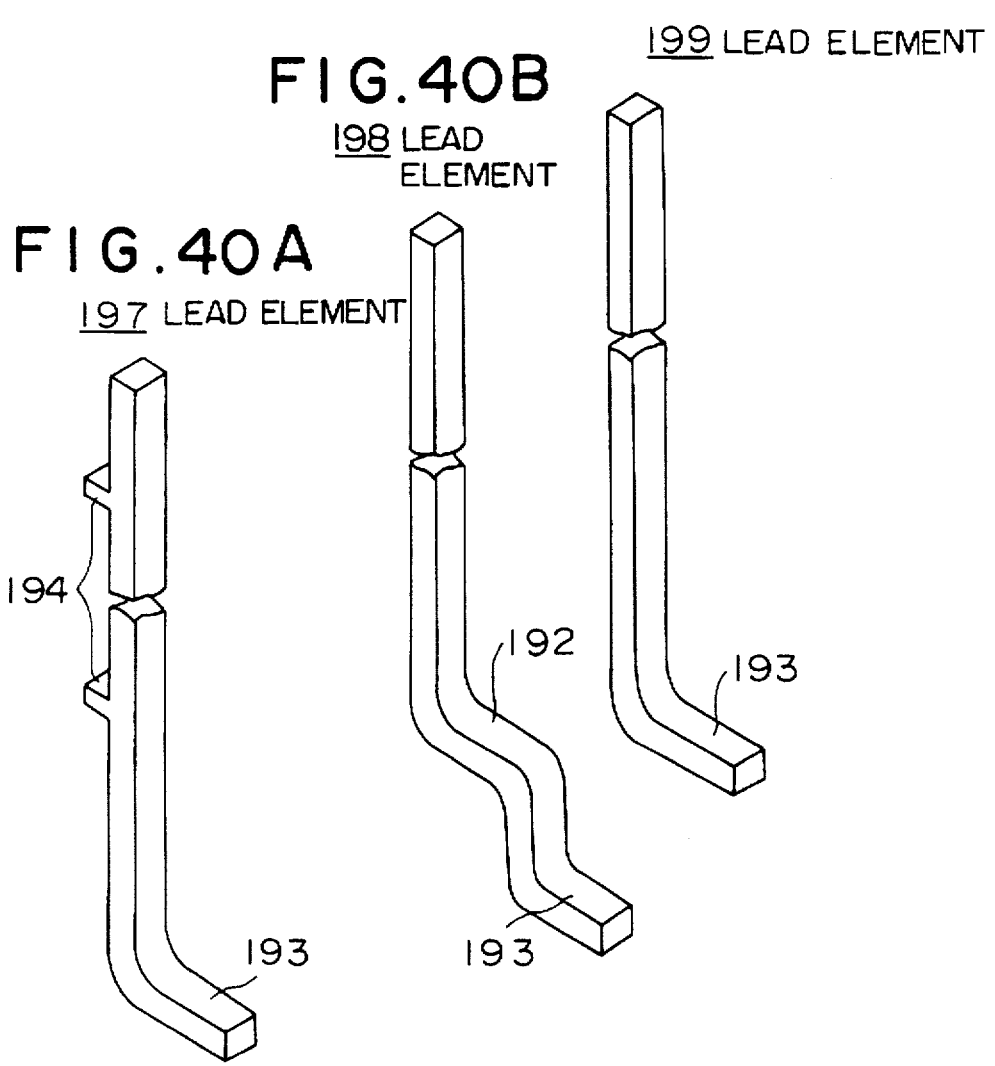
FIGS. 40A to 40C show modification examples of the lead element.

In the semiconductor devices 180, 200 mentioned above, for the lead element, the lead elements 190, 195 shown in FIGS. 35, 37 are described. However, a configuration of the lead element is not limited to those shown in FIGS. 35 and 37, and various variations and modifications are available. For example, the lead element may be one whose mounting part is bent in a form of an "L" shape as shown in FIG. 40A, and also as shown in FIGS. 40B and 40C, lead elements having no propping part are available.

Figure 41:
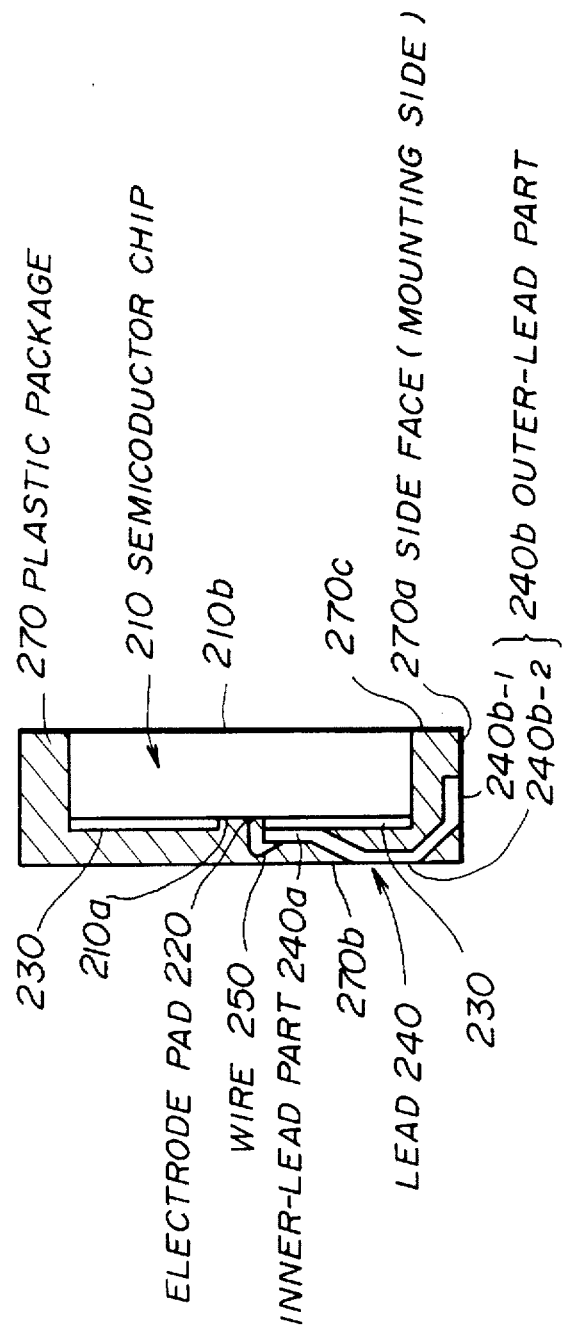
FIG. 41 shows a cross-sectional view of a sixth embodiment of the semiconductor device according to the present invention.
Figure 42:
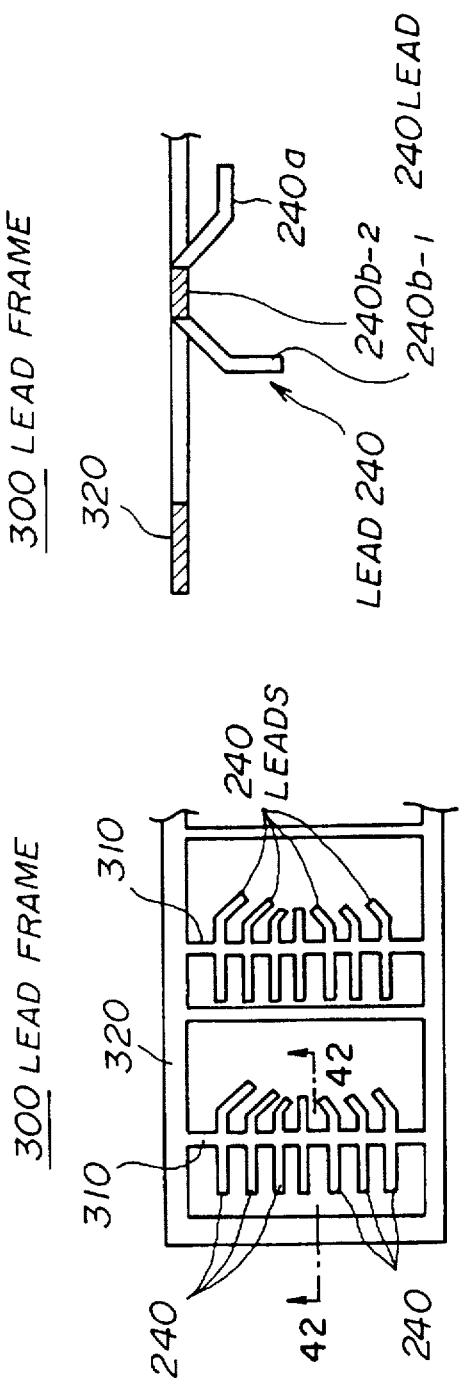

Next, a description will be given of a sixth embodiment of the semiconductor device according to the present invention. FIG. 41 shows a cross-sectional view of the sixth embodiment of the semiconductor device according to the present invention. A semiconductor device 205 has a semiconductor chip 210, for example, a semiconductor element of a memory chip. On a central part of the semiconductor chip 210, a plurality of electrode pads are straightly arranged (since FIG. 41 shows the cross-sectional view in a side direction, only one electrode pad 220 is illustrated). And, on a side of the semiconductor chip 210 (the side is referred to as a surface 210a, hereinafter) where the electrode pads are arranged, a cover film 230 is also formed. The cover film 230 is a plastic tape having an insulating function, and adheres to the surface 210a.

The semiconductor device 205 includes a plurality of leads 240 (in the same was as the electrode pad 220, only one lead 240 is illustrated). An inner lead part 240a which is formed on an inner side of each lead 240 extends over the semiconductor chip 210, and is connected to the electrode pad 220 formed on the semiconductor chip 210 through a wire 250. In this way, the semiconductor device 205 forms a lead-on-chip (LOC) structure. By applying the LOC structure to the device, the semiconductor device 205 may be miniaturized. The electrical connection between the inner lead part 240a and the electrode pad 220 is not limited to the above manner using the wire 250, but a flip chip connection using bumps may also be applied for the above electrical connection.

Further, in the lead 240, an outer lead part 240b is formed to be connected to the inner lead part 240a in series. The outer lead part 240b consists of a first-port part 240b-1 and a second-port part 240b-2. The lead 240 is fixed to the semiconductor chip 210 by the inner lead part 240a being adhered onto the cover film 230.

A plastic package 270 shown as a hatched element is made of a epoxy resin, etc., and seals the semiconductor chip 210, the leads 240, and the wires 250 to protect them. The plastic package 270 has an approximately rectangular solid shape, and has almost the same dimensions as that of the semiconductor chip 210. In this way, the semiconductor device 205 has a chip-size package (CSP) structure, and, thereby, the semiconductor device 205 may be further miniaturized.

The outer lead part 240b of the lead 240 is extended along the inside of surfaces of the plastic package 270. In further detail, the plastic package 270 has six outside faces, the face opposite to the surface 210a of the semiconductor chip 210 being referred to as a surface 270b, and the face opposite to a side face of the semiconductor chip 210 being referred to as a side face 270a. The second-port part 240b-2 of the outer lead part 240b is extended along the inside of the surface 270b of the plastic package 270, and the first-port part 240b-1 of the outer lead part 240b is extended along the inside of the side face 270a of the plastic package 270.

In the side face 270a, the first-port part 240b-1 is exposed to the outside of the plastic package 270, and in the surface 270b, the second-port part 240b-2 is exposed to the outside of the plastic package 270. Therefore, the first-port part 240b-1 and the second-port part 240b-2 are available as externally connecting ports.

The inner lead part 240a and the outer lead part 240b in the lead 240 can be formed by properly bending the lead 240. Therefore, the lead 240 having such a construction may be easily formed. Since the lead 240 except the first-port part 240b-1 and the second-port part 240b-2 is sealed within the plastic package 270, the lead 240 is surely protected and a lead pitch between the neighboring leads 240 may be maintained at a constant pitch. Therefore, no short circuit between the neighboring leads 240 occurs, and, thus, a reliability of the semiconductor device 205 may be improved.

In the semiconductor device 205 shown in FIG. 41, a back surface 210b of the semiconductor chip 210 is exposed from a back surface 270c of the plastic package 270. Therefore, heat generated in the semiconductor chip 210 may be efficiently radiated externally, and the plastic package 270 may be small in size. Accordingly, an efficiency of heat radiation of the semiconductor device 205 may be improved, and the semiconductor device 205 may be further miniaturized.

As mentioned above, in the semiconductor device 205, the first-port part 240b-1 of the outer lead part 240 available as the externally connecting port is extended to be exposed to the outside of the side face 270a of the plastic package 270. Therefore, the side face 270a in which the first-port part 240b-1 is formed is available as a connecting face for mounting the plastic package 270 on a mounting base (not shown). As a result, the plastic package 27 may be mounted in a standing form, which is referred to as a standing-form mount, hereinafter. By using the standing-form mount, a mounting space on the mounting base necessary for mounting the semiconductor device 205 may be reduced, and, thus, the high-density mounting may be realized.

Next, a description will be given of a manufacturing process of the sixth embodiment of the semiconductor device 205 shown in FIG. 41, by referring to FIG. 42A to FIG. 46. FIG. 42A to FIG. 46 show the manufacturing processes of the sixth embodiment of the semiconductor device 205 according to the present invention shown in FIG. 41. Elements in FIG. 42A to FIG. 46 which are the same as those of FIG. 41 are given the same reference numerals.

For manufacturing the semiconductor device 205, a lead frame 300 is formed first. For forming the lead frame 300, a base plate made of a lead frame material such as a 42 alloy and an alloy of copper is prepared and is, for example, pressed and stamped out (other processing methods such as etching are available). In this way, the lead frame 300 comprising the leads 240, timbers 310, and a cradle 320 is provided.

FIG. 42B shows a cross-sectional view of the lead frame 300 along a 42-42 line shown in FIG. 42A. As shown in FIG. 42B, when the base plate is pressed and stamped out to provide the lead frame 300, a shaping process (bending process) of the leads 240 are simultaneously carried out. In this way, at the same time, the lead frame 300 is provided by the pressing and stamping out processes, and the inner lead part 240a, and the first- and second-port parts 240b-1, 240b-2 are formed by the shaping process. Therefore, the manufacturing process of the lead frame 300 may be simplified.

Figure 43:
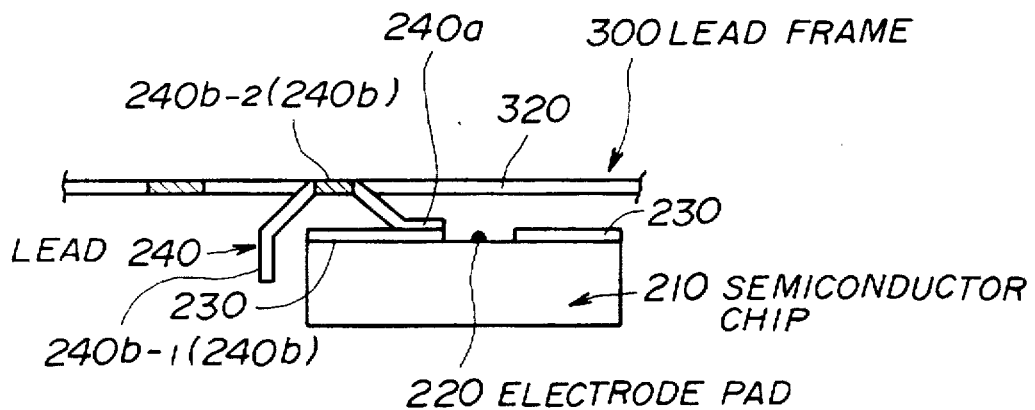

After the lead frame 300 is formed, as shown in FIG. 43, the lead frame 300 is installed on the semiconductor chip 210. On the surface 210a of the semiconductor chip 210 except for a space around where the electrode pad 220 is formed, the cover film 230 is previously adhered. And, the inner lead part 240a of the lead frame 300 is connected to the cover film 230 by using an insulating adhesive. In this way, the lead frame 300 and semiconductor chip 210 are connected to each other. At this time, the electrode pad 220 is also formed. A connected point of the inner lead part 240a is selected close to the space for forming the electrode pad 220.

Figure 44:
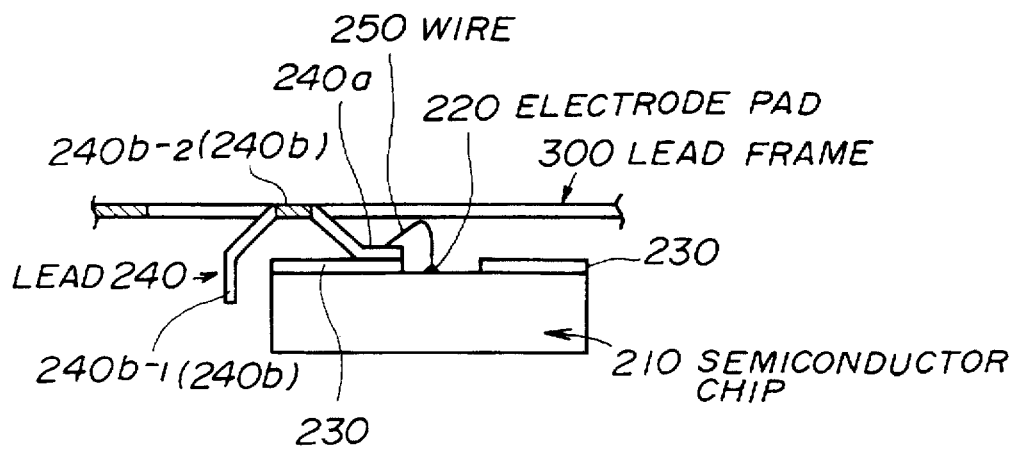

After the lead frame 300 and the semiconductor chip 210 are connected to each other, as shown in FIG. 44, the wire 250 is connected between the inner lead part 240a and the electrode pad 220. The easy and rapid process of connecting the wire 250 is realized by using a wire bonding apparatus.

Figure 45:
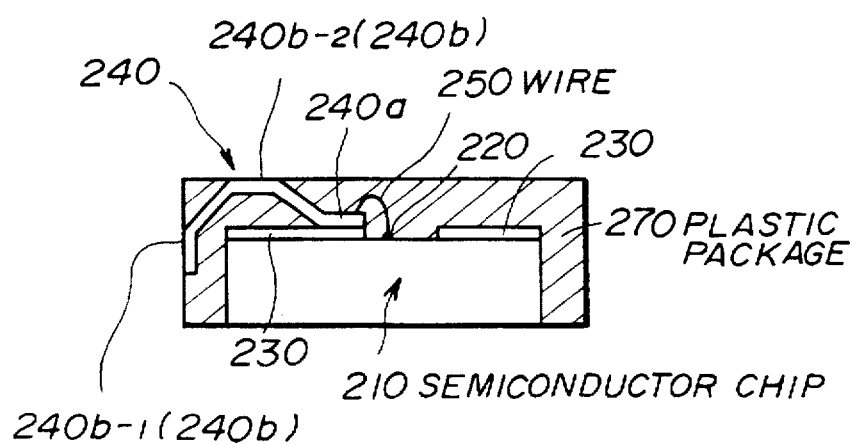

After the wire bonding process is finished, as shown in FIG. 45, the semiconductor chip 210 and the lead frame 300 are provided to a metal mold, and the plastic package 270 is formed by a molding process. In the molding process, the first- and second-port parts 240b-1, 240b-2 of the lead 240 directly contact a cavity of the metal mold without a gap. Thereby, the first- and second-port parts 240b-1, 240b-2 may be easily exposed to the outside of the plastic package 270. In the same way, since the back surface 210b of the semiconductor chip 210 directly contacts the cavity of the metal mold without a gap in the molding process, the back surface 210b may be easily exposed to the outside of the plastic package 270.

After the plastic package 270 is formed, the process proceeds to a process of removing burrs generated in the plastic package 270, a process of gilding the first- and second-port parts 240b-1, 240b-2 with a solder, and a process of removing unnecessary parts (the timbers 310, the cradle 320, etc.) in the lead frame 300. When the above successive processes are finished, the semiconductor device 205 shown in FIG. 41 is provided.

Figure 46:
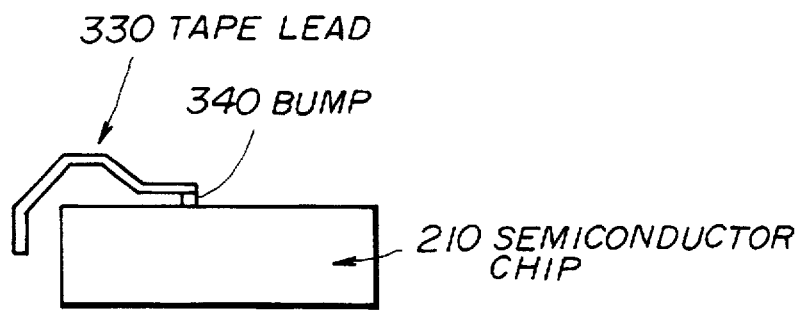

In the manufacturing process shown in FIG. 42A to FIG. 45, the lead frame 300 is used for forming the lead 240, and the wire 250 is used for electrically connecting the lead 240 and the semiconductor chip 210. However, the methods of forming the lead 240 and connecting the lead 240 and the semiconductor chip 210 are not limited to the above embodiment. For example, as shown in FIG. 46, for the forming of the lead 240, a tape lead 330 in which connection lines are printed on a plastic base film is available. And, for the electrical connection of the tape lead 330 and the semiconductor chip 210, a bump 340 is available.

Figure 47:
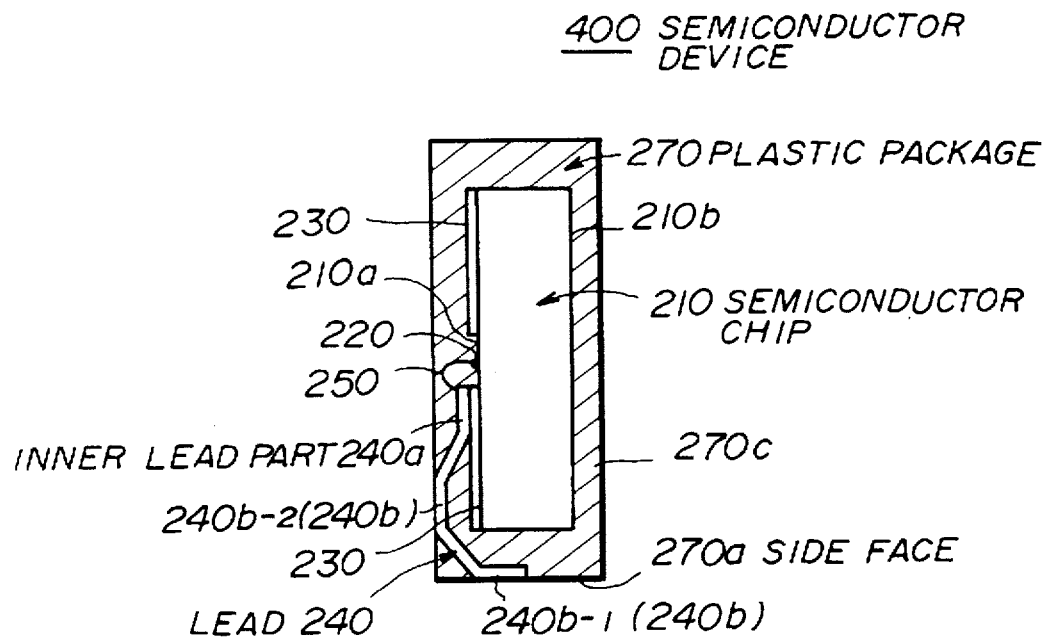
FIG. 47 shows a modification of the sixth embodiment of the semiconductor device shown in FIG. 41.
Figure 48:
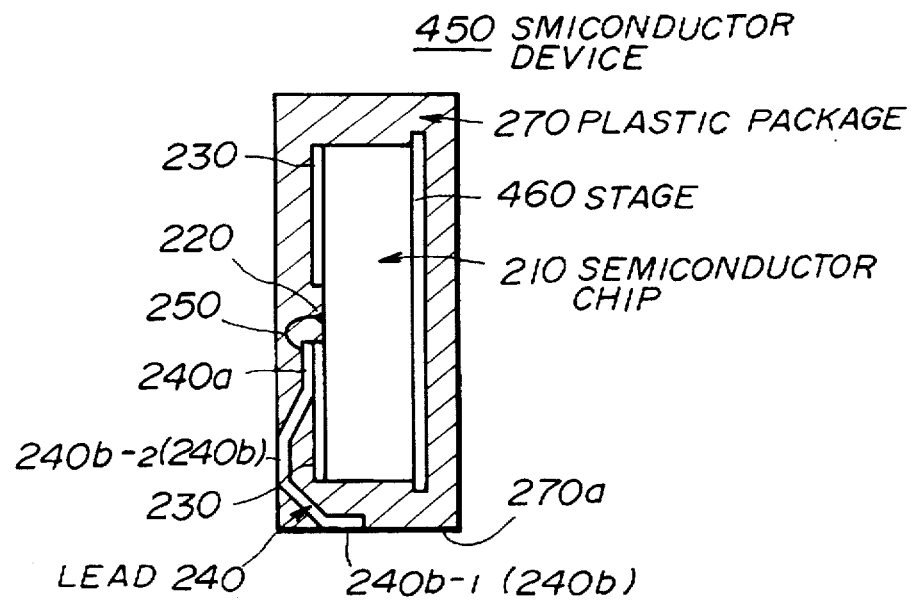
FIG. 48 shows another modification of the sixth embodiment of the semiconductor device shown in FIG. 41.

FIG. 47 and FIG. 48 respectively show modifications of the semiconductor device 205 of the sixth embodiment shown in FIG. 41. Elements in FIG. 47 and FIG. 48 which are the same as those of FIG. 41 are given the same reference numerals.

In FIG. 47, a semiconductor device 400 has a feature that the semiconductor chip 210 with the back face 210b is fully sealed within the plastic package 270. The semiconductor device 400 is suitable for cases that an amount of heat evolution from the semiconductor chip 210 is relatively small, or the semiconductor chip 210 is easily damaged by humidity and the air.

In FIG. 48, a semiconductor device 450 has a feature that the semiconductor chip 210 is disposed on a stage 460 and the semiconductor chip 210 with the stage 460 is fully sealed within the plastic package 270. In the configuration shown in FIG. 44, since the semiconductor chip 210 and the lead frame 300 are connected to each other by only bonding the inner lead part 240a and the cover film 230, a reliable connection between the semiconductor chip 210 and the lead frame 300 may not be obtained. In this case, when the semiconductor chip 210 and the lead frame 300 are provided to the metal mold for the plastic molding process, the semiconductor 210 may be disconnected from the lead frame 300.

On the contrary, in the semiconductor device 450 shown in FIG. 48, the stage 460 is provided to the lead frame 300 and the semiconductor chip 210 is disposed on the stage 460. Therefore, the semiconductor chip 210 is surely prevented from being disconnected from the lead frame 300. The stage 460 with the lead 240 may be formed by being integrated in the lead frame 300. Or, a lead frame for the lead 240 and a lead frame for the stage 460 may be individually formed, and the lead frame 300 including the stage 460 may be formed by integrating these two lead frames by welding, etc.

Figure 49:
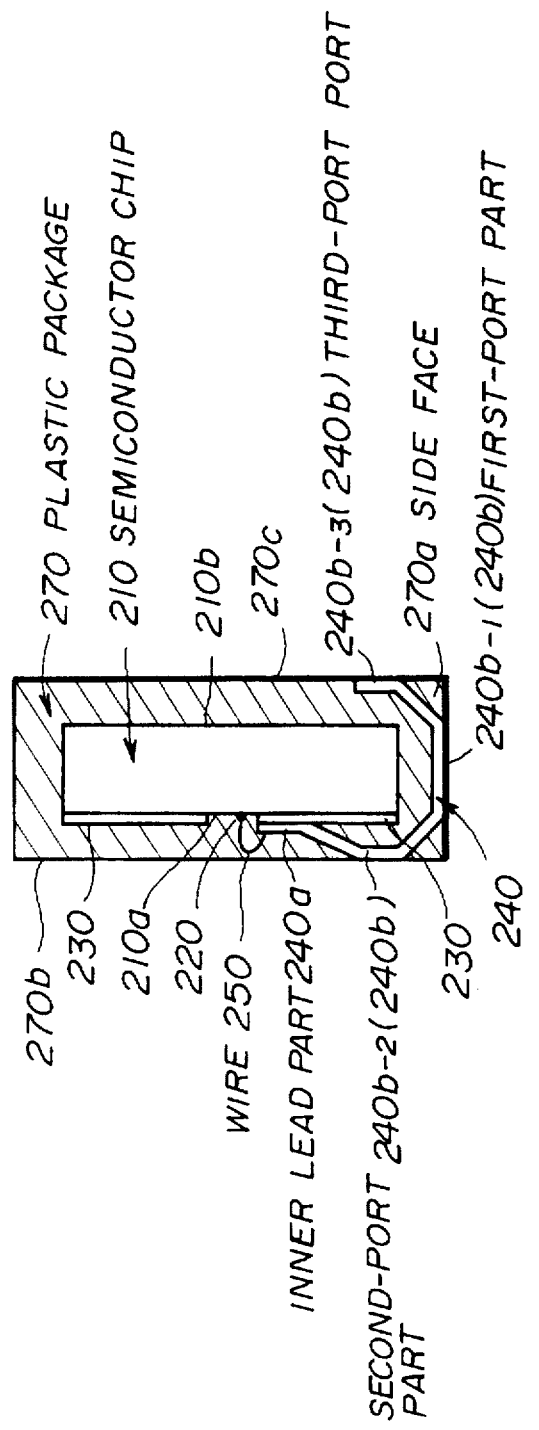
FIG. 49 shows a cross-sectional view of a seventh embodiment of the semiconductor device according to the present invention.

Next, a description will be given of a seventh embodiment of the semiconductor device according to the present invention. FIG. 49 shows a cross-sectional view of the seventh embodiment of the semiconductor device according to the present invention. Elements in FIG. 49 which are the same as those of FIG. 41 are given the same reference numerals.

In the semiconductor device 205 of the sixth embodiment, the outer lead part 240b is extended to the side face 270a of the plastic package 270. However, in a semiconductor device 500 of the seventh embodiment, the outer lead part 240b is further extended to the back face 270c of the plastic package 270, and a third-port part 240b-3 is formed in the back face 270c. Namely, the semiconductor device 500 has a feature that the outer lead part 240b is exposed in the opposite faces, the surface 270b and the back face 270c, which are in a vertical direction perpendicular to the side face 270a, as well as in the side face 270a (mounting face) of the plastic package 270.

In this way, in the semiconductor device 500, the first-port part 240b-1 is formed in the side face 270a of the plastic package 270, the second-port part 240b-2 is formed in the surface 270b of the plastic package 270, and the third-port part 240b-3 is formed in the back face 270c of the plastic package 270.

Therefore, a plurality of the semiconductor devices 500 may be stacked in a horizontal direction.

Figure 50:
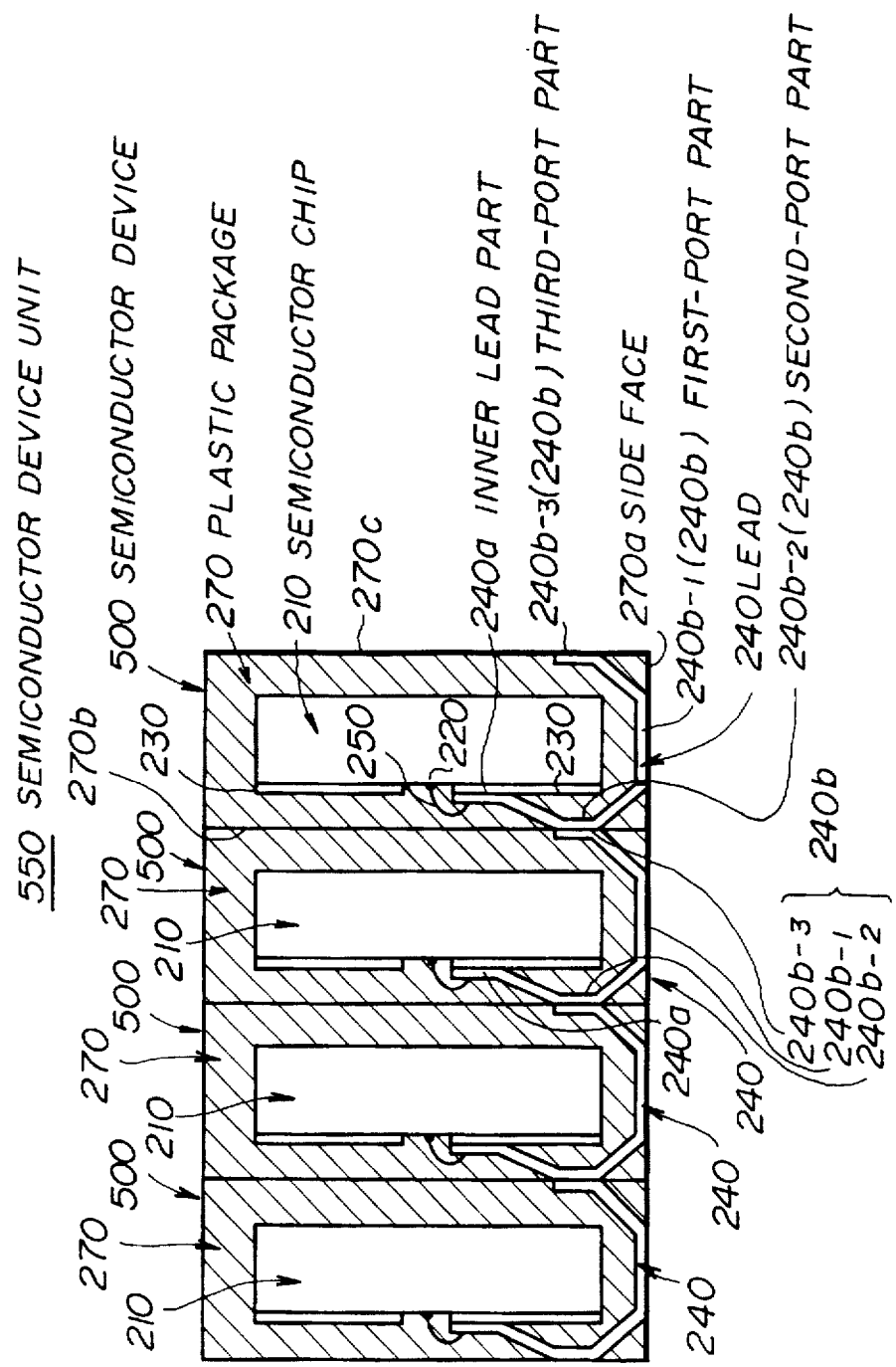
FIG. 50 shows a configuration of a semiconductor device unit having a plurality of the semiconductor devices shown in FIG. 49 which are arranged in a horizontal direction.

FIG. 50 shows a configuration of a semiconductor device unit having a plurality of the semiconductor devices 500 which are arranged in the horizontal direction. In a semiconductor device unit 550 shown in FIG. 50, to electrically connect the neighboring semiconductor devices 500 to each other, the second-port part 240b-2 formed in the surface 270b of the semiconductor device 500 and the third-port part 240b-3 formed in the back face 270c of a neighboring semiconductor device 500 are connected to each other. And, each semiconductor device 500 is electrically connected to the mounting base (not shown) by the first-port part 240b-1 formed in the side face 270a of the plastic package 270.

In this way, in the semiconductor device 500 according to the present invention, since the first-, second- and third-port parts 240b-1, 240b-2 and 240b-3 are exposed to the outside of the faces 270a, 270b, 270c of the plastic package 270, a plurality of semiconductor devices 500 may be stacked one upon the other to provide the semiconductor device unit 550. Therefore, the semiconductor devices 500 may be arranged in a higher density as compared to the semiconductor device 200 shown in FIG. 41, and the mounting density may be further improved. As a result, an electronic apparatus having the semiconductor device unit 550 may be further miniaturized.

Figure 51:
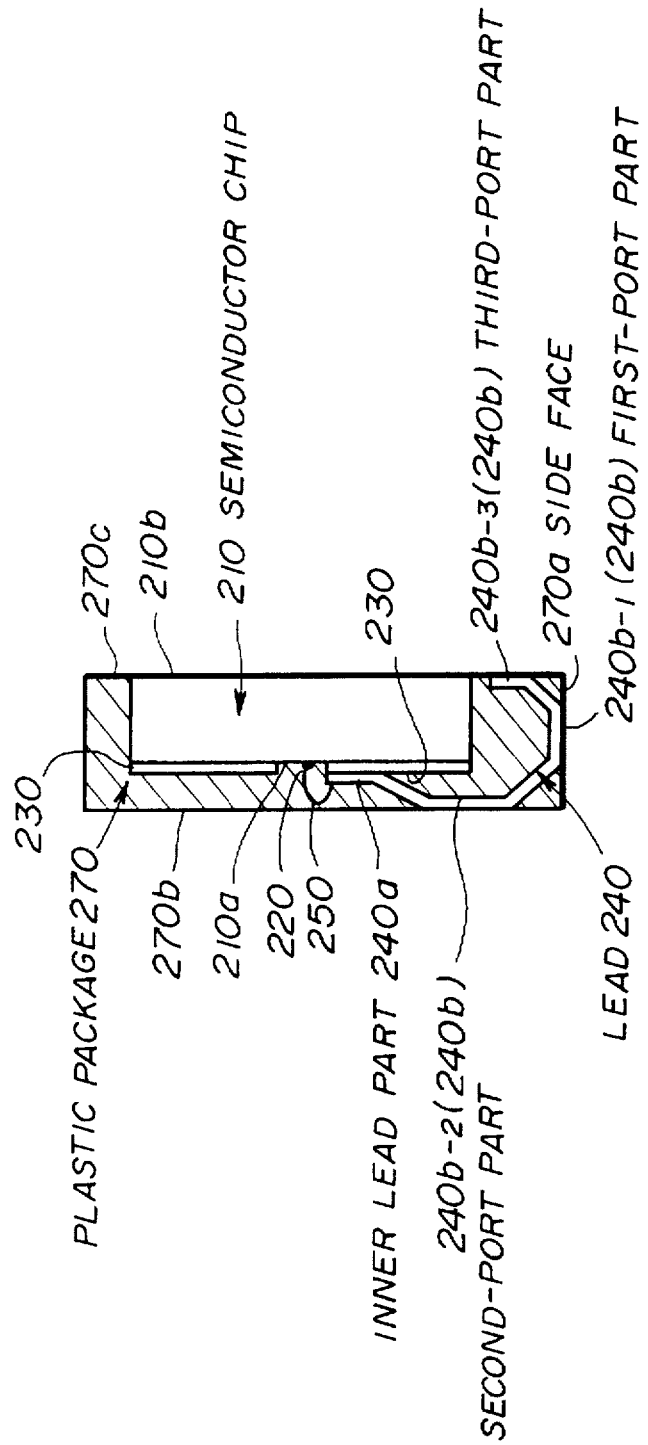
FIG. 51 shows a modification of the seventh embodiment of the semiconductor device shown in FIG. 49.
Figure 52:
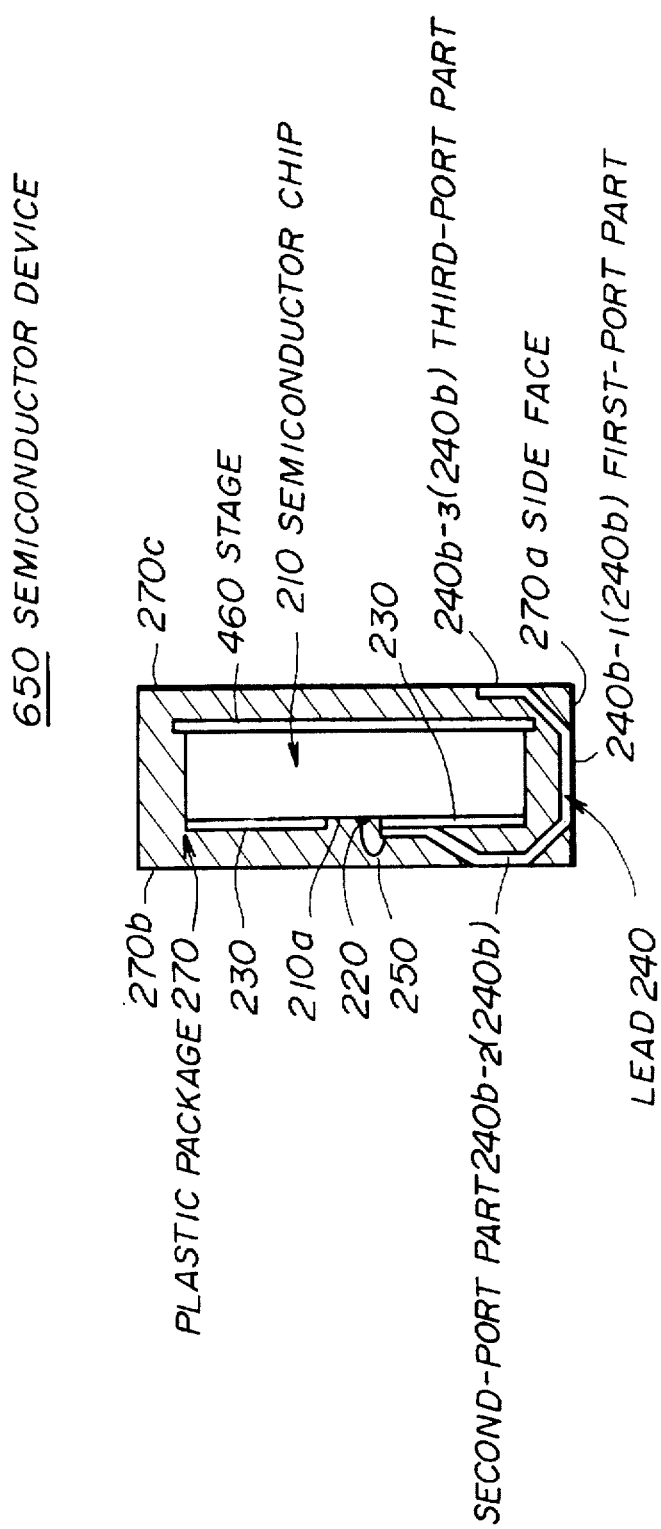
FIG. 52 shows another modification of the seventh embodiment of the semiconductor device shown in FIG. 49.

FIG. 51 and FIG. 52 respectively show modifications of the semiconductor device 500 of the seventh embodiment shown in FIG. 49. Elements in FIG. 51 and FIG. 52 which are the same as those of FIG. 49 are given the same reference numerals.

In FIG. 51, a semiconductor device 600 has a feature that the back face 210b of the semiconductor chip 210 is exposed to the outside of the back face 270c of the plastic package 270 as compared to the semiconductor device 500. According to the semiconductor device 600, in the same way as the semiconductor device 205 shown in FIG. 41, the heat radiation efficiency of the semiconductor chip 210 may be improved, and the plastic package 270 may be miniaturized.

In FIG. 52, a semiconductor device 650 has a feature that the semiconductor chip 210 is disposed on the stage 460, and the semiconductor chip 210 with the stage 460 is fully sealed within the plastic package 270. According to the semiconductor device 650, in the same way as the semiconductor device 450 shown in FIG. 48, the semiconductor chip 210 is surely prevented from being disconnected from the lead frame 300.

Figure 53:
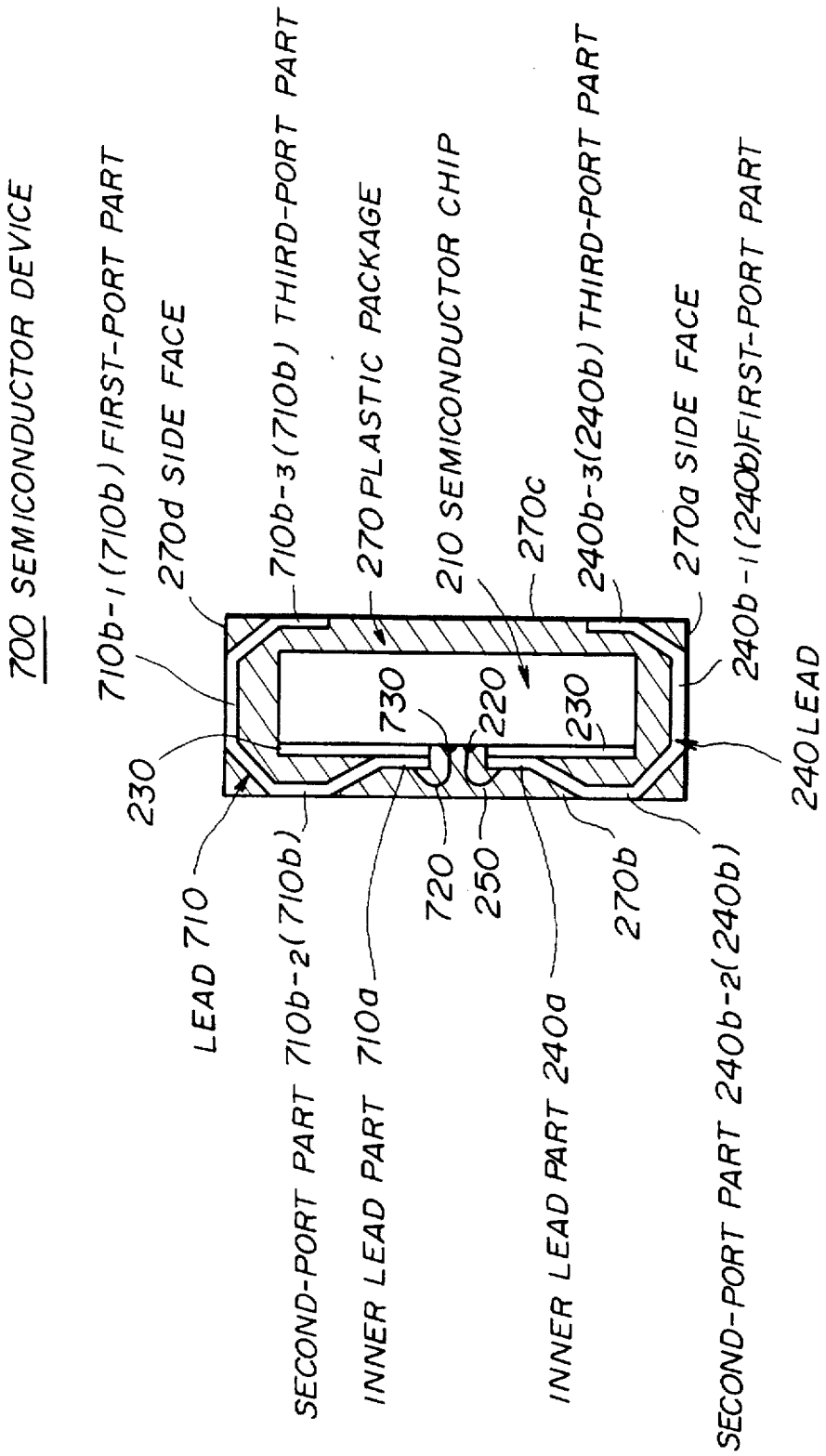
FIG. 53 shows a cross-sectional view of an eighth embodiment of the semiconductor device according to the present invention.

Next, a description will be given of an eighth embodiment of the semiconductor device according to the present invention. FIG. 53 shows a cross-sectional view of the eighth embodiment of the semiconductor device according to the present invention. Elements in FIG. 53 which are the same as those of FIG. 49 are given the same reference numerals.

In the semiconductor device 500 shown in FIG. 49, the lead 240 is extended to one side of the two sides of the plastic package 270, namely the side face 270a. On the contrary, in the semiconductor device 700, in addition to the lead 240, a lead 710 is extended to an opposite side of the side face 270a, namely a side face 270d of the plastic package 270. Shapes of the lead 710 extended to the side face 270d and the lead 240 extended to the side face 270a are symmetrical with each other.

In the semiconductor device 700, an electrode pad 730 is also formed on the semiconductor chip 210 in addition to the electrode pad 220. An inner lead part 710a of the lead 710 is electrically connected to the electrode pad 730 by a wire 720. And, in the same way as the lead 240, an outer lead part 710b of the lead 710 includes first-, second- and third-port parts 710b-1, 710b-2 and 710b-3. The first-port part 710b-1 is exposed to the outside of the side face 270d of the plastic package 270, the second-port part 710b-2 is exposed to the outside of the surface 270b of the plastic package 270, and the third-port part 710b-3 is exposed to the outside of the back face 270c of the plastic package 270.

In the semiconductor device 500 shown in FIG. 49, when the semiconductor device 500 is connected to another semiconductor device 500 or the mounting base, only ports in a lower part of the semiconductor device 500 are used. On the contrary, in the semiconductor device 700, in addition to the port in the lower part of the semiconductor device 700, ports in an upper part thereof can be also used for the electrical connection. Therefore, the semiconductor device 700 has a flexibility of the electrical connection. Namely, though the semiconductor device 500 of the seventh embodiment shown in FIG. 49 may be stacked in only the horizontal direction, the semiconductor device 700 of the eighth embodiment shown in FIG. 53 may be stacked in both the horizontal direction and the vertical direction.

Figure 54:
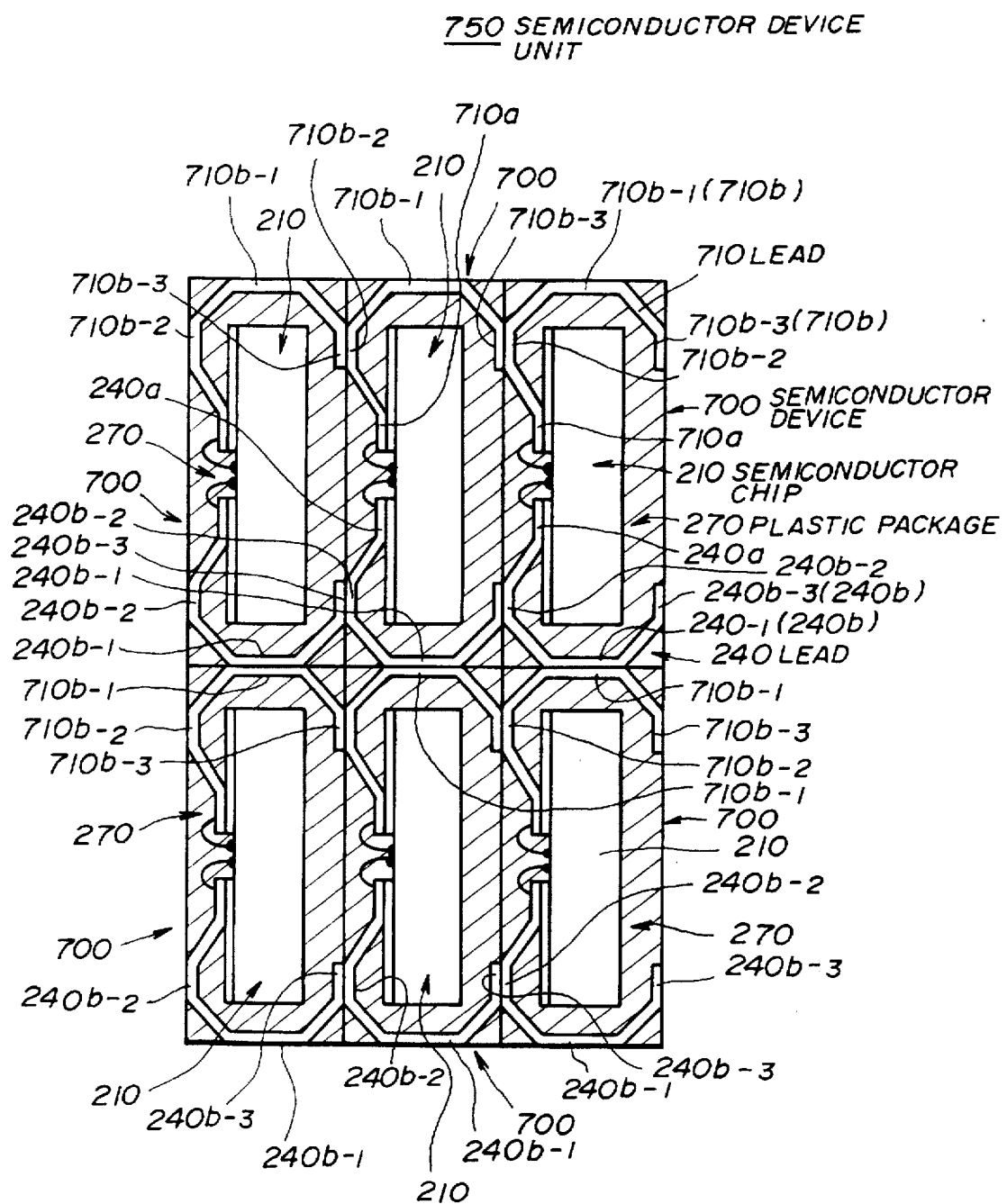
FIG. 54 shows a configuration of a semiconductor device unit having a plurality of the semiconductor devices shown in FIG. 53 which are arranged in horizontal and vertical directions.

FIG. 54 shows a configuration of a semiconductor device unit having a plurality of the semiconductor devices shown in FIG. 53 which are arranged in the horizontal and vertical directions. In a semiconductor device unit 750 shown in FIG. 54, to electrically connect the neighboring semiconductor devices 700 to each other in the horizontal direction, the second-port part 240b-2 formed in the surface 270b of the semiconductor device 700 and the third-port part 240b-3 formed in the back face 270c of the neighboring semiconductor device 700 are connected to each other. And also, the second-port part 710b-2 formed in the surface 270b of the semiconductor device 700 and the third-port part 710b-3 formed in the back face 270c of the neighboring semiconductor device 700 are connected to each other.

And, to electrically connect the neighboring semiconductor devices 700 in the vertical direction to each other, the first-port part 710b-1 formed in the side face 270d of a lower-side semiconductor device 700 and the first-port part 240b-1 formed in the side face 270a of an upper-side semiconductor device 700 are connected to each other.

Further, each lowest-side semiconductor device 500 is electrically connected to the mounting base (not shown) by the first-port part 240b-1 formed in the side face 270a of the plastic package 270.

In this way, in the semiconductor device 700 according to the present invention, since the first-, second- and third-port parts 240b-1, 240b-2 and 240b-3 formed in the lead 240 and the first-, second- and third-port parts 710b-1, 710b-2 and 710b-3 formed in the lead 710 are exposed to the outside of the faces 270a, 270b, 270c, 270d of the plastic package 270, a plurality of semiconductor devices 700 may be stacked in both horizontal and vertical directions to provide the semiconductor device unit 750. Therefore, the semiconductor devices 700 may be arranged in a higher density as compared to the semiconductor device 500 shown in FIG. 49, and the mounting density of the semiconductor devices 700 may be further improved. As a result, an electronic apparatus having the semiconductor device unit 750 may be further miniaturized.

Figure 55:
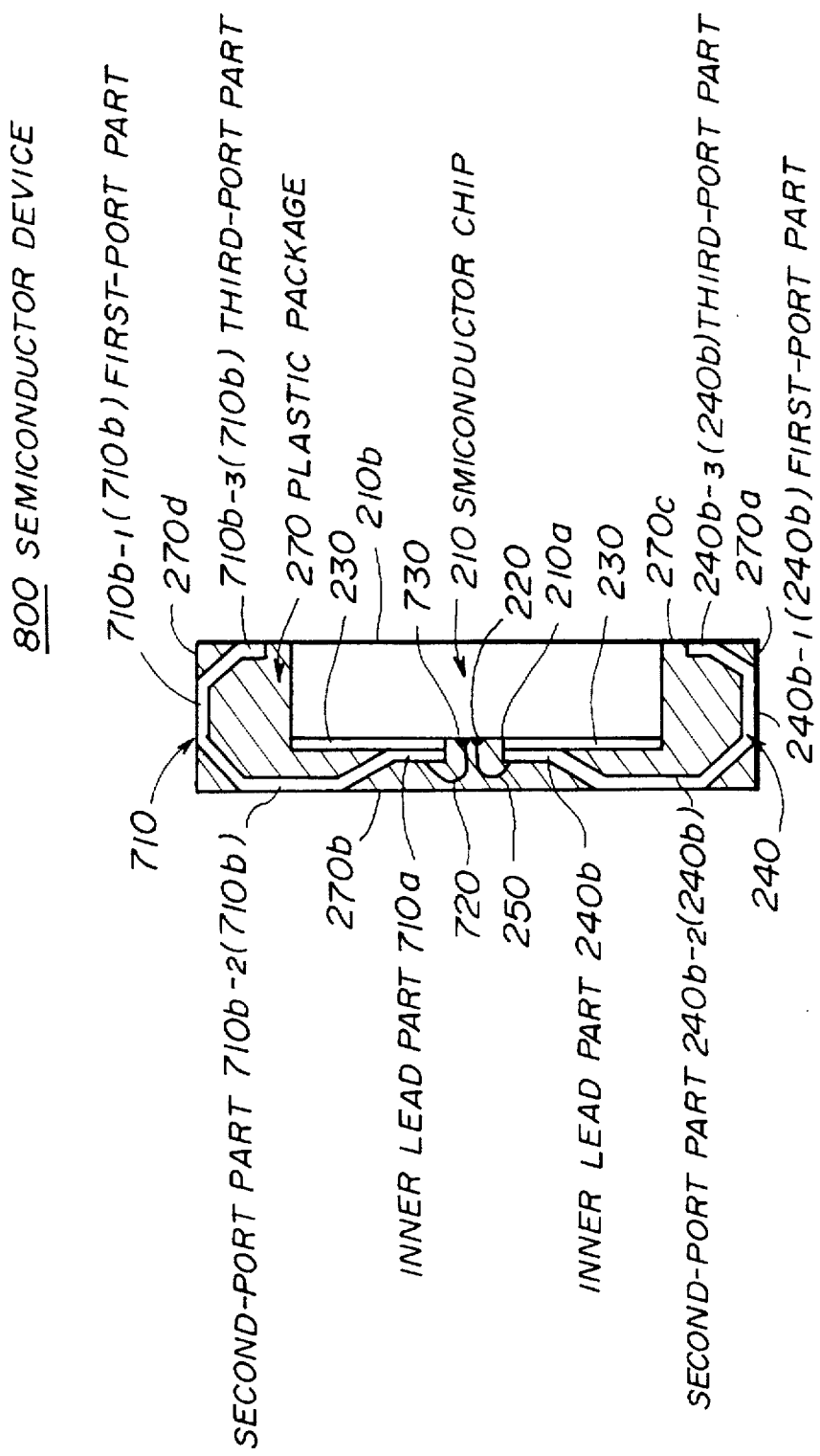
FIG. 55 shows a modification of the eighth embodiment of the semiconductor device shown in FIG. 53.
Figure 56:
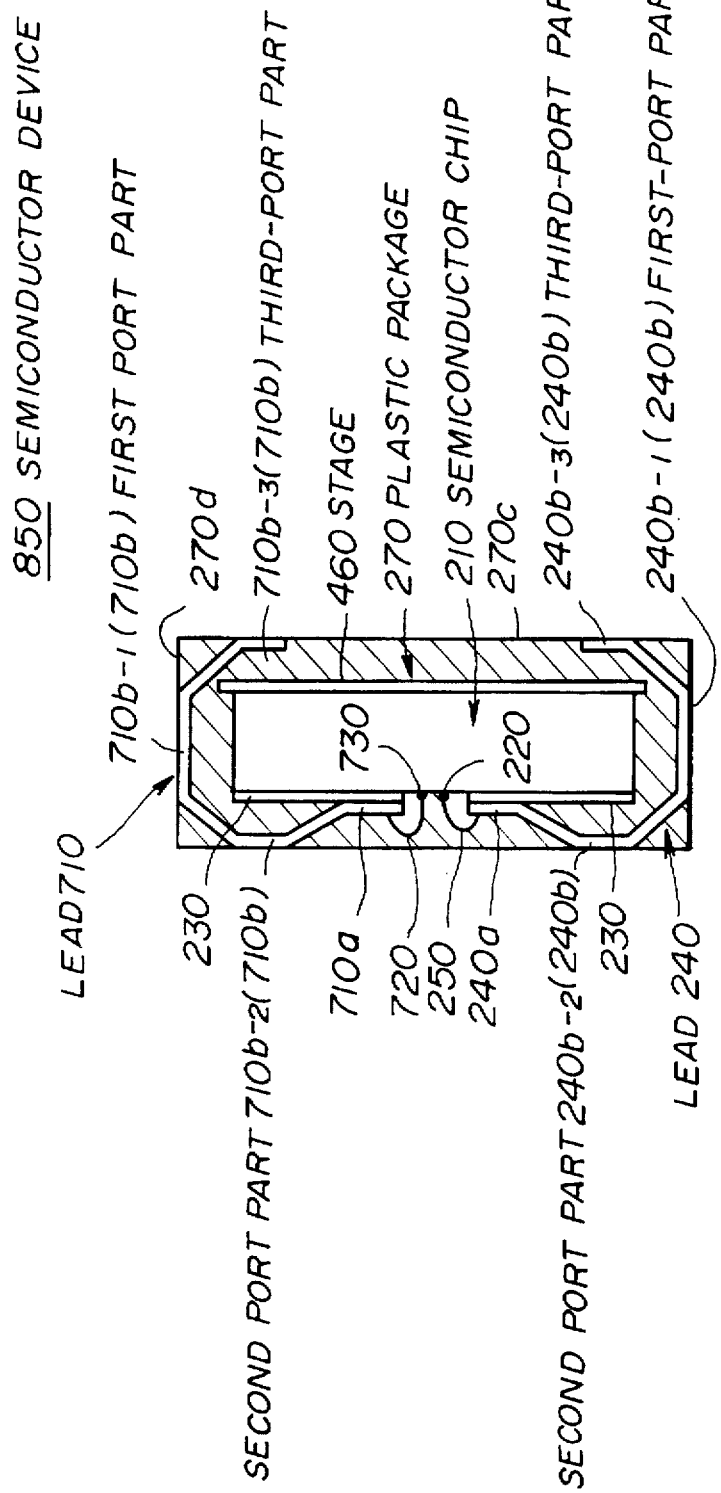
FIG. 56 shows another modification of the eighth embodiment of the semiconductor device shown in FIG. 53.

FIG. 55 and FIG. 56 respectively show modifications of the semiconductor device 700 of the eighth embodiment shown in FIG. 53. Elements in FIG. 55 and FIG. 56 which are the same as those of FIG. 53 are given the same reference numerals.

In FIG. 55, a semiconductor device 800 has a feature that the back face 210b of the semiconductor chip 210 is exposed to the outside of the back face 270c of the plastic package 270 as compared to the semiconductor device 700. According to the semiconductor device 800, in the same way as the semiconductor devices 205, 600 shown in FIGS. 41, 51, as compared to the semiconductor device 700, the heat radiation efficiency of the semiconductor chip 210 may be improved, and the plastic package 270 may be miniaturized.

In FIG. 56, a semiconductor device 850 has a feature that the semiconductor chip 210 is disposed on the stage 460, and the semiconductor chip 210 with the stage 460 is fully sealed within the plastic package 270. According to the semiconductor device 850, in the same way as the semiconductor devices 450, 650 shown in FIGS. 48, 52, the semiconductor chip 210 is surely prevented from being disconnected from the lead frame 300.

In all the above descriptions, the plastic package is represented for sealing the semiconductor chip, but material for the package is not limited to the plastic, and a variety of materials, such as a ceramic, are available.

As described above, the present inventions have the following features.

According to the above semiconductor device, the outer lead part for being connected externally is exposed to the outside of the side face of the plastic package and the side face in which the outer lead part is formed is used for the mounting face. Therefore, the plastic package may be mounted on any base in the standing form. Accordingly, a space necessary for mounting the semiconductor device on the base may be reduced, and the increased high-density mounting is realized.

According to the above semiconductor device, the outer lead part is also exposed to the outside of the two opposite faces of the plastic package. Therefore, the outer lead part may be connected externally in three faces, namely the side face, and the two opposite faces crossing the side face of the plastic package. Accordingly, an electrical connection method may be flexibly selected. And, since neighboring semiconductor devices may be connected to each other by using the outer lead parts in the above opposite faces, a plurality of the semiconductor devices may be stacked in the horizontal direction.

According to the above semiconductor device, the back face of the semiconductor element may be exposed to the outside of the plastic package. Therefore, the heat radiation efficiency of the semiconductor element may be improved, and the semiconductor device may be miniaturized.

According to the above semiconductor device, the semiconductor element may be mounted on the stage. Therefore, when plastic molding is carried out, the semiconductor element may be surely supported.

According to the above semiconductor device, the outer lead part is also exposed to the outside of the opposite side face of the side face for being contacted with the base. Therefore, the outer lead part may be connected externally in the two opposite side faces of the plastic package. Since the semiconductor devices may be connected to each other by using the outer lead parts in the above opposite side faces, a plurality of the semiconductor devices may be stacked in the vertical direction.

According to the semiconductor device unit, the semiconductor devices are connected to each other by the outer lead parts being electrically connected to each other. Therefore, a plurality of the semiconductor devices may be stacked in the horizontal and vertical directions. Accordingly, a large number of semiconductor devices may be mounted on a small space, and, thus, the mounting density may be further improved.

Further, the present invention is not limited to these embodiments, but various variations and modifications may be made without departing from the scope of the present invention.

What is claimed is:

1. A semiconductor device comprising:
    a semiconductor element;
    leads connected with said semiconductor element, each of said leads including an inner lead part extending over a central portion of a first side of said semiconductor element and an outer lead part for being connected externally, said outer lead part extending over at least a portion of a second side of said semiconductor element; and
    a plastic package sealing said semiconductor element and said leads.

wherein said outer lead part is sealed within said plastic package, and a portion of said outer lead part is viewable to the outside of a side face of said plastic package, and the plastic package is adapted to be mounted on any base in a standing form by said side face contacting the base.

2. The semiconductor device as claimed in claim 1, wherein said outer lead part further comprises parts which are exposed to the outside of two faces of the plastic package.

3. The semiconductor device as claimed in claim 1, wherein said semiconductor element comprises a back face which is exposed to the outside of the plastic package.

4. The semiconductor device as claimed in claim 1, wherein said device further comprises a stage on which the semiconductor element is mounted.

5. The semiconductor device as claimed in claim 1, wherein said outer lead part further comprises a part which is exposed to the outside of an opposite side face of said side face of the plastic package.

6. A semiconductor device unit comprising a plurality of semiconductor devices, each of said semiconductor devices having:

a semiconductor element;

leads connected with said semiconductor element, each of said leads including an inner lead part extending over a central portion of a first side of said semiconductor element and an outer lead part for being connected externally, said outer lead part extending over at least a portion of a second side of said semiconductor element; and a plastic package sealing said semiconductor element and said leads;

wherein said outer lead part is sealed within said plastic package and a portion of said outer lead part is viewable to the outside of a side face of said plastic package, and the plastic package is mounted on any base in a standing form by said side face contacting the base, wherein said plurality of semiconductor devices are adaptable to be stacked one upon the other.

7. The semiconductor device as claimed in claim 6, wherein said outer lead part of each of said semiconductor devices further comprises parts which are exposed to the outside of two faces of the plastic package, and wherein said plurality of semiconductor devices are adapted to be stacked in a horizontal direction such that the outer lead parts of the semiconductor devices are connected to each other.

8. The semiconductor device unit as claimed in claim 6, wherein said semiconductor element of each of said semiconductor devices comprises a back face which is exposed to the outside of the plastic package.

9. The semiconductor device unit as claimed in claim 6, wherein each of said semiconductor devices further comprises a stage on which the semiconductor element is mounted.

10. The semiconductor device unit as claimed in claim 6, wherein said outer lead part further comprises a part which is exposed to the outside of an opposite side face of said side face of the plastic package, and wherein said plurality of semiconductor devices are stacked in a vertical direction such that the outer lead parts of the semiconductor devices are connected to each other.

11. The semiconductor device as claimed in claim 1, wherein said plastic package forms a chip size package structure around said semiconductor element.

12. The semiconductor device unit as claimed in claim 6, wherein said plastic package forms a chip-size package structure around said semiconductor element.

* * * * *